(12) United States Patent
Chen et al.

(10) Patent No.: US 12,362,655 B2
(45) Date of Patent: Jul. 15, 2025

(54) SYSTEM AND METHOD FOR VERTICAL POWER DELIVERY TO ELECTRONIC SYSTEMS

(71) Applicants: The Trustees of Princeton University, Princeton, NJ (US); The Trustees of Dartmouth College, Hanover, NH (US)

(72) Inventors: Minjie Chen, Princeton, NJ (US); Charles Sullivan, West Lebanon, NH (US); Youssef E. Elasser, Latham, NY (US); Daniel Zhou, Princeton, NJ (US); Jaeil Baek, Princeton, NJ (US); Yenan Chen, West Windsor, NJ (US)

(73) Assignees: THE TRUSTEES OF PRINCETON UNIVERSITY, Princeton, NJ (US); THE TRUSTEES OF DARTMOUTH COLLEGE, Hanover, NH (US)

(*) Notice: Subject to any disclaimer, the term of this patent is extended or adjusted under 35 U.S.C. 154(b) by 264 days.

(21) Appl. No.: 17/918,646

(22) PCT Filed: Apr. 14, 2021

(86) PCT No.: PCT/US2021/027229
§ 371 (c)(1),
(2) Date: Oct. 13, 2022

(87) PCT Pub. No.: WO2021/211682
PCT Pub. Date: Oct. 21, 2021

(65) Prior Publication Data
US 2023/0137975 A1    May 4, 2023

Related U.S. Application Data

(60) Provisional application No. 63/010,416, filed on Apr. 15, 2020.

(51) Int. Cl.
*H05K 1/14* (2006.01)
*H01F 27/06* (2006.01)
(Continued)

(52) U.S. Cl.
CPC .............. *H02M 1/14* (2013.01); *H01F 27/06* (2013.01); *H01F 27/255* (2013.01);
(Continued)

(58) Field of Classification Search
CPC .... G06F 1/26; G06F 1/28; G06F 1/56; H05K 1/14; H05K 1/144–147; H01F 27/06;
(Continued)

(56) References Cited

U.S. PATENT DOCUMENTS 6,362,986 B1    3/2002    Schultz et al.
6,545,450 B1    4/2003    Ledenev et al.
(Continued)

OTHER PUBLICATIONS

International Search Report and Written Opinion for corresponding PCT Application No. PCT/US2021/027229, dated Aug. 31, 2021.
(Continued)

*Primary Examiner* — Tuan T Dinh
(74) *Attorney, Agent, or Firm* — MEAGHER EMANUEL LAKS GOLDBERG & LIAQ, LLP

(57) ABSTRACT

According to various embodiments, a power converter circuit is disclosed. The power converter circuit includes at least two vertically stacked printed circuit boards (PCBs) comprising a top PCB and a bottom PCB. The power converter circuit further includes at least one multiphase coupled inductor placed between the top PCB and the bottom PCB. The top PCB is coupled to the bottom PCB via at least one conductive winding of the multiphase coupled inductor. The power converter circuit further includes at least one circuit module placed above the top PCB and at least one power source placed below the bottom PCB. The
(Continued)

multiphase coupled inductor is configured to deliver current vertically from the bottom PCB to the top PCB.

17 Claims, 63 Drawing Sheets

(51) Int. Cl.
| | |
|---|---|
| H01F 27/255 | (2006.01) |
| H01F 27/30 | (2006.01) |
| H02M 1/14 | (2006.01) |
| H02M 7/00 | (2006.01) |
| H05K 1/18 | (2006.01) |

(52) U.S. Cl.
CPC .......... *H01F 27/306* (2013.01); *H02M 7/003* (2013.01); *H05K 1/144* (2013.01); *H05K 1/181* (2013.01); *H01F 2027/065* (2013.01); *H05K 2201/042* (2013.01); *H05K 2201/1003* (2013.01)

(58) Field of Classification Search
CPC .......... H01F 27/24; H01F 27/26; H01F 27/28; H02M 7/00; H02M 7/003; H02M 7/04; H02M 7/217
USPC ......... 361/770–784, 790–795; 336/170, 178, 336/180; 363/17, 126–127
See application file for complete search history.

(56) References Cited

U.S. PATENT DOCUMENTS

| | | | | |
|---|---|---|---|---|
| 7,136,293 | B2* | 11/2006 | Petkov | H02M 3/3376 336/215 |
| 7,864,013 | B2* | 1/2011 | Muelleman | H01F 27/34 336/178 |
| 9,251,945 | B2* | 2/2016 | Barthold | H01F 41/041 |
| 9,729,059 | B1* | 8/2017 | Parto | H02M 3/158 |
| 11,158,451 | B2* | 10/2021 | Xiong | H01F 17/06 |
| 11,189,415 | B2* | 11/2021 | Lu | H02M 7/2176 |
| 2002/0167388 | A1* | 11/2002 | Usui | H01F 27/2804 336/200 |
| 2004/0130428 | A1 | 7/2004 | Mignano et al. | |
| 2007/0262839 | A1 | 11/2007 | Bosley et al. | |
| 2008/0310051 | A1 | 12/2008 | Yan et al. | |
| 2010/0000766 | A1 | 1/2010 | Loiselet et al. | |
| 2011/0279212 | A1* | 11/2011 | Ikriannikov | H01F 5/00 336/199 |
| 2014/0016369 | A1 | 1/2014 | Chandrasekaran | |
| 2015/0062989 | A1 | 3/2015 | Su et al. | |
| 2015/0282370 | A1* | 10/2015 | Yang | H01F 5/00 361/736 |
| 2017/0194086 | A1* | 7/2017 | Zhou | H01F 3/14 |
| 2018/0053596 | A1* | 2/2018 | Ikriannikov | H01F 38/08 |
| 2018/0323720 | A1 | 11/2018 | Njiende et al. | |
| 2019/0354154 | A1* | 11/2019 | Yates | G06F 1/263 |
| 2020/0066634 | A1* | 2/2020 | Do | H01L 21/4857 |

OTHER PUBLICATIONS

Li, Jieli et al., "Coupled-Inductor Design Optimization for Fast-Response Low-Voltage DC-DC Converters," Proceedings of IEEE Applied Power Electronics Conference and Exposition, APEC 2002, vol. 2, pp. 817-823, 2002.

Li, Jieli et al., "Using coupled inductors to enhance transient performance of multi-phase buck converters", Proceedings of IEEE Applied Power Electronics Conference and Exposition, APEC 2004, vol. 2, pp. 1289-1293, 2004.

Wong, Pit-Leong et al., "Performance improvements of interleaving VRMs with coupling inductors," IEEE Transactions on Power Electronics, vol. 16, No. 4, pp. 499-507, 2001.

Xu, Peng et al., "Investigation of candidate topologies for 12 V VRM," Proceedings of IEEE Applied Power Electronics Conference and Exposition, APEC 2002, vol. 2, pp. 686-692, 2002.

Jiang, S. et al., "Switched Tank Converters," IEEE Transactions on Power Electronics, vol. 34, No. 6, pp. 5048-5062, Jun. 2019.

Baek, J. et al., "LEGO-PoL: A 93.1% 54V-1.5V 300A Merged-Two-Stage Hybrid Converter with a Linear Extendable Group Operated Point-of-Load (LEGO-PoL) Architecture," IEEE Workshop on Control and Modeling of Power Electronics (COMPEL), Toronto, ON, Jun. 2019.

Das, R. and Le, H., "A Regulated 48V-to-1V/100A 90.9%—Efficient Hybrid Converter for POL Applications in Data Centers and Telecommunication Systems," 2019 IEEE Applied Power Electronics Conference and Exposition (APEC), Anaheim, CA, USA, pp. 1997-2001, 2019.

Dong, Y., "Investigation of Multiphase Coupled-Inductor Buck Converters in Point-of-Load Applications", PhD Thesis, Virginia Tech, Blacksburg, VA, Mar. 2009.

Li, Yanchao et al., "A 98.55% Efficiency Switched-Tank Converter for Data Center Application," IEEE Transactions on Industry Applications, vol. 54, No. 6, pp. 6205-6222, Nov.-Dec. 2018.

Abe, K. et al., "A Novel Three-Phase Buck Converter with Bootstrap Driver Circuit," IEEE Power Electronics Specialists Conference, pp. 1864-1871, 2007.

Saggini, Stefano et al., "An Isolated Quasi-Resonant Multiphase Single-Stage Topology for 48-V VRM Applications," IEEE Transactions on Power Electronics, vol. 33, No. 7, pp. 6224-6237, Jul. 2018.

Shenoy, Pradeep S. et al., "Comparison of a Buck Converter and a Series Capacitor Buck Converter for High-Frequency, High-Conversion-Ratio Voltage Regulators," IEEE Transactions on Power Electronics, vol. 31, No. 10, pp. 7006-7015, Oct. 2016.

Ehrlich, Stefan et al., "Comprehensive SPICE Model for Power Inductor Losses," IEEE Applied Power Electronics Conference and Exposition (APEC), pp. 1237-1244, 2019.

Zacharias, Peter et al., "Controlled Magnetic Devices in Power Electronic Applications," EPE'17 ECCE Europe, pp. 1-10, 2017.

Ahmed, Mohamed et al., "High-Efficiency High-Power-Density 48/1V Sigma Converter Voltage Regulator Module," EEE Applied Power Electronics Conference and Exposition, pp. 2207-2012, 2017.

Li, Jieli et al., "Improved Calculation of Core Loss with Nonsinusoidal Waveforms," Proceedings on IEEE IAS, pp. 2203-2210, 2001.

Zumel, P. et al., "Magnetic Integration for Interleaved Converters," Applied Power Electronics Conference (APEC), pp. 1143-1149, 2003.

Lu, Zengyi and Chen, Wei, "Multi-Phase Inductor Coupling Scheme with Balancing Winding in VRM Applications," IEEE Applied Power Electronics Conference and Exposition, pp. 731-735, 2007.

Ye, Zichao et al., "The Cascaded Resonant Converter: A Hybrid Switched-Capacitor Topology With High Power Density and Efficiency," IEEE Transactions on Power Electronics, vol. 35, No. 5, pp. 4946-4958, May 2020.

Fei, Chao et al., "Two-Stage 48 V-12 V/6 V-1.8 V Voltage Regulator Module With Dynamic Bus Voltage Control for Light-Load Efficiency Improvement," IEEE Transactions on Power Electronics, vol. 32, No. 7, pp. 5628-5636, Jul. 2017.

* cited by examiner

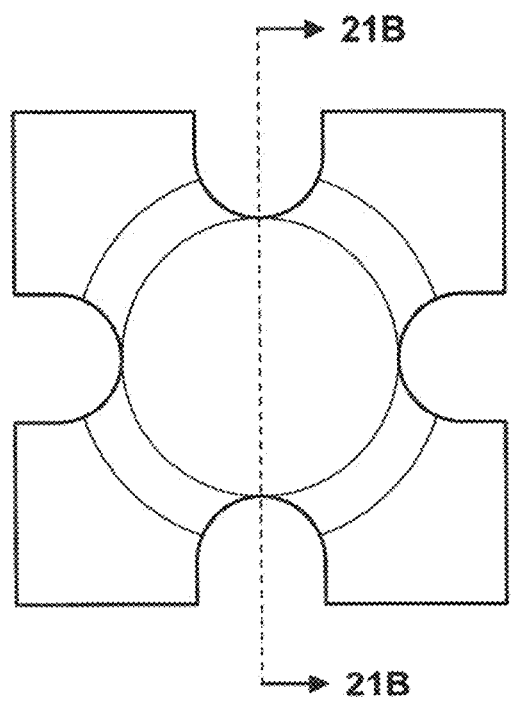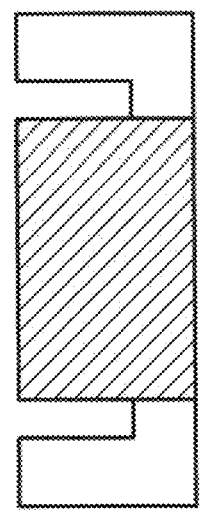
FIG. 21A
FIG. 21B

Phase 1

Phase 2

| | |
|---|---|
| ReSC Switch | LMG5200, 80V/630AΩ |
| Resonant Ind. | FP0705R1-R22, 220nH |
| Resonant Cap. | 100nFx4, 50V, C0G |
| HySC Switch | BSC012N06, 60VΩ |
| Coupled Ind. | Pot-18-14, N26, 1 Turn |
| HySC Cap. | 80μF, 25V |
| Input Cap. | 22μF, 100V |
| Bus Cap. | 26.5μF, 50V |
| Output Cap. | 40μF, 10V |

SYSTEM AND METHOD FOR VERTICAL POWER DELIVERY TO ELECTRONIC SYSTEMS

CROSS-REFERENCE TO RELATED APPLICATIONS

This application claims priority to provisional application Ser. No. 63/010,416, filed Apr. 15, 2020, which is herein incorporated by reference in its entirety.

STATEMENT REGARDING FEDERALLY SPONSORED RESEARCH OR DEVELOPMENT

This invention was made with government support under Grant No. 1847365 awarded by the National Science Foundation. The government has certain rights in the invention.

FIELD OF THE INVENTION

The present invention relates generally to vertical power delivery and, more particularly, to an approach for connecting microprocessors to motherboards with low interconnect loss as well as a multiphase coupled inductor structure to enhance performance of voltage regulation modules.

BACKGROUND OF THE INVENTION

High-current low-voltage power converters with fast response are needed for powering digital systems such as microprocessors. Modern microprocessors (e.g., CPUs, GPUs, TPUs) require 500 A or more at under 1 V. One major challenge in configuring power converters for future microprocessors is that the load current can step from near zero to full load or vice versa in a matter of nanoseconds, and the voltage must be held stable throughout the step, with a projected tolerance of less than 50 mV. The combination of high current and fast response requires a voltage regulator module (VRM) located immediately adjacent to the load. The VRM must be small in size as well as have high efficiency and extremely fast response. Placing the VRM between the microprocessor and the motherboard is a feasible and highly attractive solution.

The standard configuration used for high-performance VRMs is a buck converter with multiple interleaved parallel sections. In a buck converter with a load-current step, the output capacitor supplies (or sinks) the immediate difference in current while the inductor current is ramped up or down to match the new load current. A small inductor allows ramping the current quickly to minimize the output capacitor requirement. However, small inductor values also lead to large ripple current. In a single-phase converter, large ripple current in the inductor increases the output capacitor requirement when the inductor is small. A multiphase interleaved design avoids this problem because it achieves substantial ripple current cancellation in the output capacitor. This allows smaller inductance without requiring a large output capacitor. However, the ripple current flows through the MOSFET switches and through the inductor itself, resulting in higher losses and higher peak current requirements.

One strategy to reduce the ripple current throughout is to operate at high switching frequencies, but this operation increases switching and gate-drive losses and imposes difficult requirements for magnetic materials capable of low loss at high frequencies.

As such, there is a need for an approach for power delivery that reduces current ripple while maintaining fast transient performance.

SUMMARY OF THE INVENTION

According to various embodiments, a power converter circuit is disclosed. The power converter circuit includes at least two vertically stacked printed circuit boards (PCBs) comprising a top PCB and a bottom PCB. The power converter circuit further includes at least one multiphase coupled inductor placed between the top PCB and the bottom PCB. The top PCB is coupled to the bottom PCB via at least one conductive winding of the multiphase coupled inductor. The power converter circuit further includes at least one circuit module placed above the top PCB and at least one power source placed below the bottom PCB. The multiphase coupled inductor is configured to deliver current vertically from the bottom PCB to the top PCB.

According to various embodiments, a method for fabricating a power converter circuit is disclosed. The method includes vertically stacking at least two printed circuit boards (PCBs). The PCBs include a top PCB and a bottom PCB. The method further includes placing at least one multiphase coupled inductor between the top PCB and the bottom PCB. The method further includes coupling the top PCB to bottom PCB via at least one conductive winding of the multiphase coupled inductor. The method further includes placing at least one circuit module above the top PCB and placing at least one power source below the bottom PCB. The method further includes configuring the multiphase coupled inductor to deliver current vertically from the bottom PCB to the top PCB.

According to various embodiments, a multiphase coupled inductor is disclosed. The multiphase coupled inductor includes a magnetic core having a top and bottom piece. The inductor further includes a plurality of magnetic paths between the top and bottom pieces. Each magnetic path has about equal reluctance. The inductor further includes a plurality of windings around the magnetic core. The number of windings is equal to the number of magnetic paths, where each winding links a respective magnetic path. The inductor further includes a central magnetic path between the top and bottom pieces. The central magnetic path has a higher reluctance than the plurality of magnetic paths.

Various other features and advantages will be made apparent from the following detailed description and the drawings.

BRIEF DESCRIPTION OF THE DRAWINGS

In order for the advantages of the invention to be readily understood, a more particular description of the invention briefly described above will be rendered by reference to specific embodiments that are illustrated in the appended drawings. Understanding that these drawings depict only exemplary embodiments of the invention and are not, therefore, to be considered to be limiting its scope, the invention will be described and explained with additional specificity and detail through the use of the accompanying drawings, in which:

FIG. 21(a) depicts an alternative example of the coupled inductor according to an embodiment of the present invention;

FIG. 21(b) depicts the alternative example of the coupled inductor according to an embodiment of the present invention;

FIG. 56(*b*) depicts a customized four-phase coupled inductor according to an embodiment of the present invention; and FIG. 56(*c*) depicts a side-by-side comparison of the two-phase coupled inductor core with two discrete inductors according to an embodiment of the present invention.

DETAILED DESCRIPTION OF THE INVENTION

Figure 1:
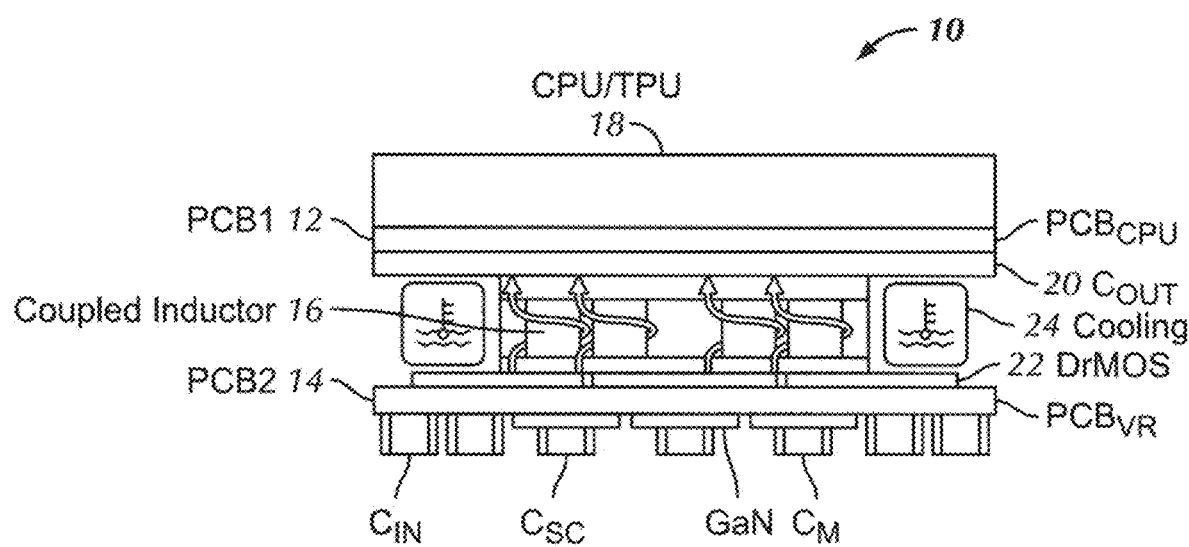
FIG. 1 depicts a cross section view of a vertical packaging technique according to an embodiment of the present invention.

Generally disclosed herein are embodiments for systems and methods for vertical power delivery to electronic systems. The vertical power delivery technique includes a 3D packaging approach which connects the microprocessors to motherboards with very low interconnect loss. The technique also includes a multiphase coupled inductor structure which works with the packaging technique and can greatly enhance the performance of the voltage regulation modules. Approaches for configuring and optimizing the 3D packaging and the multiphase coupled inductor structure are introduced as well.

In the embodiments disclosed herein, the coupled inductor is placed between the motherboard and the microprocessor and the current is delivered vertically, perpendicular to the surface of the motherboard. This configuration offers large winding areas for the coupled inductor. It significantly reduces the resistance and parasitic inductance, yielding higher efficiency. Using coupled inductors with cross-coupled switching, the current ripple can be reduced while maintaining fast transient performance. Moreover, the magnetic core and output capacitor size can be reduced.

Further disclosed herein are embodiments for a permeance model for programmable coupled inductors in multiphase buck converters. The model is derived as a topological dual of a traditional multiphase coupled transformer model, yielding an equivalent circuit with significantly simplified equations for evaluating the transient and steady state performance. The model clearly relates the magnetic geometry to a lumped circuit model. This allows visualization of core loss and coupling relationships in SPICE and makes it conducive to iterative magnetic core design. The permeance model is verified through analytical derivations, SPICE simulations and finite element analysis.

Further disclosed herein are embodiments for a 48V-1V 100A two-stage hybrid switched-capacitor converter with coupled inductor for high current microprocessors. The first stage of the converter is a 2:1 resonant switched-capacitor circuit which converts the 48V input voltage to 24V. The second stage of the converter is a 24:1 four-level series capacitor buck converter with a four-phase coupled inductor which is capable of delivering 100A to microprocessors. The two-stage architecture leverages: 1) a resonant switched-capacitor mechanism, 2) a series-capacitor-buck configuration, and 3) a multiphase coupled inductor operation, to achieve high efficiency, high power density, and high control bandwidth. The effectiveness of the topology is verified by a 48V-1V/100A prototype with a peak efficiency of 91.8% at 25A and a full load efficiency of 87.9% at 100A.

Further disclosed herein are embodiments for a merged-two-stage hybrid switched-capacitor converter with coupled inductors for ultra-high-current microprocessors. By merging a switched-capacitor stage with a multiphase buck converter stage, the disclosed converter can realize the advantages of both reduced stress and soft charging. The merging of the two stages enables the coupled inductors used in the multiphase buck stage to reduce the steady-state current ripple and improve the transient performance. Further introduced are embodiments for configuring coupled inductors in multiphase buck converters based on of a permeance model which links the geometry of the magnetic core and the lumped circuit model for SPICE simulations. A 450 W, 48 V-to-1.5 V, 300 A LEGO-PoL converter was built and tested with multiple two-phase coupled inductors as an initial validation of the theoretical and simulated results.

3D Packaging Technique

FIG. 1 shows a cross-sectional view of the proposed coupled inductor structure and the packaging technique. The voltage regulator module 10 includes two or more printed circuit boards (PCBs) 12, 14 and one coupled inductor 16. The PCBs 12, 14 are vertically stacked on top of each other with conductive links (vias, rods, wires, PCBs) between them. Here, a two PCB structure is used as an example to illustrate the key principles of the embodiments disclosed herein. The microprocessors (e.g., CPU/TPU 18) in FIG. 1 are placed on the top PCB 12, together with the output capacitors ($C_{OUT}$) 20 of the voltage regulator module (VRM) 10. The bottom side of the top PCB 12 is connected to the winding of the multiphase coupled inductor 16. The multiphase coupled inductor 16 delivers current vertically from the bottom PCB 14 to the top PCB 12. One terminal of each winding of the coupled inductor 16 is connected to the top PCB 12. The other terminal of each winding of the coupled inductor 16 is connected to the bottom PCB 14. The switching devices 22 of the voltage regulator module (e.g., the DrMOS and/or GaN), are placed on the bottom PCB 14. Cooling channels 24 are placed between the top PCB 12 and bottom PCB 14. The cooling channels can be immersion cooling or air cooling as nonlimiting examples. Further included on the bottom PCB 14 are an input capacitor $C_{in}$ which filters the input current, a switched capacitor $C_{sc}$ which performs capacitive power delivery, and a capacitor $C_m$ at the intermediate bus. As seen in FIG. 1, the power supply (here, input capacitor $C_{in}$ and a switched capacitor $C_{sc}$) is positioned below the bottom PCB 14.

There are many ways of implementing the PCBs. One option is to implement the top PCB 12 as the motherboard of the computer and implement the bottom PCB 14 as the small-scale power board which only hosts the power devices. Another option is to implement the bottom PCB 14 as the motherboard and implement the top PCB 12 as a small-scale power board. The top PCB 12 and bottom PCB 14 can also be implemented as a Power-System-in-Package system with the coupled inductor 16 internally embedded. Once assembled, the pair of boards can be oriented in any direction. It should be noted "top" and "bottom" are used only for identification and not as constraints on the application of the assembly.

Figure 2:
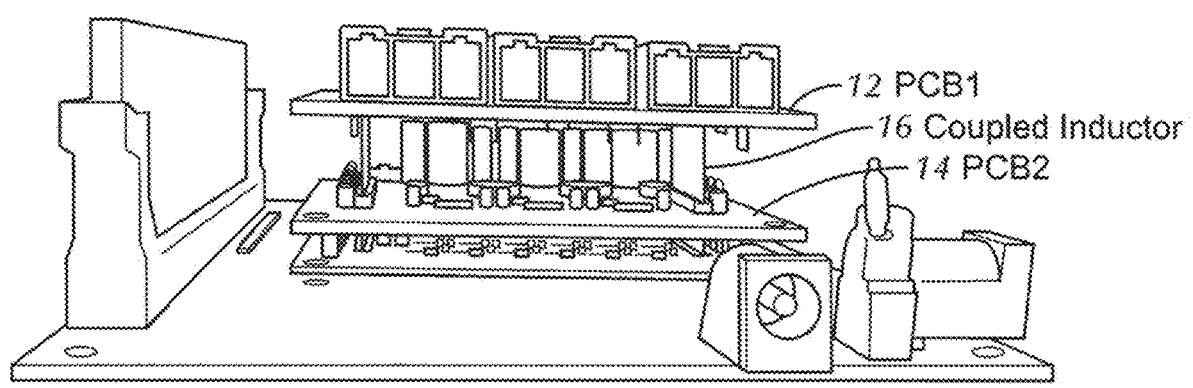
FIG. 2 depicts an example vertical packaging technique according to an embodiment of the present invention.

FIG. 2 shows a 3D assembly image of the vertical packaging technique. This configuration comprises three vertical stacked PCBs. The circuit on the bottom two PCBs 14 are switching devices, and the top PCB 12 hosts the microprocessor and the output capacitors of the VRM. Three coupled inductors 16 are placed between the top PCB 12 and the bottom two PCBs 14. This converter was configured for a 48V-1V point-of-load application, though that is not intended to be limiting. The number of PCBs and the number of coupled inductors depends on the embodiment and is not intended to be limiting.

Figure 3:
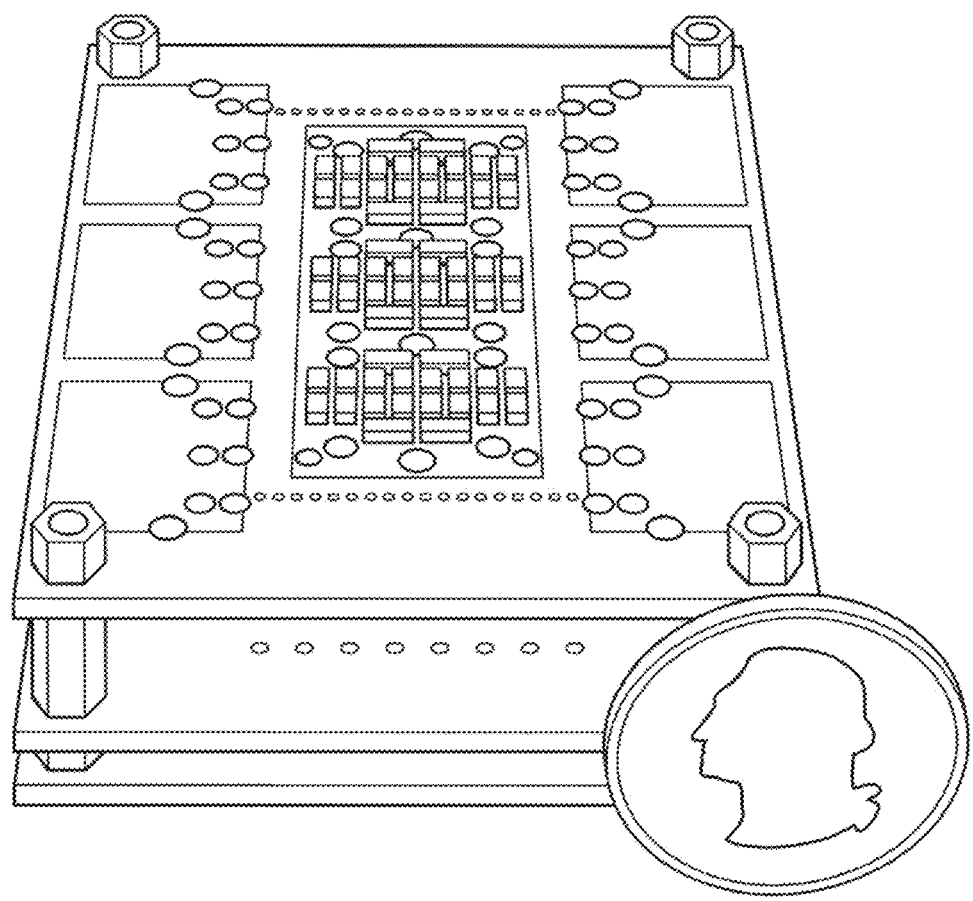
FIG. 3 depicts an experimental prototype of the vertical packaging technique according to an embodiment of the present invention.
Figure 4A:
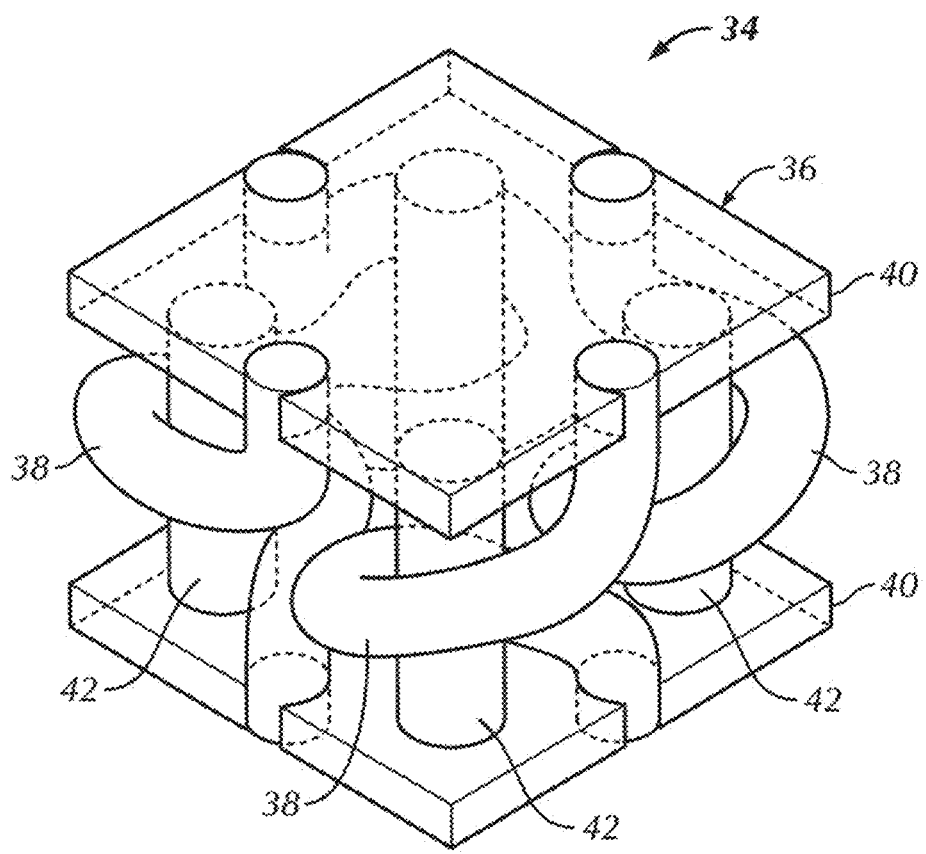
FIG. 4(a) depicts an example of the coupled inductor structure according to an embodiment of the present invention.
Figure 4C:
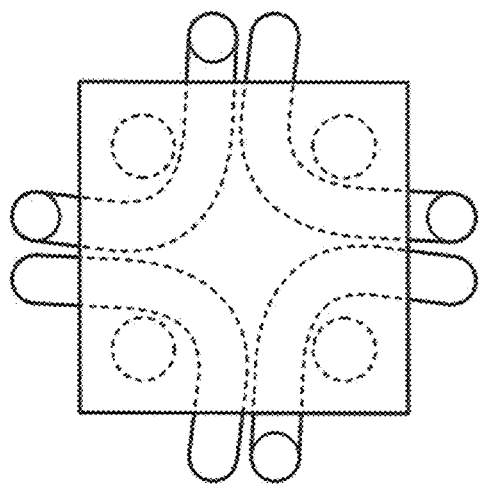
FIG. 4(c) depicts the example of the coupled inductor structure according to an embodiment of the present invention.
Figure 4D:
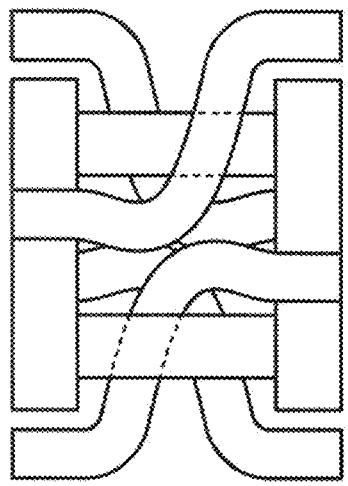
FIG. 4(d) depicts the example of the coupled inductor structure according to an embodiment of the present invention.
Figure 4B:
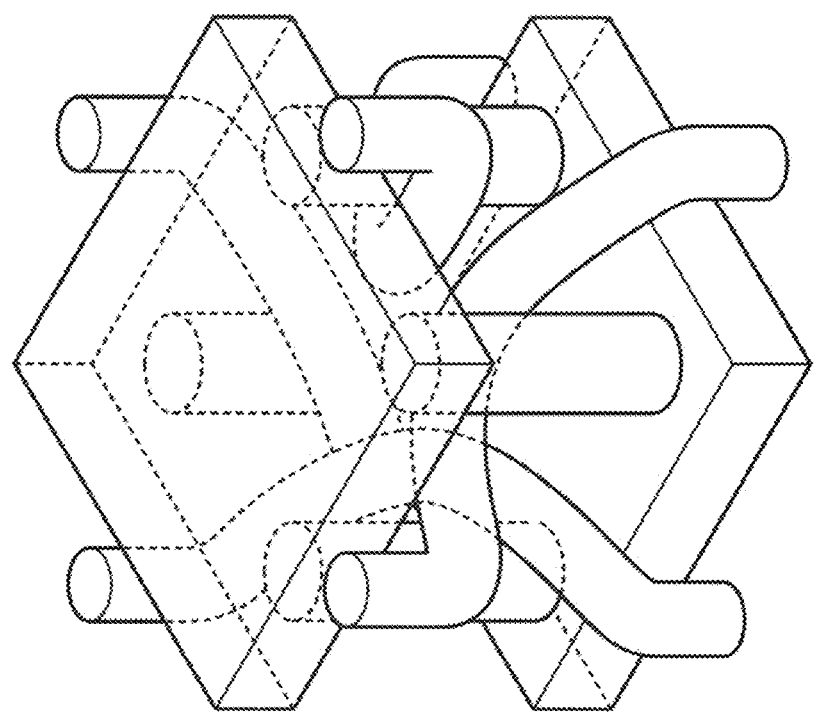
FIG. 4(b) depicts the example of the coupled inductor structure according to an embodiment of the present invention.
Figure 5A:
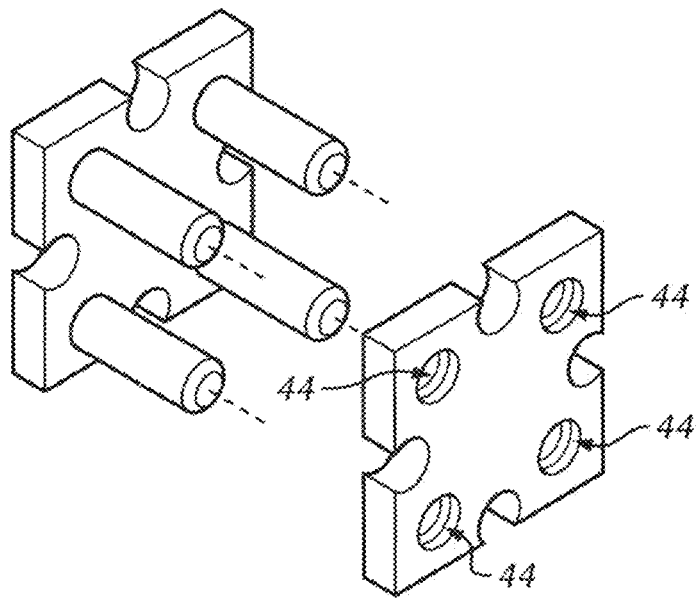
FIG. 5(a) depicts an example of the magnetic core according to an embodiment of the present invention.
Figure 5B:
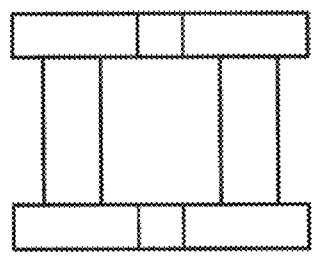
FIG. 5(b) depicts the example of the magnetic core according to an embodiment of the present invention.
Figure 5C:
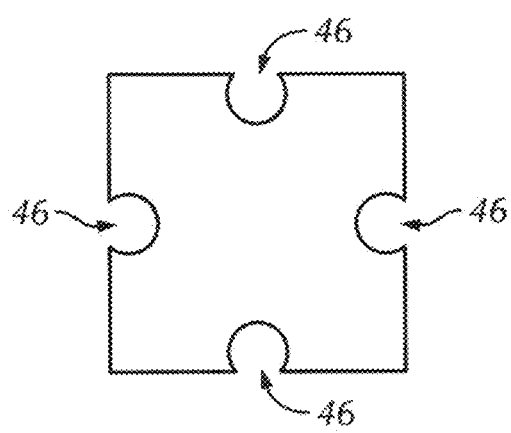
FIG. 5(c) depicts the example of the magnetic core according to an embodiment of the present invention.
Figure 5D:
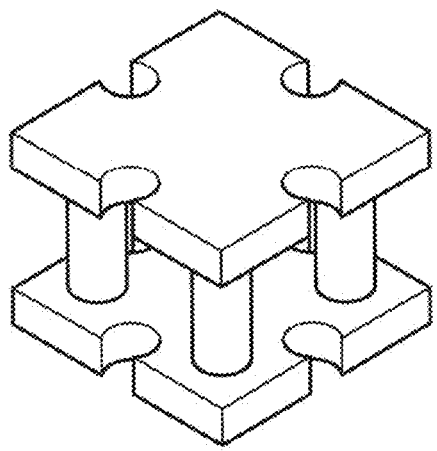
FIG. 5(d) depicts the example of the magnetic core according to an embodiment of the present invention.
Figure 6A:
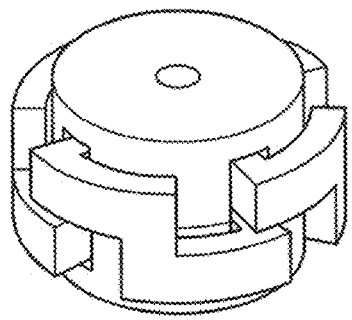
FIG. 6(a) depicts an example of the coupled inductor and the winding structure according to an embodiment of the present invention.
Figure 6B:
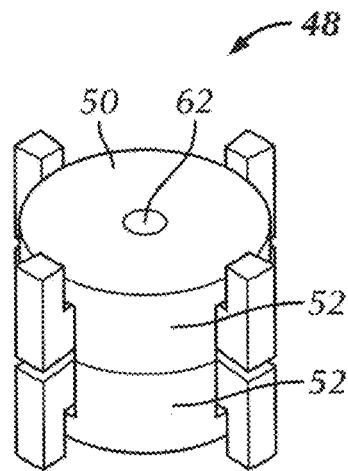
FIG. 6(b) depicts the example of the coupled inductor and the winding structure according to an embodiment of the present invention.
Figure 6C:
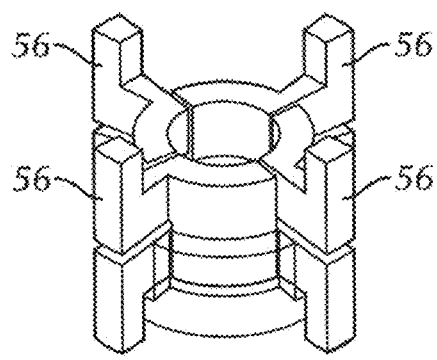
FIG. 6(c) depicts the example of the coupled inductor and the winding structure according to an embodiment of the present invention.
Figure 6D:
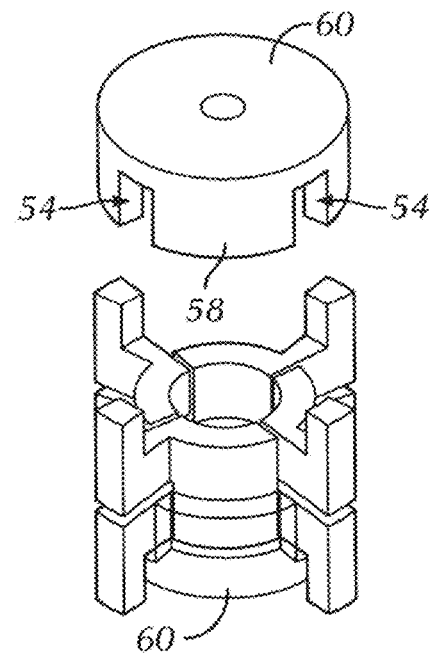
FIG. 6(d) depicts the example of the coupled inductor and the winding structure according to an embodiment of the present invention.
Figure 6E:
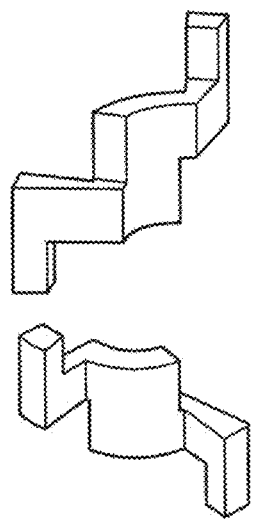
FIG. 6(e) depicts the example of the coupled inductor and the winding structure according to an embodiment of the present invention.
Figure 7A:
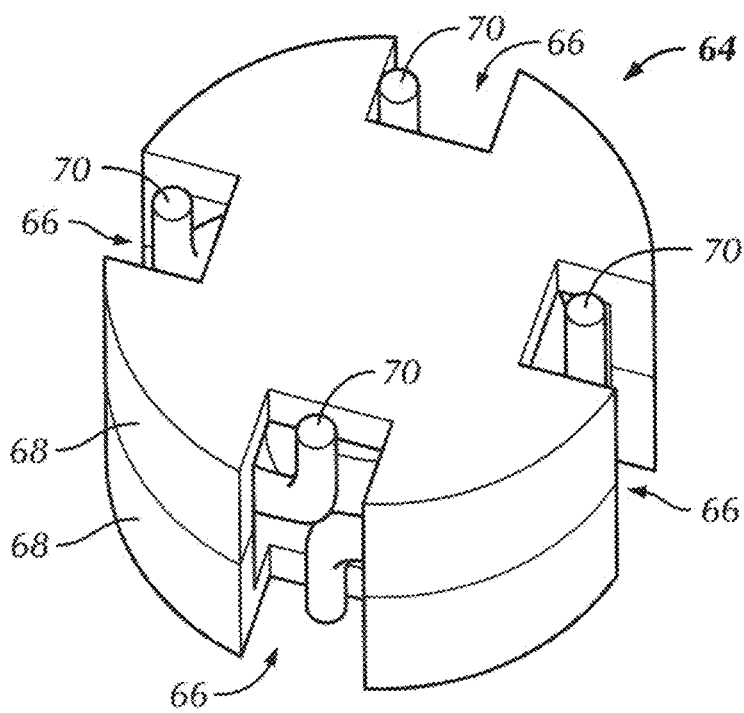
FIG. 7(a) depicts an alternative example of the coupled inductor according to an embodiment of the present invention.
Figure 7B:
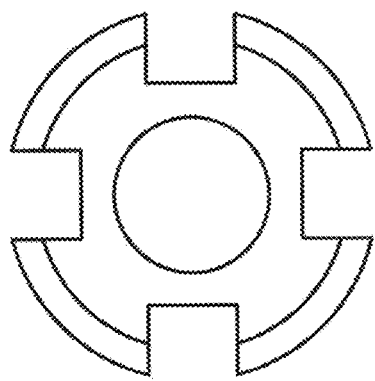
FIG. 7(b) depicts the alternative example of the coupled inductor according to an embodiment of the present invention.
Figure 7C:
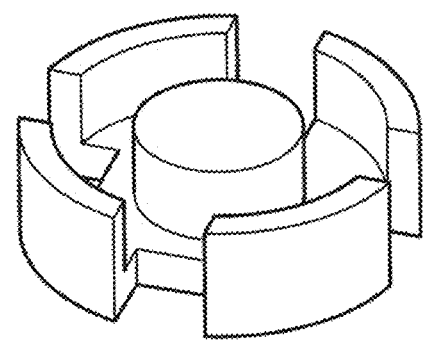
FIG. 7(c) depicts the alternative example of the coupled inductor according to an embodiment of the present invention.
Figure 7D:
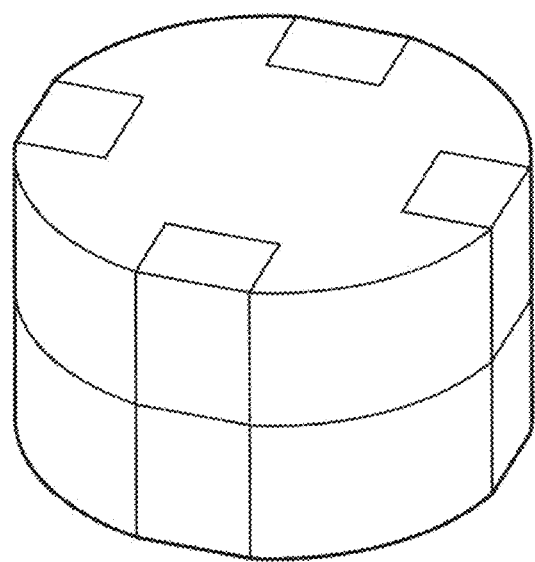
FIG. 7(d) depicts the alternative example of the coupled inductor according to an embodiment of the present invention.
Figure 7F:
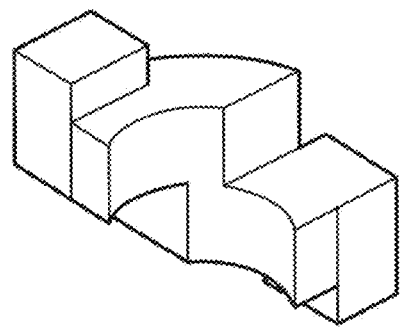
FIG. 7(f) depicts the alternative example of the coupled inductor according to an embodiment of the present invention.
Figure 7E:
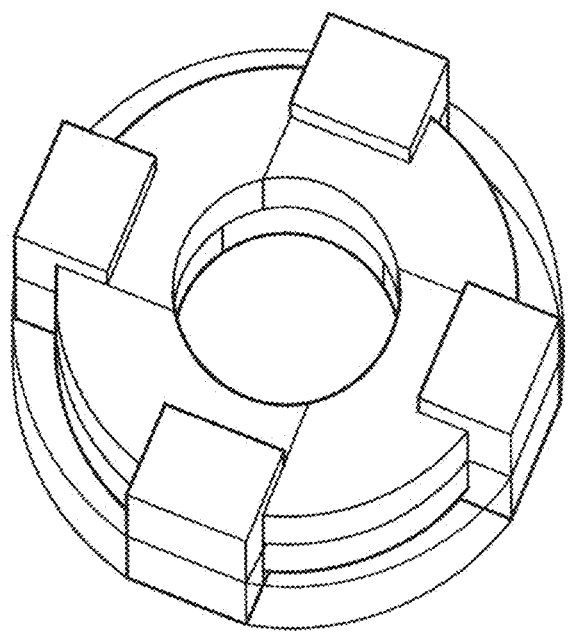
FIG. 7(e) depicts the alternative example of the coupled inductor according to an embodiment of the present invention.
Figure 7G:
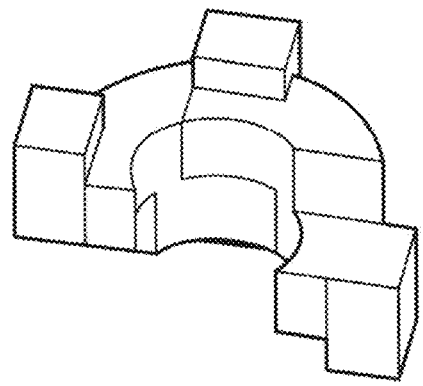
FIG. 7(g) depicts the alternative example of the coupled inductor according to an embodiment of the present invention.

FIG. 3 shows an experimental prototype of the 3D vertical packaging technique. Three PCBs are fabricated with two PCBs placed on the bottom of the coupled inductor and one PCB placed on the top of the inductor. Semiconductor switches and controllers are placed on the bottom two PCBs. The output capacitors are placed on the top PCB.

Multiphase Coupled Inductor Structure

FIGS. 4(*a*)-(*d*) show an example embodiment of the coupled inductor structure 34. The coupled inductor structure 34 comprises a magnetic core 36 and multiple windings 38. The magnetic core 36 can be fabricated as one complete device, or many separate pieces assembled together. The magnetic core 36 can be implemented as ferrites or powdered iron, as nonlimiting examples. The windings 38 can be implemented as wires or customized conductor pieces. The windings 38 can be implemented as copper-alloy as a nonlimiting example. The windings 38 can be identical and can be half-turn windings or single-turn windings as nonlimiting examples.

The magnetic core 36 of the coupled inductor structure 34 includes two flat plates 40 and four cylindrical rods 42. The two flat plates 40 are supported by the four cylinder rods 42. Each cylinder rod 42 (e.g., a plurality of uniform magnetic paths) is surrounded by a conductor winding 38 implemented as copper wire. The four conductor windings 38 are wound on the rod following the same direction to enable proper coupling. The windings 38 can be wound with a half-turn, a complete turn, or multiple turns. The number of turns of each winding 38 can be identical or different. The four rods 42 may or may not have the same diameter. The top and bottom plates 40 and the four rods 42 can be manufactured with different core materials with different permeability and core loss. For example, a material with high permeability could be ferrite while a material with low permeability could be powdered iron. The windings 38 connect the top PCB 12 and bottom PCB 14 together.

FIGS. 5(*a*)-(*d*) show the example magnetic core 36. The four rods 42 are inserted into four blind holes 44 in the top and bottom plates 40 to ensure tight magnetic linkage. Four circular open holes or slots 46 are created on the four edges of the top and bottom plates 40 to connect the windings to the top PCB 12 and bottom PCB 14.

FIG. 6(*a*)-(*e*) show another embodiment of the coupled inductor structure 48. In this embodiment, the magnetic core 50 is implemented as two separate pot-core pieces 52, one on the top, and the other on the bottom. Each pot core 52 has four opening slots 54 on the side for the in-let and out-let of the conductive windings 56. The vertical rods 58 are implemented as extensions of the top and bottom plate 60. The windings 56 get into the magnetic core 50 through one slot 54, rotate for 90 degrees, and get out of the magnetic core 50 through the next slot 54. The cross-section areas of the windings 56 are close to uniform to minimize the resistance. One side of the winding 56 is connected to the bottom PCB 14, the other side of the winding 56 is connected to the top PCB 12. The top and bottom piece of the pot core 52 also has a center rod 62 (e.g., an additional, central magnetic path) which may include an air gap to offer the needed coupling coefficient. An air gap can also be added on the side walls to adjust the reluctances of the side wall.

FIGS. 7(*a*)-(*g*) show a slightly different way of implementing the coupled inductor 64. The open slots 66 are extended to the top and bottom plates 68 for easy connection with the top PCB 12 and bottom PCB 14. The windings 70 can be implemented as wires, or customized copper pieces.

Figure 8:
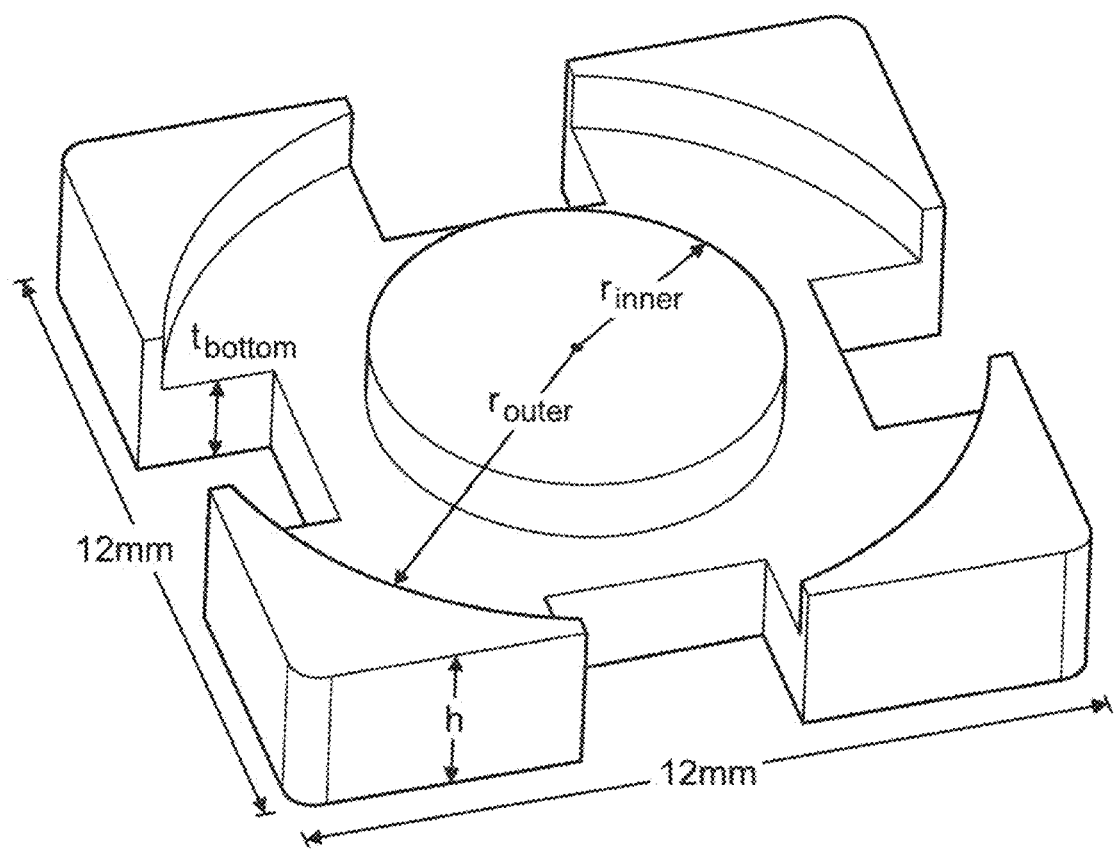
FIG. 8 depicts configuration parameters of the coupled inductor according to an embodiment of the present invention.

FIG. 8 shows the key configuration parameters of the coupled inductor, including the external dimension (12 mm×12 mm in this example), the radius of the internal rod (r_inner), the radius of the external edge (r_outer), the thickness of the bottom plate (t_bottom), the height of the side rod (h), and the dimension of the opening slot. It should be noted these parameters will depend on the application and are not intended to be limiting. As a nonlimiting example, they can be in the 10 mm range.

Modified Shapes for Improved Performance

The shapes illustrated in FIGS. 4-8 illustrate the topology of the coupled inductor structure and are constructed from conceptually simple shapes. The shape can be adjusted in many ways to optimize the performance. Some of the key parameters to consider in optimizing the performance are:

(1) Short length of the windings to lower dc resistance.

(2) Large cross-sectional area of the winding conductors to lower dc resistance. It should be noted that the area can vary along the length and using the maximum available area at each position along the length helps reduce dc resistance.

(3) Large area of the central flux path to allow higher current before saturation and to reduce core loss.

(4) Large area of the outer core legs to allow higher current before saturation and to reduce core loss. It should be noted that although increasing the area in some regions is helpful to reduce core loss and can also help soften the impact of saturation, the minimum cross-sectional area region will saturate first.

(5) Minimized length of the outer core legs to reduce core loss and increase maximum available coupling (in the case that these legs are ungapped).

Within a given footprint and height, there are tradeoffs among these parameters. For a given shape of the core and of the windings, one can vary the dimensions to trade off core area and winding area, for example. Beyond, this, one can also modify the shape to make improvements in selected without compromising the others significantly, or in some cases without compromising them at all.

One example of this type of modification is shown in FIGS. 7(*a*)-(*g*) in the progressing from the round wire winding in the top implementation to the complex solid winding in the bottom. The concept being applied here is to make full use of the available volume.

Figure 9A:
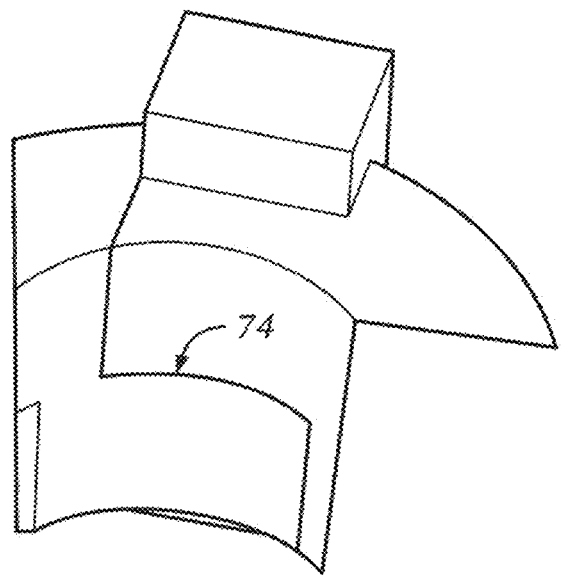
FIG. 9(a) depicts a modified winding with diagonal winding interface according to an embodiment of the present invention.
Figure 9B:
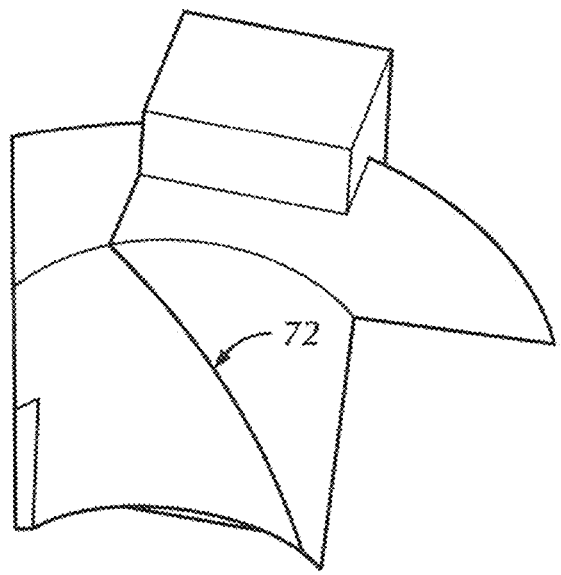
FIG. 9(b) depicts the modified winding with diagonal winding interface according to an embodiment of the present invention.

As another example, FIGS. 9(a)-(b) show a portion of the windings from FIGS. 7(a)-(g), but with the boundary between the two windings modified to be diagonal 72 instead of stepped 74. This reduces the length and increases the area of part of the winding, reducing dc resistance via both effects without compromising any other parameters. Because conductors can easily be formed into shapes like this, this is a particularly attractive modification. The general concept here is to shorten paths by using diagonals.

A further improvement is referred to herein as a "pinwheel coupled inductor" extends the concept of diagonal paths to the core as well as the windings. In the inductor in FIGS. 4(a)-(d), the top and bottom plates 40 of the inductor are aligned. In this scenario, the angle of rotation between the top and bottom plates 40 is 0 degrees, and the winding 38 must rotate around the core 36 in order to achieve one winding turn. By increasing this angle of rotation between the top and bottom plates 40 (to a maximum of 90 degrees for a 4-phase inductor), the rotation of the winding 38 is reduced as the rotation of the core 36 is increased. In the extreme, the winding 38 can be a straight vertical post, and the core 36 wraps around the winding 38.

Figure 10A:
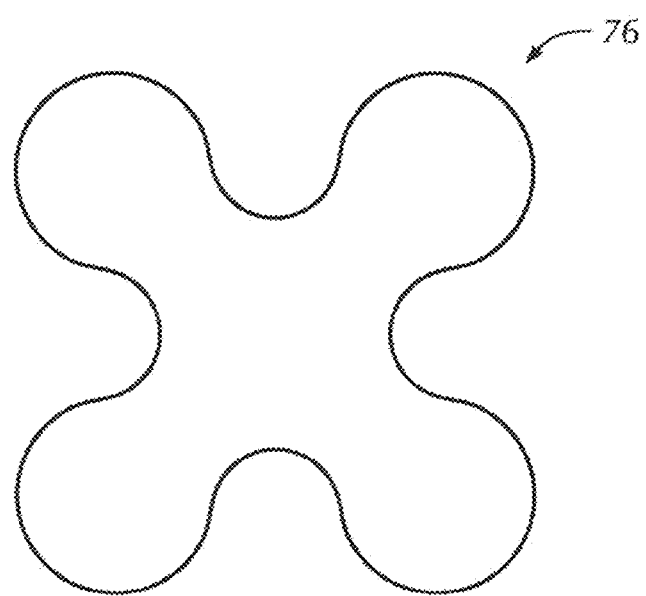
FIG. 10(a) depicts an example pinwheel plate configuration according to an embodiment of the present invention.
Figure 10B:
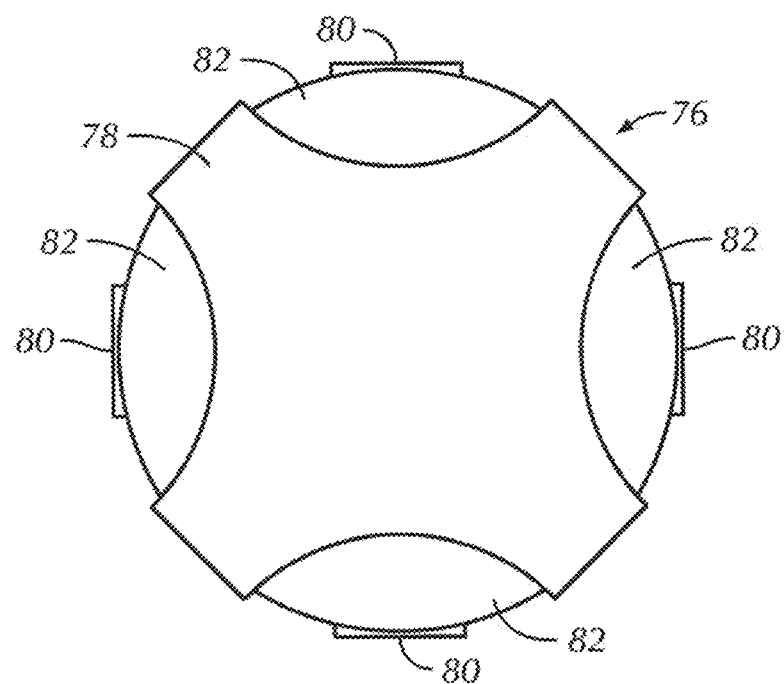
FIG. 10(b) depicts a top view, 45-degree rotation of the pinwheel plate configuration according to an embodiment of the present invention.
Figure 10C:
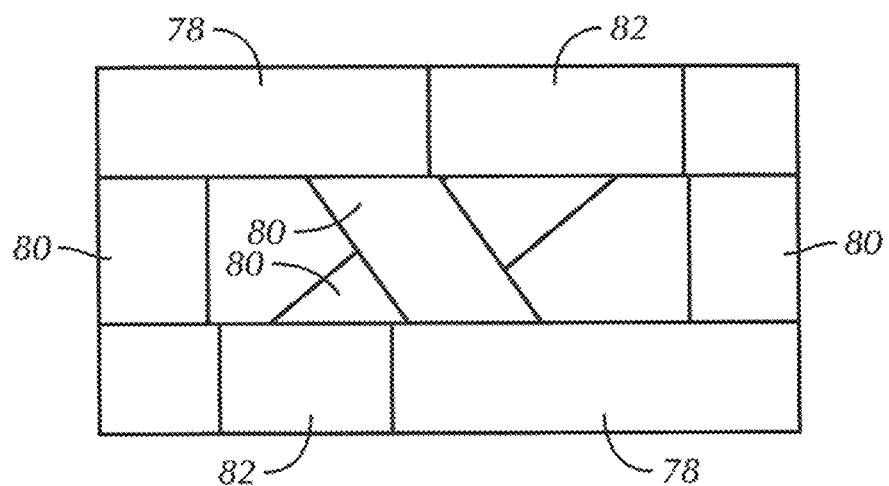
FIG. 10(c) depicts a side view of the pinwheel plate configuration according to an embodiment of the present invention.

FIGS. 10(a)-(c) show an example of the pinwheel coupled inductor 76 with a 45-degree rotation between the top and bottom plates 78, as seen in the top view in FIG. 10(b). The side view in FIG. 10(c) shows that as the top and bottom plates 78 rotate, the core legs 80 that connect the top and bottom plates 78 are angled, and the distance traveled by the winding 82 is reduced. The angle of rotation may be chosen based on practical fabrication constraints, particularly for the core, and based on tradeoffs between the listed parameters. In general, higher rotation of the core reduces winding resistance, while lower rotation angles allow easier core fabrication and provide lower core loss and lower flux density to help avoid saturation.

Figure 11C:
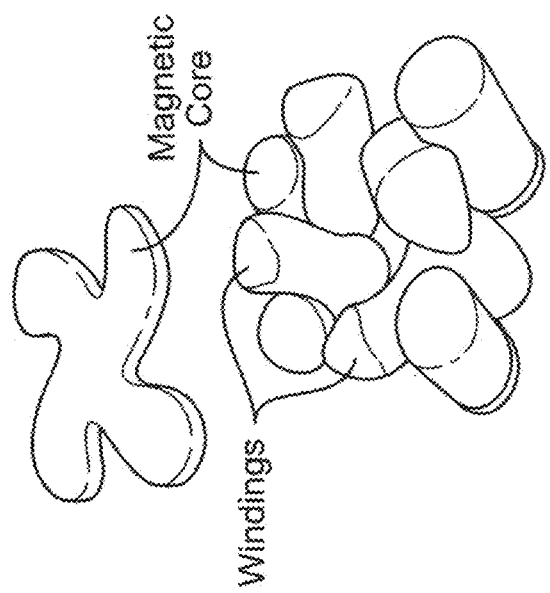
FIG. 11(c) depicts a physical model of examples of the pinwheel inductor configuration according to an embodiment of the present invention.
Figure 11B:
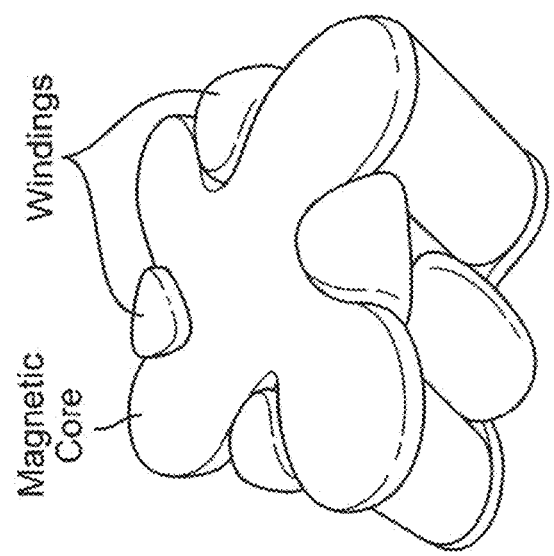
FIG. 11(b) depicts a physical model of examples of the pinwheel inductor configuration according to an embodiment of the present invention.
Figure 11A:
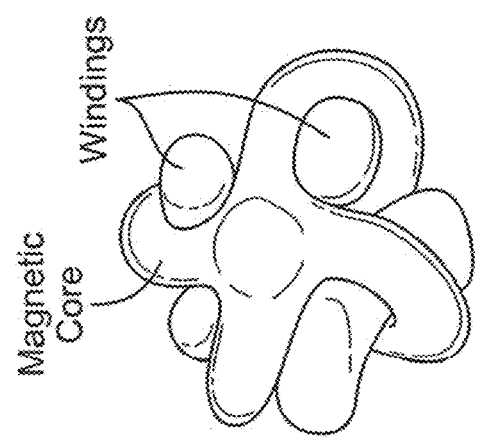
FIG. 11(a) depicts a physical model of examples of the pinwheel inductor configuration according to an embodiment of the present invention.

FIGS. 11(a)-(c) show a few physical models for the pinwheel inductor concept. The model in FIG. 11(a) uses shapes intended to make the structure and concept easily visible but is not optimized for performance or for easy fabrication. A practical version of this could use one U-shaped piece for each phase, joining at the center with or without top and bottom "hub" pieces. The winding pieces would be shaped to take better advantage of the space available.

FIGS. 11(b)-(c) respectively illustrate a pinwheel coupled inductor with a core made from a different set of pieces. The top and bottom plates of the core are fabricated separately from the core posts. Conductors are formed to use the available space while leaving a path in the center for leakage flux through the air and through an optional center core post. In practice, the top and bottom plates should be thick enough to make the "spokes" have similar cross-sectional area to that of the posts.

Variations in Number of Phases and Number of Turns

Although the examples embodiments shown herein are all four-phase, any number of phases greater than 1 may be used. There are substantial performance advantages achieved by using 3 to 4 phases over just two but diminishing returns as the number of phases exceeds five or 6. Some applications may benefit from up to 10 phases but numbers of phases between 3 and 7 are preferred in most cases.

The example embodiments shown also use single-turn windings, as is optimal for high-current low-voltage applications. In higher-voltage and/or lower-current applications, larger number of turns are preferred.

Modeling of the Coupled Inductors

Figure 12A:
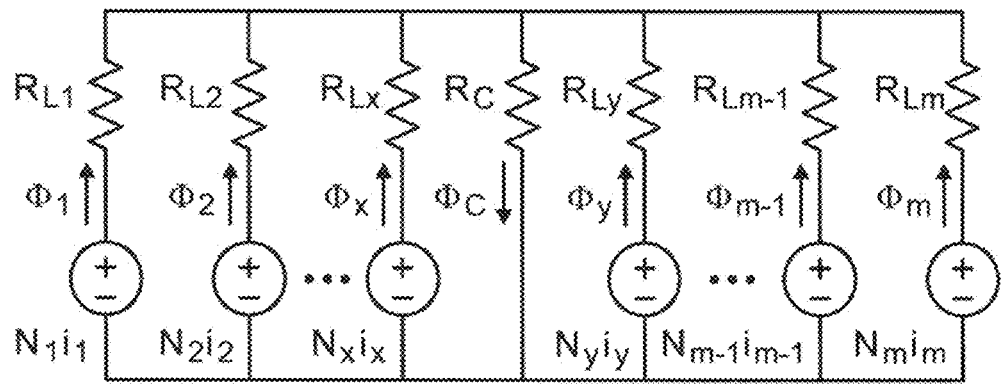
FIG. 12(a) depicts a reluctance models of the multiphase coupled inductor according to an embodiment of the present invention.
Figure 12B:
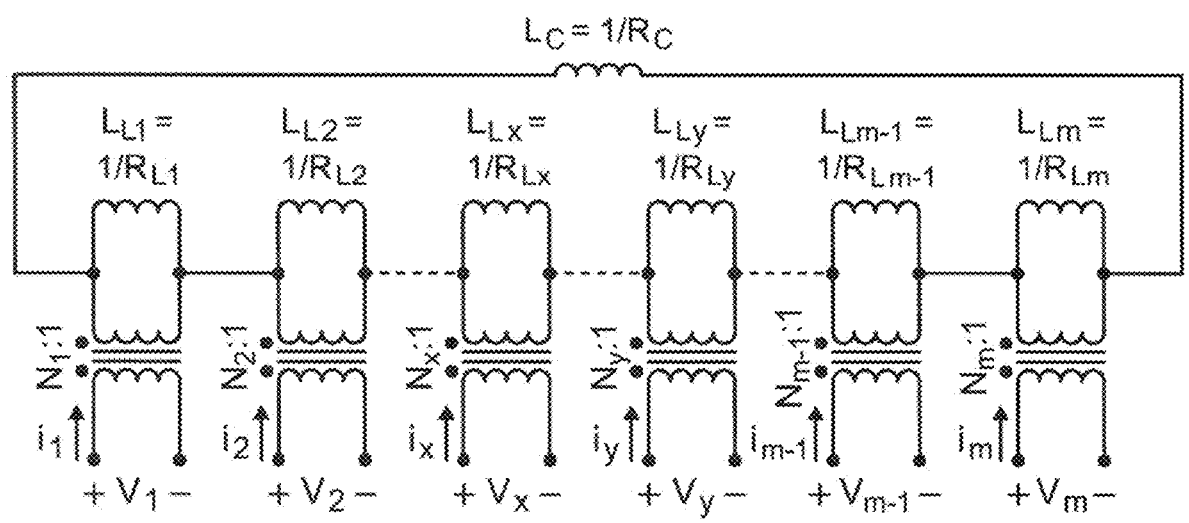
FIG. 12(b) depicts a permeance model of the multiphase coupled inductor according to an embodiment of the present invention.

FIGS. 12(a)-(b) show the reluctance and permeance model of the multiphase coupled inductor. In the reluctance model, $R_L$ is the reluctance of the side leg including the air gap, and $R_C$ is the reluctance of the center leg including the air gap. The permeance model is a topological dual of the reluctance model and the element values are related. In a practical design, $R_L$ should be large enough to avoid core saturation. $R_L$ should be much smaller than $R_C$ to enable high coupling coefficient between phases. The number of turns on each winding are modeled as an ideal transformer with a turns-ratio of N:1. Usually, the structure is symmetric, and all leg reluctances are equal, though this is not intended to be limiting. For instance, reluctances of the side legs can be substantially smaller than a reluctance of the center leg. Substantially smaller could be about less than ⅓ in reluctance difference.

Figure 13A:
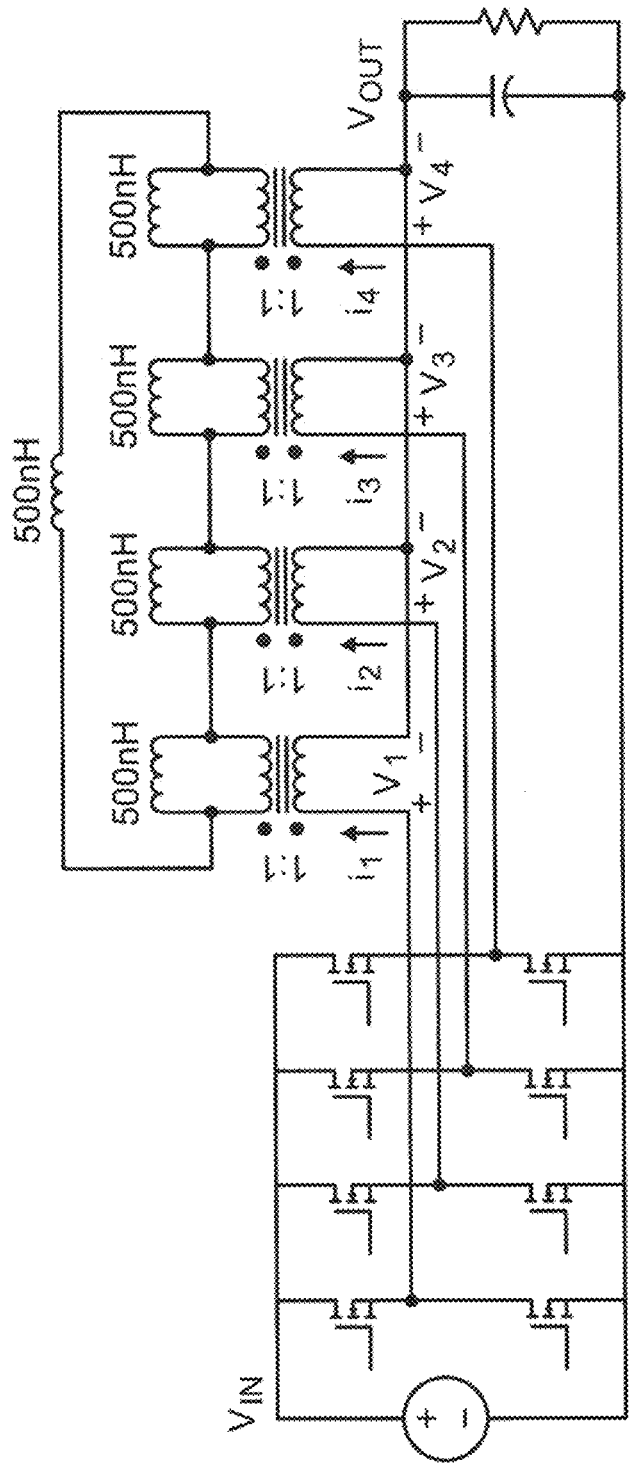
FIG. 13(a) depicts an example SPICE simulation of a four-phase coupled inductor buck converter according to an embodiment of the present invention.
Figure 13B:
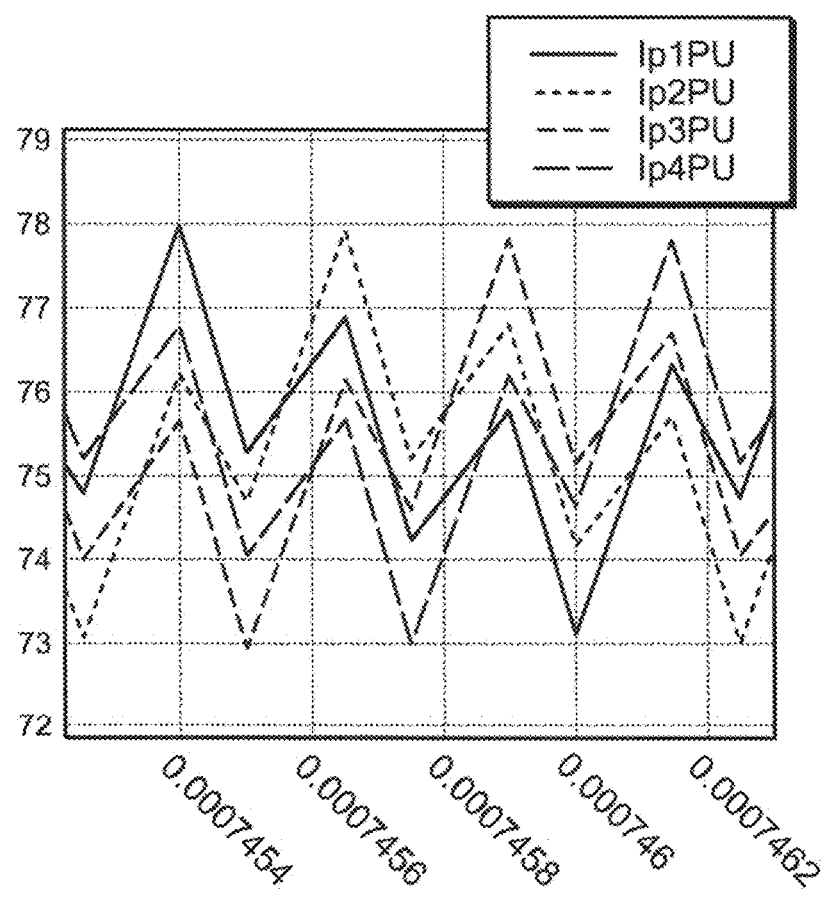
FIG. 13(b) depicts the example SPICE simulation of a four-phase coupled inductor buck converter according to an embodiment of the present invention.

FIGS. 13(a)-(b) show an example SPICE simulation platform for a four-phase buck converter with a coupled inductor. In this particular example, $R_L=R_C=$ ⅟₅₀₀ M 1/H.

Programmable Coupled Inductors

Figure 14A:
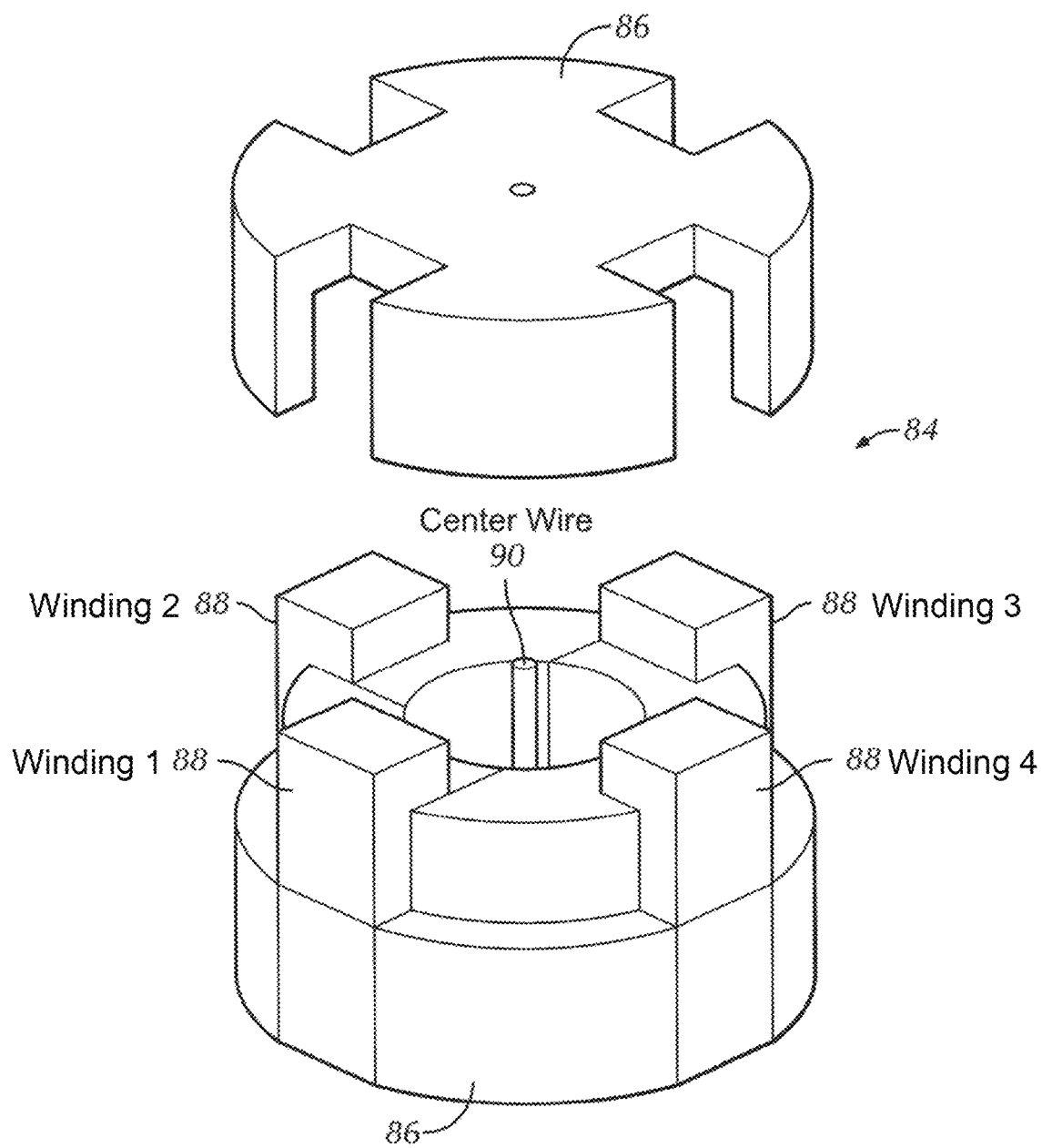
FIG. 14(a) depicts an example of the programmable coupled inductor according to an embodiment of the present invention.
Figure 14B:
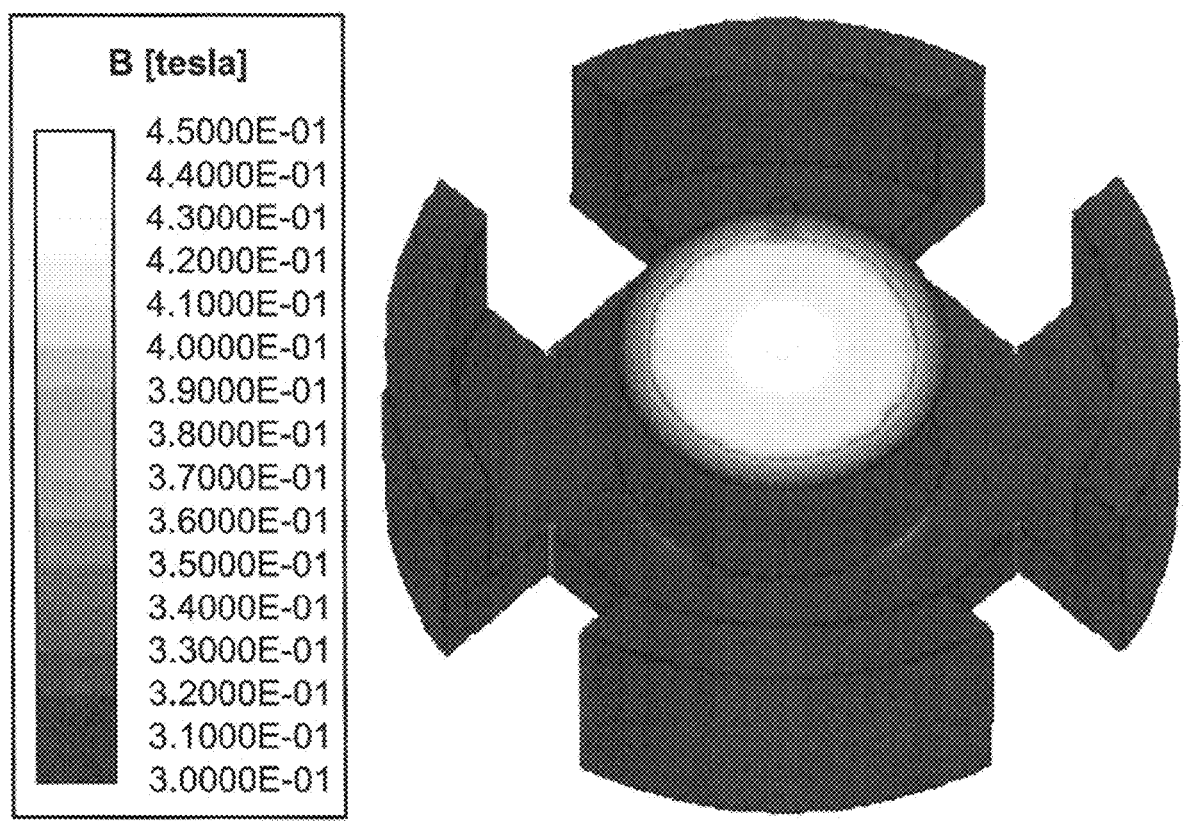
FIG. 14(b) depicts the example of the programmable coupled inductor according to an embodiment of the present invention.

FIGS. 14(a)-(b) show an embodiment of a coupled inductor 84 with programmable coupling coefficient. In addition to the magnetic core 86 and the windings 88, the programmable coupled inductor 84 has a center rod whose reluctance is programmable. There is a center hole in the center rod of the magnetic core 86. An extra wire 90 goes through the hole. By controlling the current in the wire 90, the dc bias of the magnetic flux in the center rod can be adjusted, yielding a programmable coupling coefficient among the four windings 88 on the side rods. Any method may be used to change the magnetic flux in the structure to change the coupling characteristics. Other possible embodiments include an auxiliary winding around a core leg or windings in the air gap of a core leg.

Figure 15A:
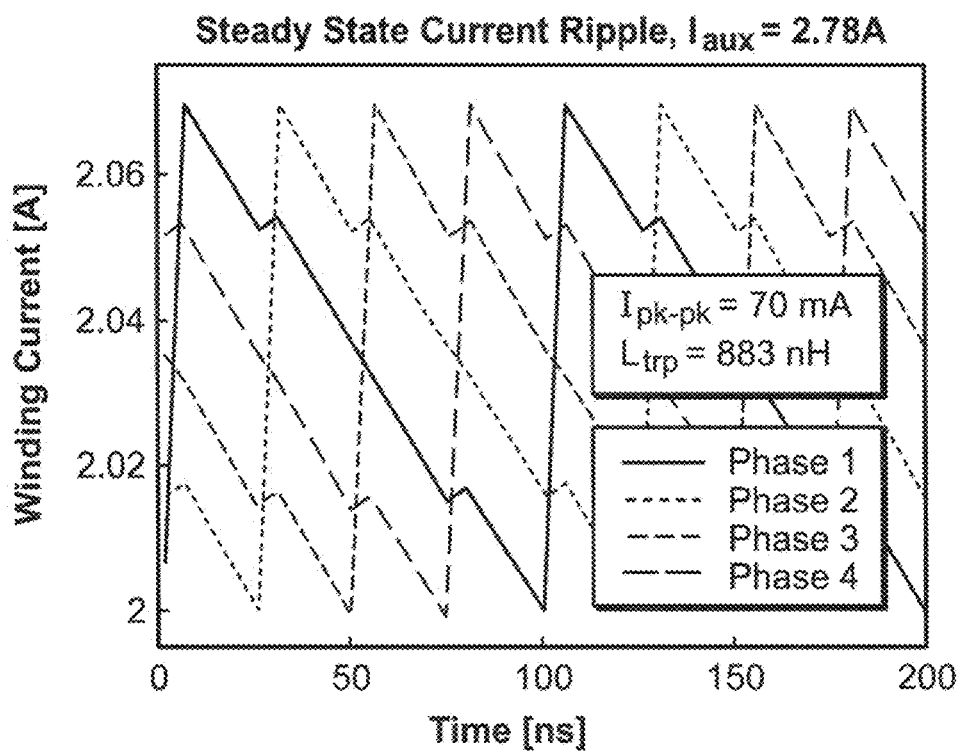
FIG. 15(a) depicts simulated waveforms of the programmable coupled inductor according to an embodiment of the present invention.
Figure 15B:
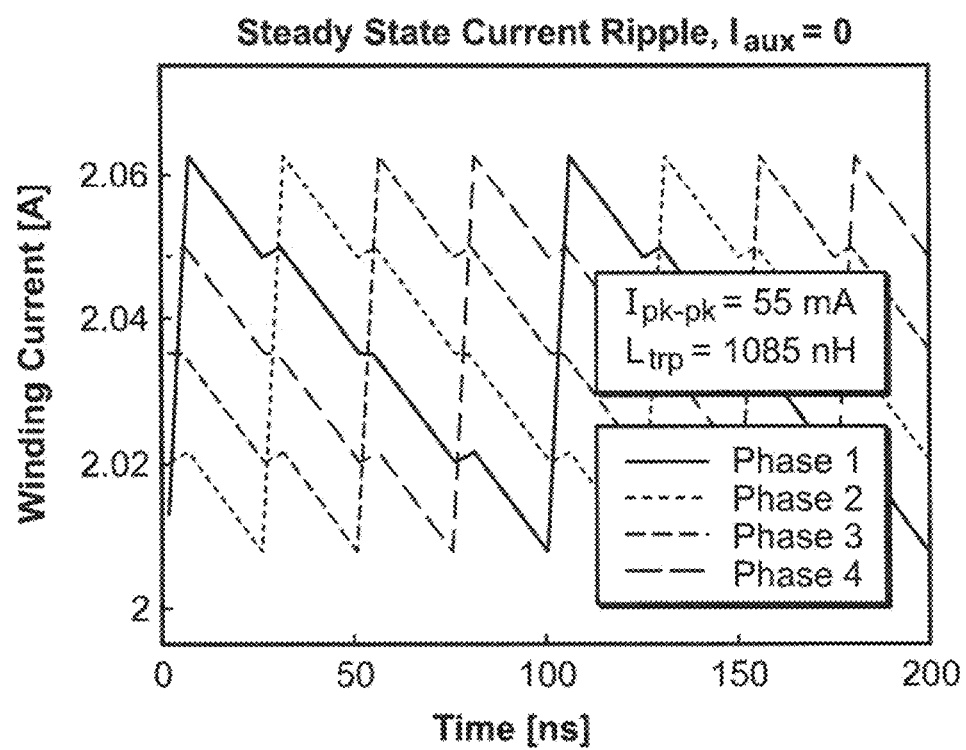
FIG. 15(b) depicts simulated waveforms of the programmable coupled inductor according to an embodiment of the present invention.

FIGS. 15(a)-(b) show the operation waveforms of the multiphase coupled inductor buck converter with a low coupling coefficient.

Figure 16A:
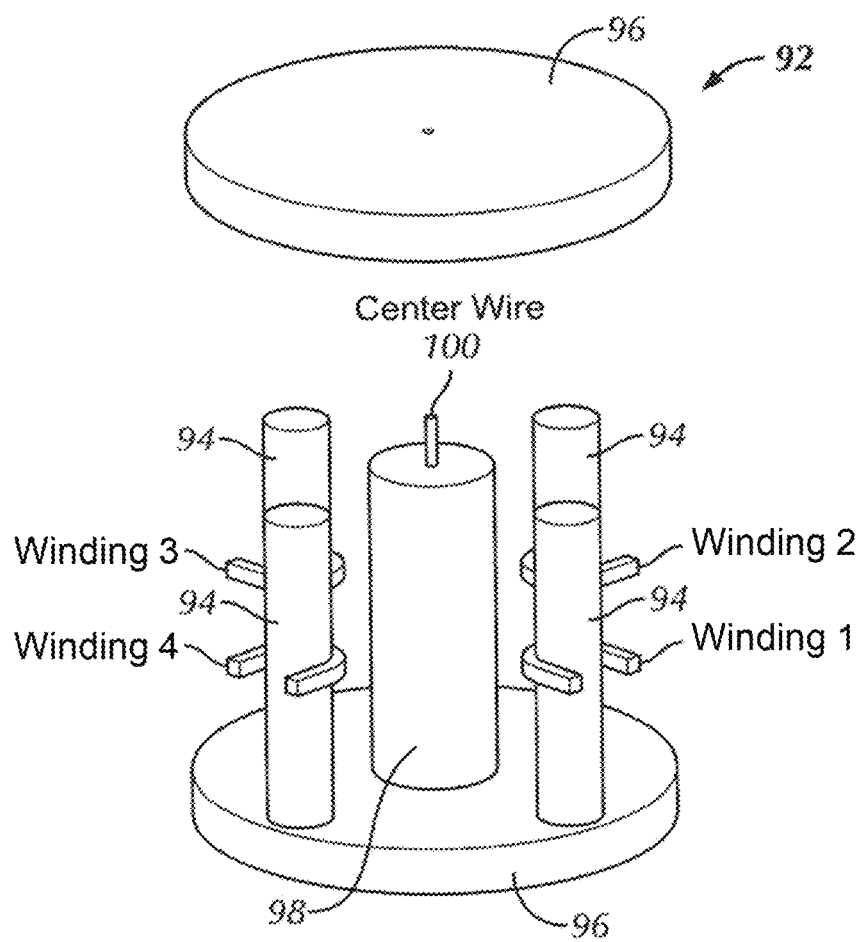
FIG. 16(a) depicts an alternative example of the programmable coupled inductor according to an embodiment of the present invention.
Figure 16B:
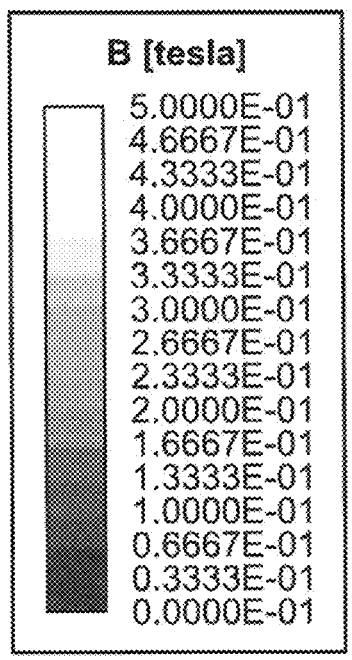
FIG. 16(b) depicts the alternative example of the programmable coupled inductor according to an embodiment of the present invention.
Figure 16B:
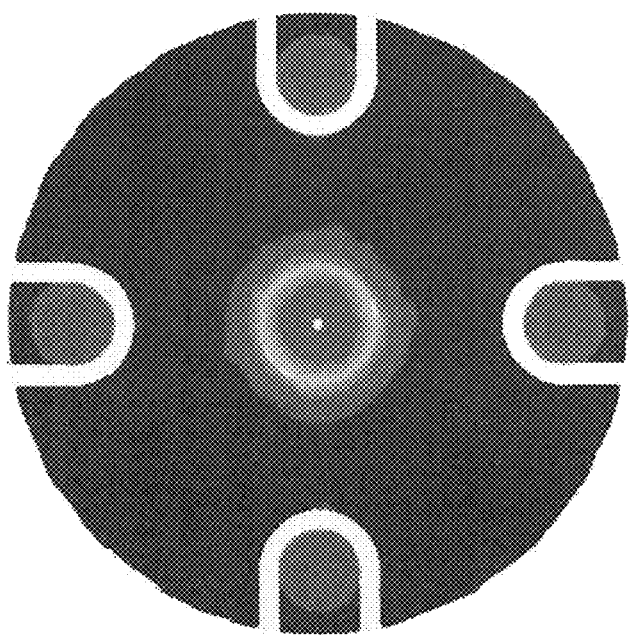
Figure 16C:
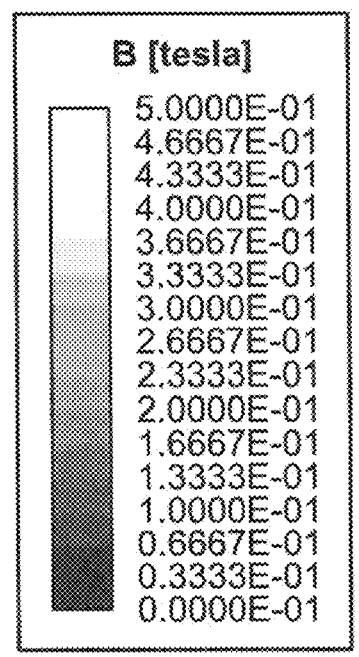
FIG. 16(c) depicts the alternative example of the programmable coupled inductor according to an embodiment of the present invention.
Figure 16C:
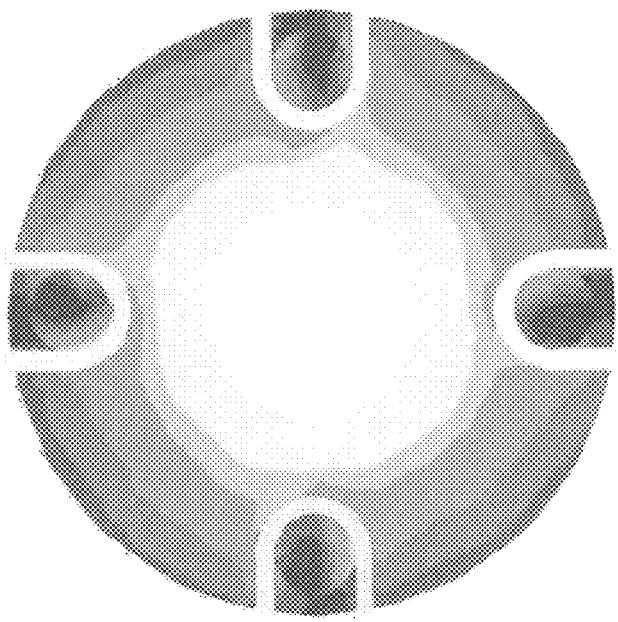

FIG. 16(a)-(c) show another example embodiment of the programmable coupled inductor 92. The four vertical rods 94 (e.g., uniform magnetic paths) are implemented as cylinder structure, and the top and bottom plates 96 are in circular shape. There is a center hole in the center rod 98 (e.g., an additional, central magnetic path) of the structure 92 which contains a wire 100 (e.g., a programmable magnetic path) for current programming. With a small current in the center wire 100, the reluctance is low, and the coupling coefficient is low. With a high current in the center wire 100, the center reluctance is high and the coupling coefficient is high.

In one embodiment, the center rod 98 can be made with a different material with different magnetic characteristics from the rest of the core. For example, the side legs could be made with high permeability material such as ferrite core, and the center leg could be made with low permeability material such as powdered iron core. The center rod 98 can have a different permeability or saturation level to change the effect of a given auxiliary current.

Experimental Results

Figure 17:
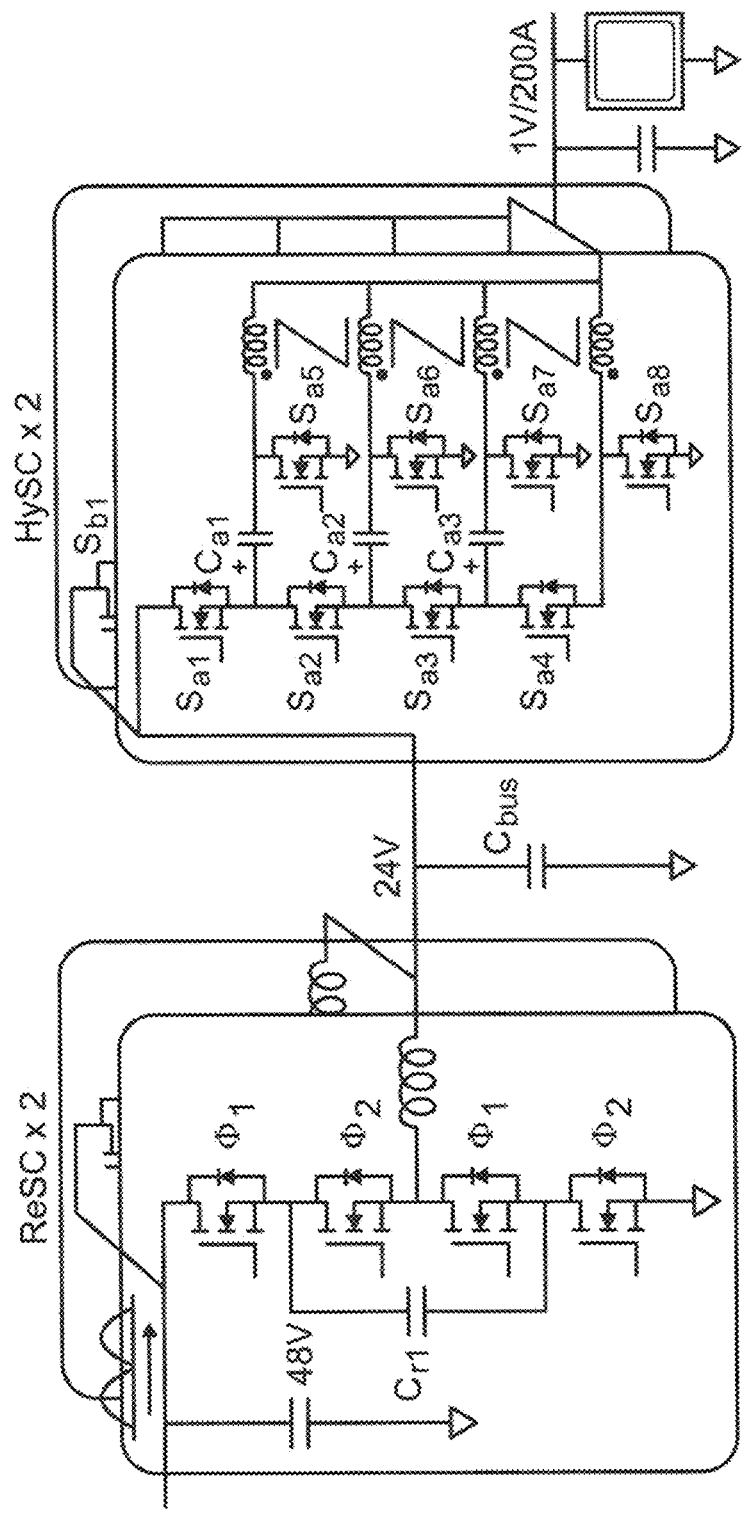
FIG. 17 depicts a schematic of a 48 V-1 V 200 A hybrid switched capacitor point-of-load converter with multiphase coupled inductor according to an embodiment of the present invention.
Figure 18:
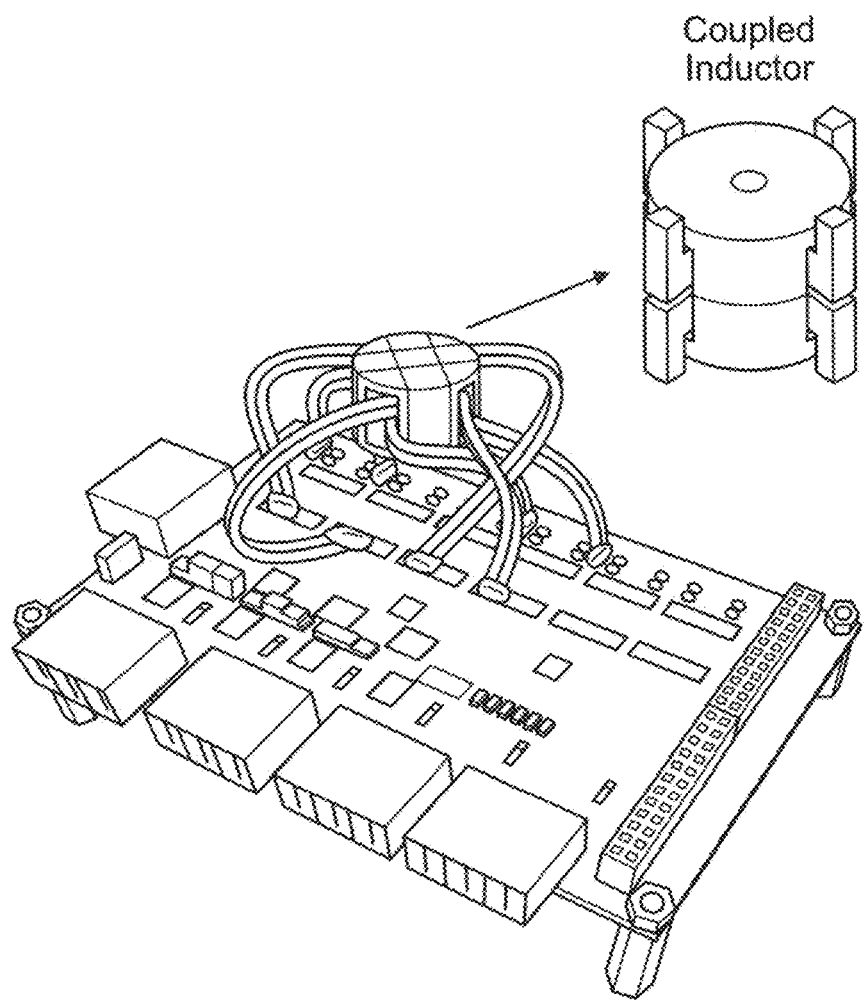
FIG. 18 depicts a prototype of the 48 V-1 V 200 A hybrid switched capacitor point-of-load converter with multiphase coupled inductor according to an embodiment of the present invention.

A few experimental prototypes have been built and tested to verify the invented vertical packaging technique and coupled inductor structure. FIG. 17 shows the schematic of a 48 V-1 V hybrid switched capacitor point-of-load converter with multiphase coupled inductor. The converter is rated for 200 W and will have 200 A of output current. FIG.

Figure 19:
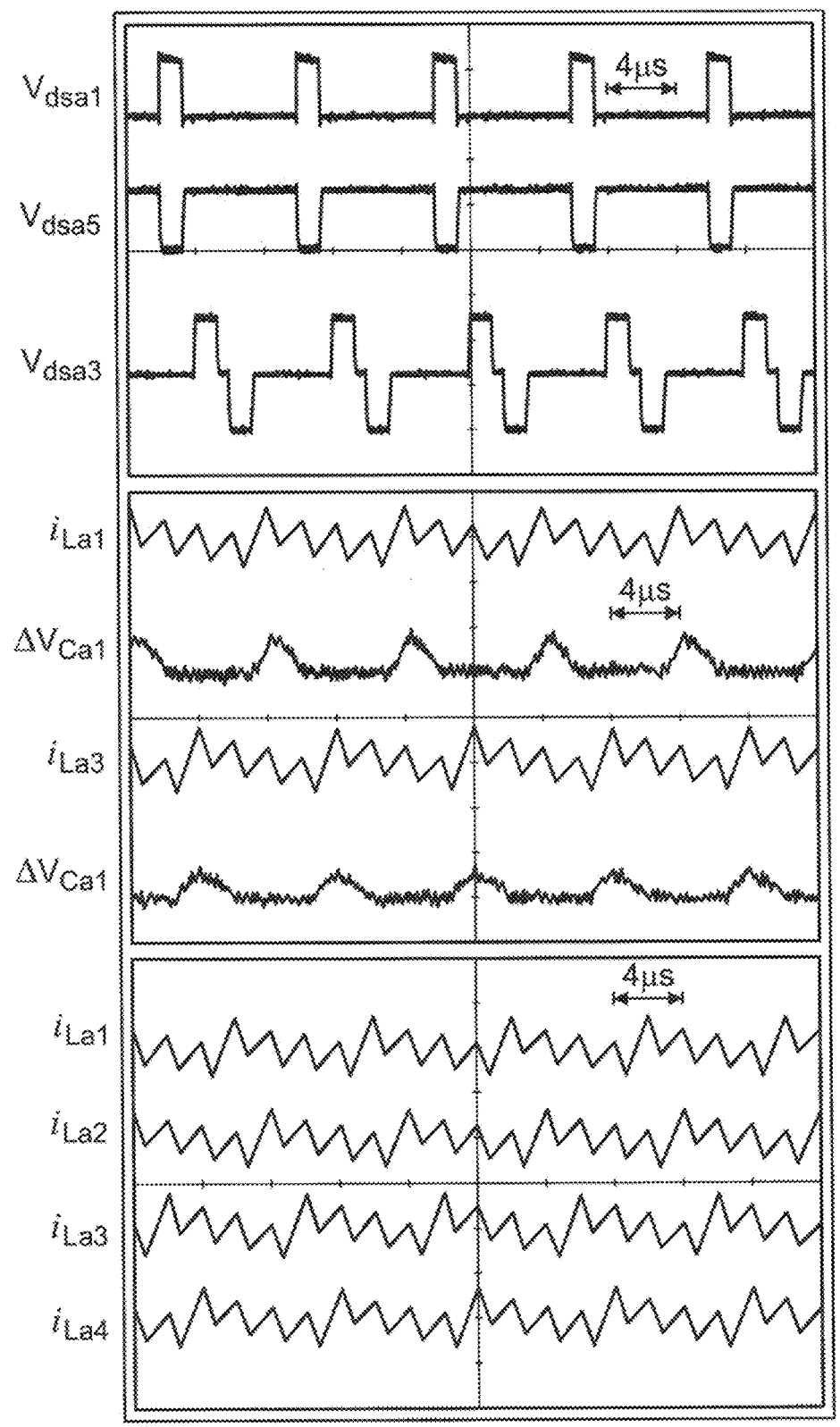
FIG. 19 depicts measured waveforms of the 48 V-1 V 200 A prototype according to an embodiment of the present invention.

18 shows a picture of the prototype. FIG. 19 shows the measured waveforms of the experimental prototype. The coupled inductor was implemented on a P18 N26 magnetic core with four evenly distributed 90 degree slots and a center rod. Four windings were wound around the four side rods.

Figure 20:
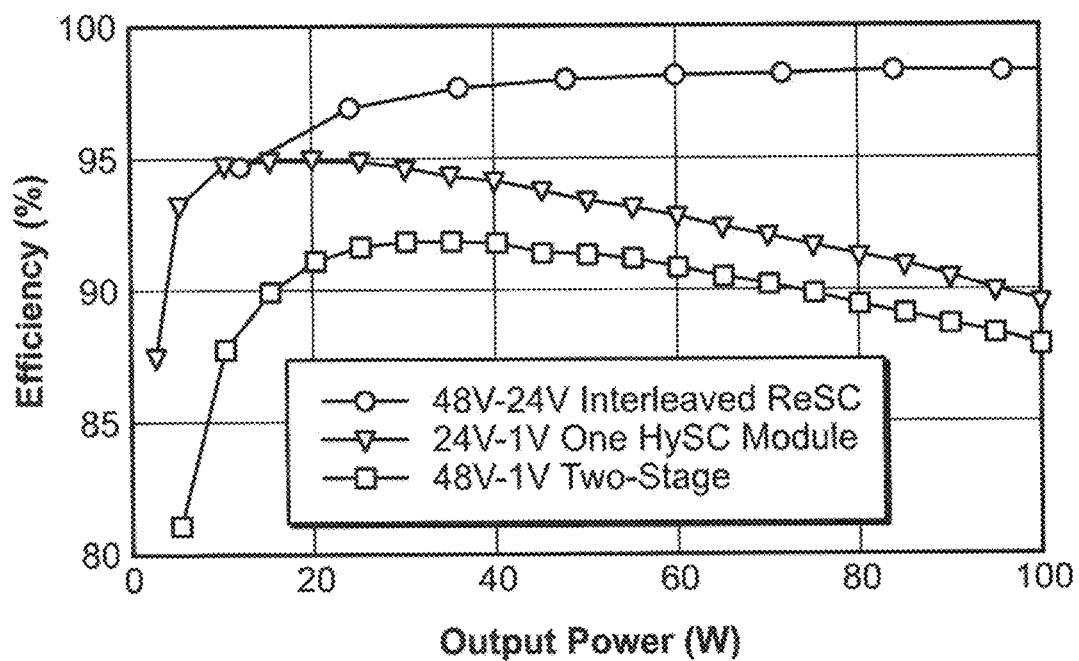
FIG. 20 depicts measured efficiency of the 48 V-1 V 200 A prototype according to an embodiment of the present invention.

FIG. 20 shows the measured efficiency of the prototype. The peak efficiency of the 48 V-24 V resonant switched capacitor stage is 98%, and the peak efficiency of the 24 V-1V hybrid switched capacitor stage is 95%.

FIGS. 21(a)-(b) show another embodiment of the coupled magnetics which is easier for practical manufacturing due to the square external shape and the cylinder internal cutout.

Figure 22:
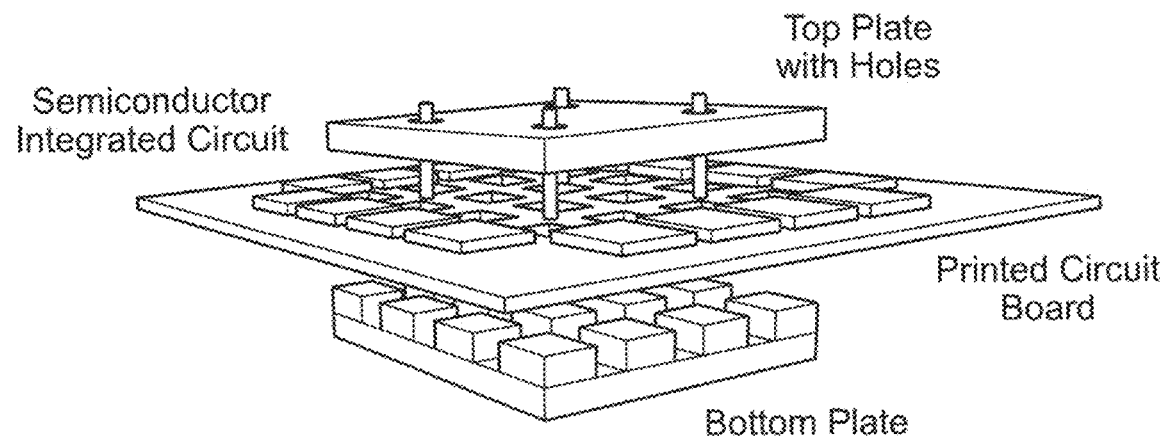
FIG. 22 depicts a sixteen phase vertical coupled magnetic structure according to an embodiment of the present invention.
Figure 23:
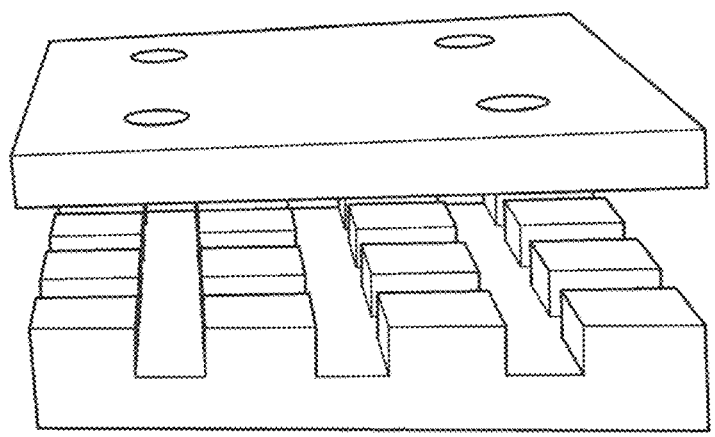
FIG. 23 depicts the bottom plate and top plate of the sixteen phase vertical coupled magnetic structure according to an embodiment of the present invention.

FIGS. 22-23 show a sixteen-phase coupled magnetic structure which comprises sixteen vertical rods, a top plate, and a bottom plate. Depending on the embodiment, there may be multiple holes in the top of bottom plate with wires going through it. In some embodiments, these are two wires carrying current in opposite directions.

Figure 24:
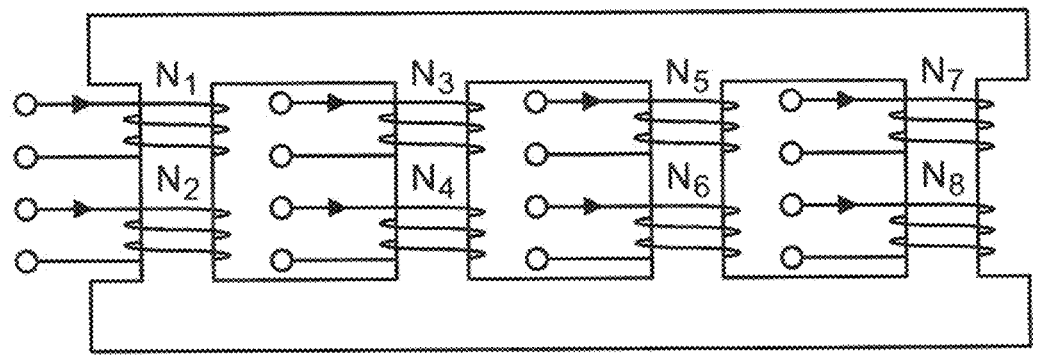
FIG. 24 depicts the vertical coupled inductor with multiple windings wound to each vertical rod according to an embodiment of the present invention.
Figure 25:
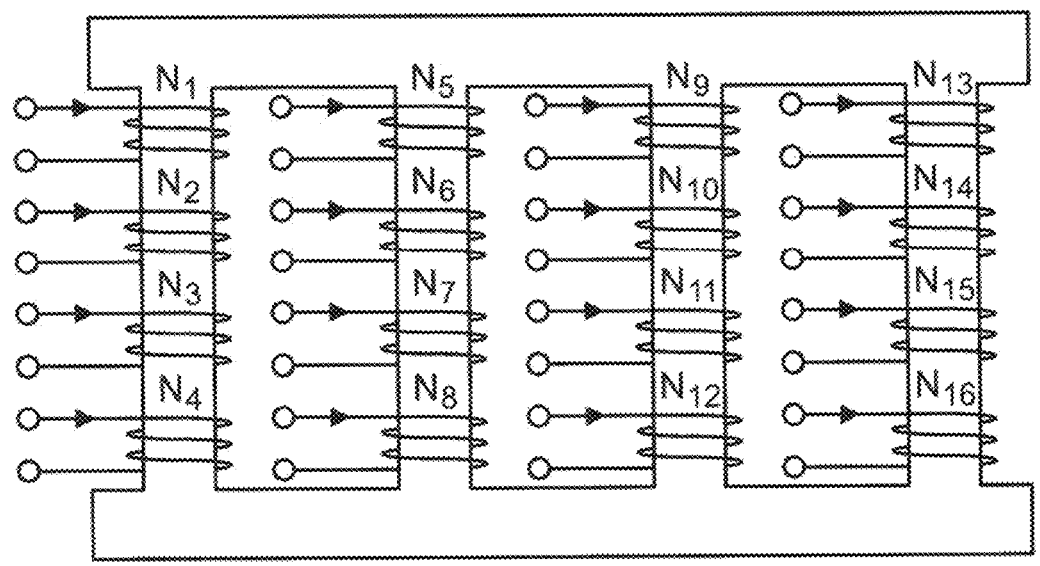
FIG. 25 depicts the vertical coupled inductor with multiple windings wound to each vertical rod according to an embodiment of the present invention.

FIGS. 24-25 show the vertical coupled inductor with multiple windings wound to each vertical rod, creating a mix of coupling relationships among windings. Some of the windings are coupled to the same rod, and many rods are terminated by the top and bottom plates.

Permeance Model for Programmable Multiphase Coupled Magnetics

A fundamental challenge of designing multiphase buck converters for Point-of-Load applications is to balance the steady state voltage ripple and transient response. A larger discrete inductance reduces steady state ripple at the cost of slower transient response. By using coupled inductors with cross-coupled switching, the current ripple can be reduced while maintaining fast transient performance. Moreover, magnetic core and output capacitor size can be reduced.

Traditionally, the coupled inductor in a multiphase buck converter is modeled based on the inductance matrix and a multiphase coupled transformer model. However, the inductance matrix methods often lead to long and unwieldy design equations. These equations and the multiphase coupled transformer models cannot provide a straightforward link between magnetic structure and circuit design, limiting their practical design insights.

As such, disclosed herein are embodiments for a permeance model for multiphase coupled inductors as a topological dual of a traditional transformer model. The permeance model clearly links the coupled inductor geometry to the lumped circuit model, providing simple equations for effective inductance and current ripple that inform magnetic design. The permeance model is suitable for visualization of sophisticated coupling relationships and core loss modelling in SPICE.

Figure 26A:
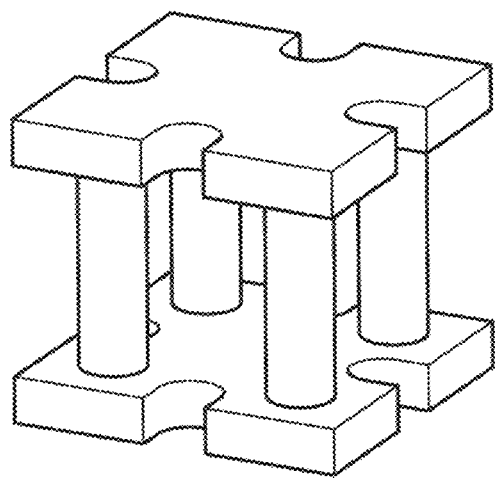
FIG. 26(a) depicts a coupled inductor with many coupled windings and a center rod providing a return path for magnetic flux according to an embodiment of the present invention.
Figure 26B:
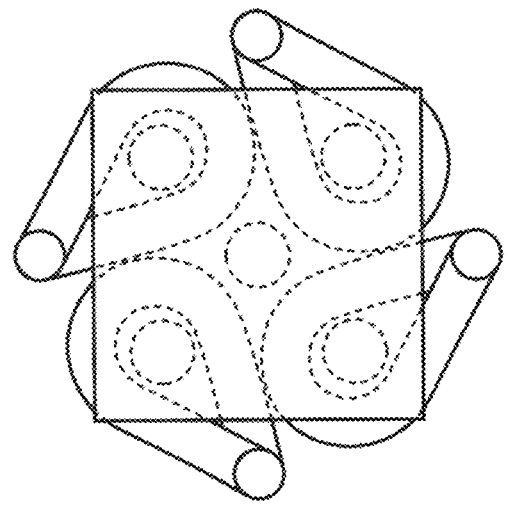
FIG. 26(b) depicts the coupled inductor with many coupled windings and a center rod providing a return path for magnetic flux according to an embodiment of the present invention.
Figure 27A:
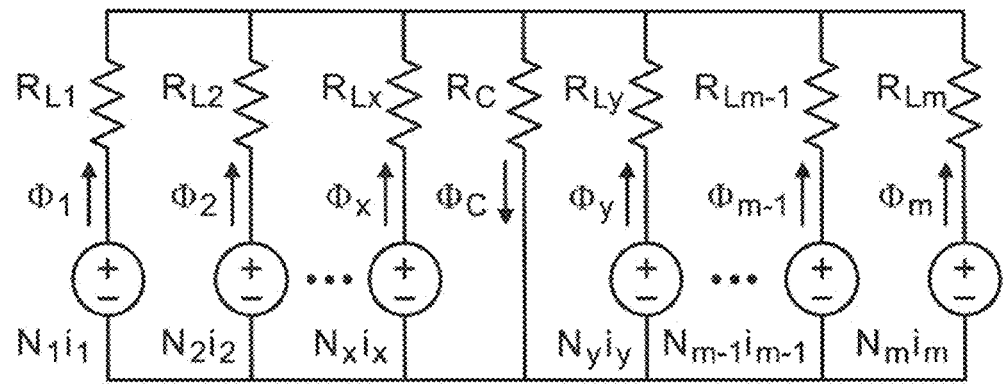
FIG. 27(a) depicts a reluctance model of a multiphase coupled inductor with M windings according to an embodiment of the present invention.
Figure 27B:
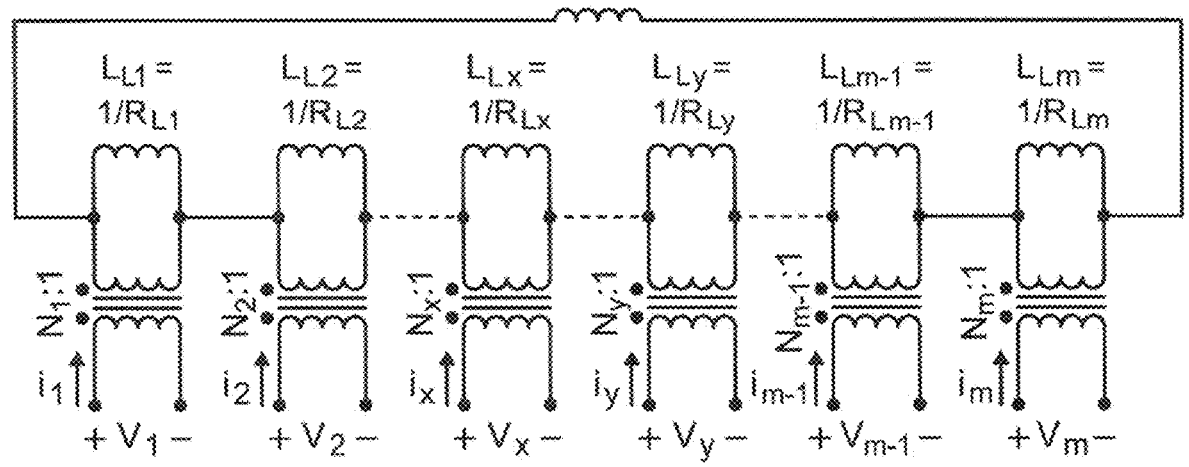
FIG. 27(b) depicts a permeance model of a multiphase coupled inductor with M windings according to an embodiment of the present invention.

FIGS. 26(a)-(b) show a picture of a multiphase coupled inductor with M windings, each with N turns. Each winding is coupled to one leg of the core, and the center rod with reluctance $R_C$ provides a return path for flux. $R_C$ can be adjusted to modify the coupling coefficient between windings and optimize the converter performance. FIG. 27(a) shows the reluctance model of the magnetic core structure and FIG. 27(b) shows the permeance model. The reluctance model and the permeance model are identical topological duals. To simplify the analysis and derivation, it is assumed that all windings have identical number of turns N, and all legs have identical reluctance $R_L$, though this is not intended to be limiting. The reluctance and permeance models can be extended to describe asymmetric coupled inductor geometry and arbitrary N.

The permeance model is a lumped circuit model with inductors and ideal transformers that can be directly used in SPICE simulations. As the topological dual of the reluctance model, the current described in the permeance model is analogous to magnetic flux. Therefore, the flux and voltage across each winding can be simply extracted and used in existing SPICE-based core loss models, which commonly use Steinmetz's equation or its extensions. The unique permeance model structure permits rapid visualization of coupled inductor performance in SPICE.

The permeance model in FIG. 27(b) can be used to derive a reluctance matrix, $R_{M \times M}$, which describes the relationship between the derivative of the current in the M windings and the voltage drop across the M windings:

$$\begin{bmatrix} \frac{di_1}{dt} \\ \frac{di_2}{dt} \\ \dots \\ \frac{di_M}{dt} \end{bmatrix} = \frac{1}{N^2} \begin{bmatrix} R_L + R_C & R_C & \dots & R_C \\ R_C & R_L + R_C & \dots & R_C \\ \dots & \dots & \dots & \dots \\ R_C & \dots & R_C & R_L + R_C \end{bmatrix} \begin{bmatrix} v_1 \\ v_2 \\ \dots \\ v_M \end{bmatrix}. \quad (1)$$

Figure 28A:
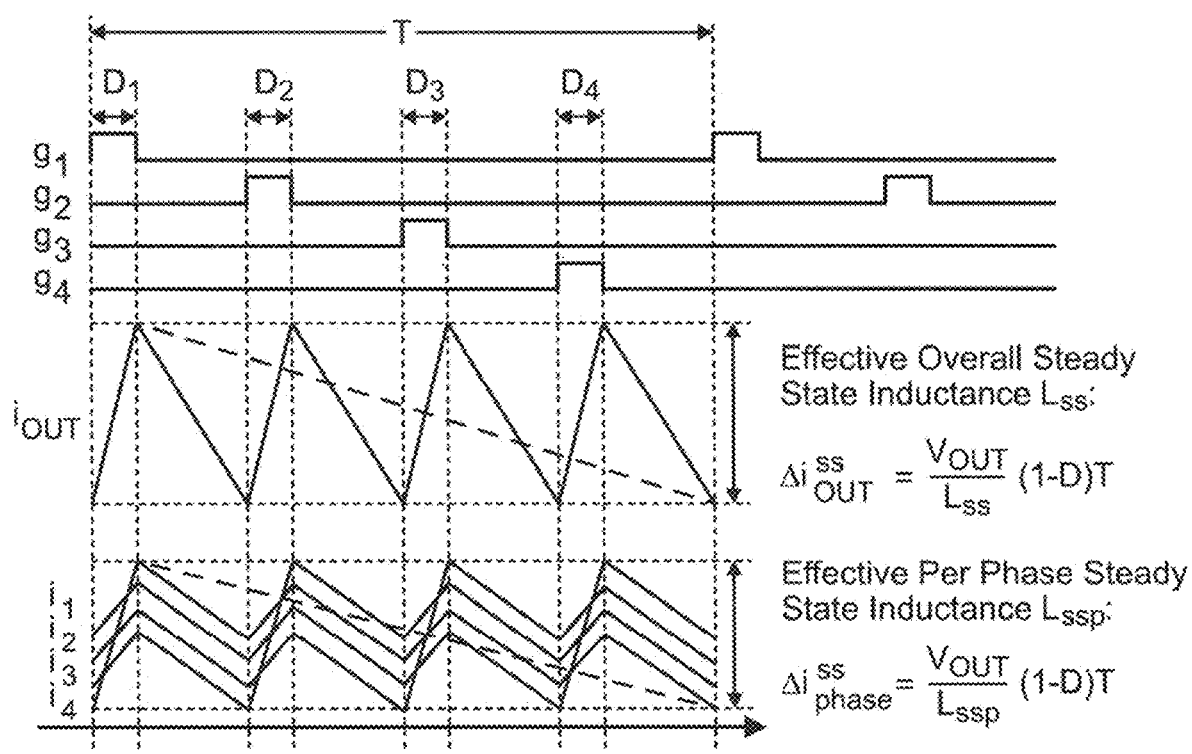
FIG. 28(a) depicts waveforms of an i=0, M=4 phase coupled inductor buck converter showing overall and per-phase effective steady state inductance according to an embodiment of the present invention.
Figure 28B:
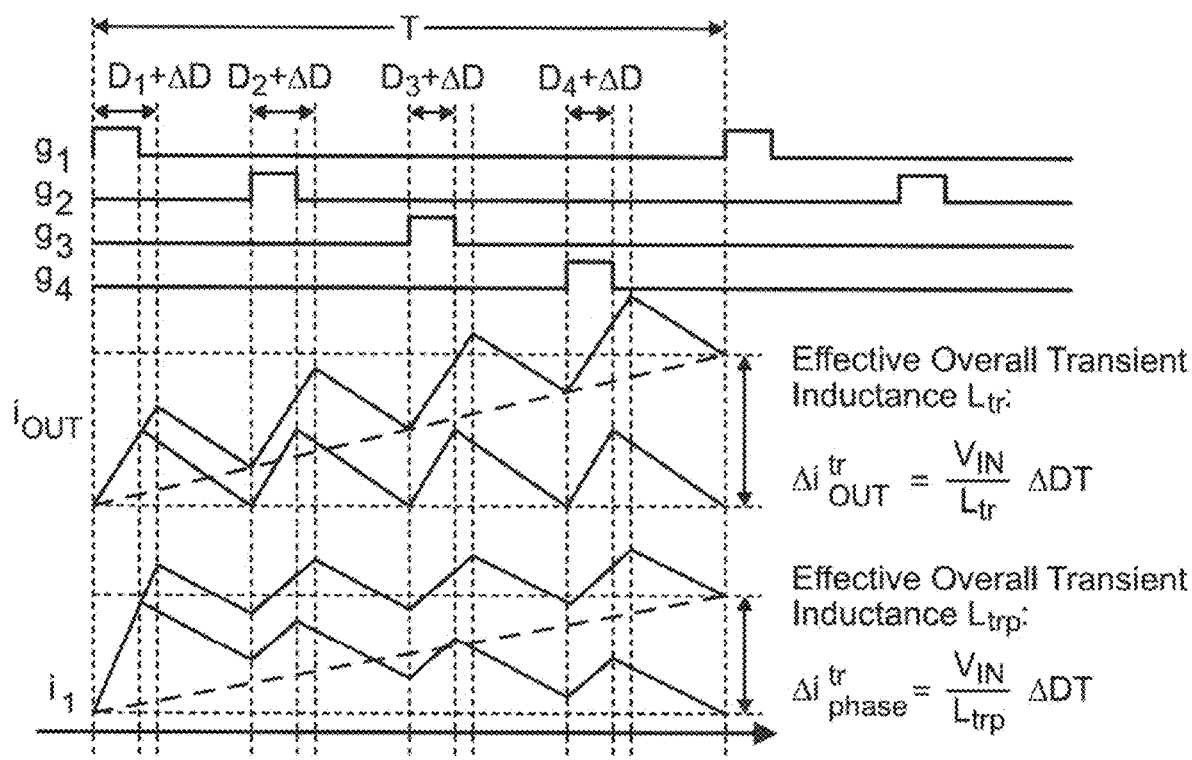
FIG. 28(b) depicts waveforms of an i=0, M=4 phase coupled inductor buck converter showing overall and per-phase effective transient inductance according to an embodiment of the present invention.
Figure 29A:
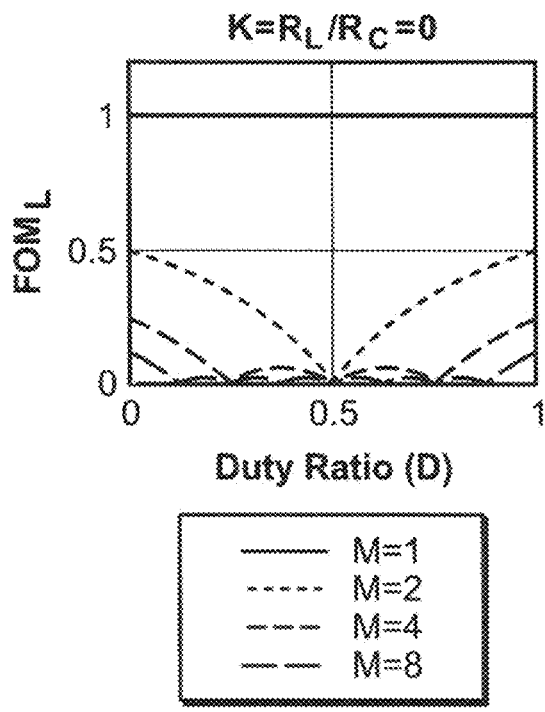
FIG. 29(a) depicts merits (FOM) of the multiphase coupled inductor as function of the number of phases (M), duty ratio (D), and reluctance ratio ($k=R_L/R_C$) according to an embodiment of the present invention.
Figure 29B:
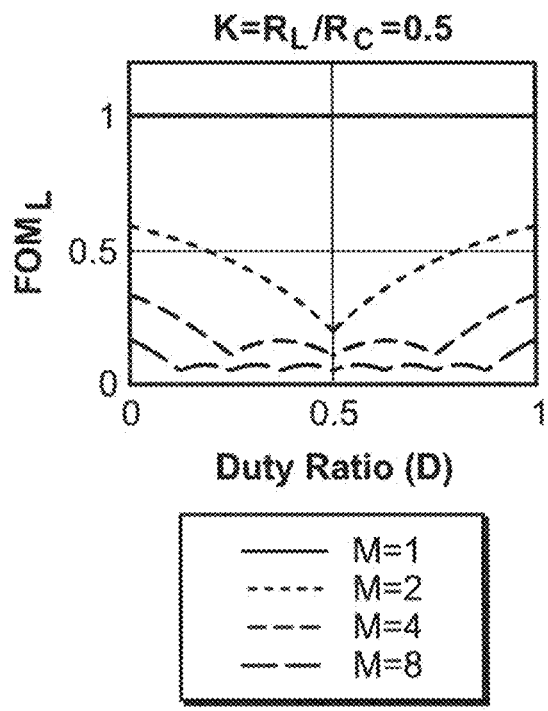
FIG. 29(b) depicts merits (FOM) of the multiphase coupled inductor as function of the number of phases (M), duty ratio (D), and reluctance ratio ($k=R_L/R_C$) according to an embodiment of the present invention.
Figure 29C:
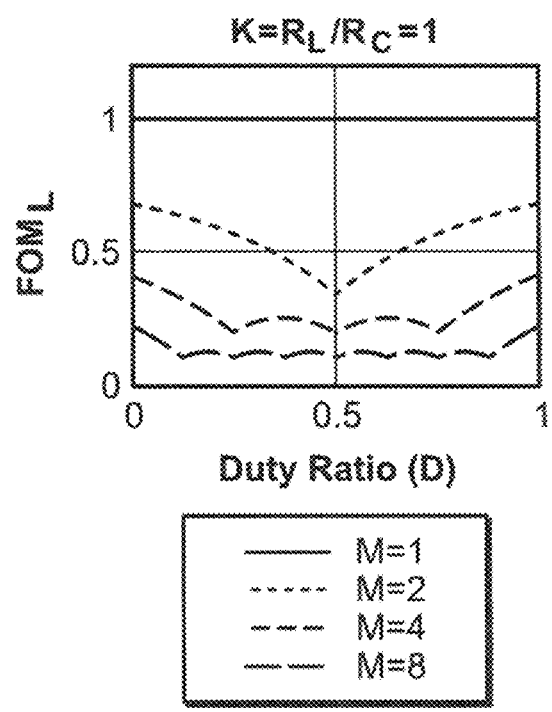
FIG. 29(c) depicts merits (FOM) of the multiphase coupled inductor as function of the number of phases (M), duty ratio (D), and reluctance ratio ($k=R_L/R_C$) according to an embodiment of the present invention.
Figure 29D:
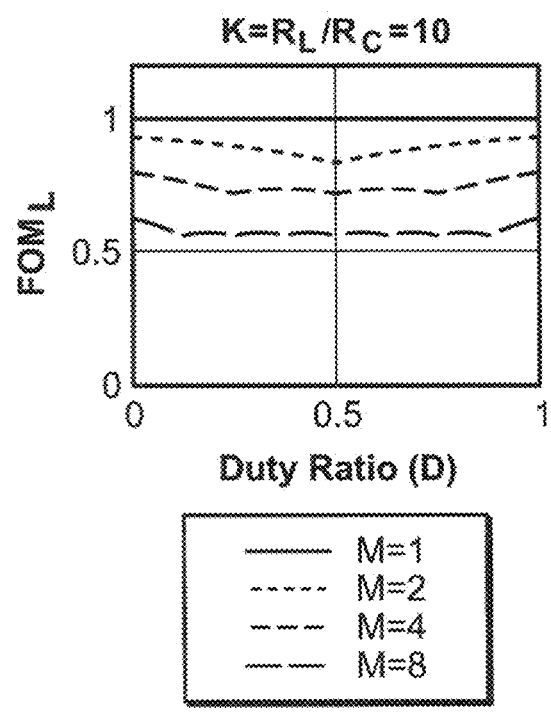
FIG. 29(d) depicts merits (FOM) of the multiphase coupled inductor as function of the number of phases (M), duty ratio (D), and reluctance ratio ($k=R_L/R_C$) according to an embodiment of the present invention.

Traditional methods for modeling coupled inductors usually use an inductance matrix parameterized by the self inductance $L_S$ and mutual inductance $L_M$. According to FIGS. 28(a) and (b), $L_S$ and $L_M$ are functions of $R_L$ and $R_C$:

$$L_S = \frac{N^2}{R_L + \frac{R_L}{M-1} \| R_C} = \frac{N^2(R_L + (M-1)R_C)}{R_L(R_L + MR_C)}, \quad (2)$$

$$L_M = \frac{-N^2\left(\frac{R_L}{M-2} \| R_C\right)}{\left(R_L + \frac{R_L}{M-1} \| R_C\right)\left(\frac{R_L}{M-2} \| R_C\right)} = \frac{-N^2 R_C}{R_L^2 + MR_L R_C}. \quad (3)$$

The permeance model is interchangeable with $R_{M \times M}$, $L_S$, and $L_M$. The voltage across the inductors in the permeance model is linearly related to the magnetic flux in each section of the core. By adding a resistance in parallel with each inductor in the permeance model, the core loss can be captured in SPICE simulations.

Traditionally, $R_{M \times M}$, $L_S$, and $L_M$ are used to derive sophisticated equations to balance the steady state and transient performance of multiphase coupled inductor buck converters. Similarly, the permeance model is used to derive a simplified set of functionally identical expressions that provide additional design insights.

Effective Overall Steady State Inductance:

Consider an M phase coupled inductor buck converter with input voltage $V_{IN}$ and output voltage $V_{OUT}$. The duty cycle is between $$\frac{i}{M} < D < \frac{i+1}{M}$$

where i is the number of additional phases simultaneously driven with the main phase. The overall output current is the summation of all phase currents and ramps up during the period i/M T<t<DT. During this time, i+1 inductors are driven with $V_{IN}-V_{OUT}$ and M−i−1 inductors see $-V_{OUT}$. From Equation (1), the increase in current of each phase can be summed to find the overall output current change during the ramp up period. In steady state operation, the change in the ramp down period is equal with opposite sign:

$$\Delta i_{OUT}^{up} = \frac{(R_L + MR_C)(i+1-DM)(DM-i)}{DMN^2}V_{OUT}T = -\Delta i_{OUT}^{down}. \quad (4)$$

Note the steady state output current ripple, $$\Delta i_{OUT}^{ss} = \Delta i_{OUT}^{up} = -\Delta i_{OUT}^{down} = \frac{V_{OUT}}{L_{ss}}(1-D)T.$$

The effective overall steady state inductance $L_{ss}$ of a M phase coupled buck converter with $$\frac{i}{M} < D < \frac{i+1}{M}$$

$$L_{ss} = \frac{(1-D)DMN^2}{(R_L + MR_C)(i+1-DM)(DM-i)}. \quad (5)$$

Effective Per-Phase Steady State Inductance:
Each phase is driven by $V_{IN}-V_{OUT}$ during $0<t<DT$. During this time, there are $i+1$ subperiods where $i+1$ phases are driven by $V_{IN}-V_{OUT}$. The per-phase current increase over these subperiods, derived from equation (1), is:

$$\Delta i_{phase}^A = \quad (6)$$
$$\left((R_L + R_C + iR_C)\frac{1-D}{D} - (M-i-1)R_C \times \left(D - \frac{i}{M}\right)\right)\frac{(i+1)TV_{OUT}}{N^2}.$$

During the remaining i subperiods, i phases are driven by $V_{IN}-V_{OUT}$ and the other $M-1$ phases are driven by $-V_{OUT}$. The per-phase current change during these subperiods, derived from equation (1), is:

$$\Delta i_{phase}^B = \quad (7)$$
$$\left((R_L + R_C + (i-1)R_C)\frac{1-D}{D} - (M-i)R_C \times \left(\frac{i+1}{M} - D\right)\right)\frac{iTV_{OUT}}{N^2}.$$

The total per-phase current change during $0<t<DT$ for a given phase is the summation of equations (6) and (7). If the effective steady state per-phase inductance $L_{ssp}$ is defined as $$\Delta i_{phase}^{ss} = \frac{V_{OUT}}{L_{ssp}}(1-D)T : L_{ssp} = \quad (8)$$

$$\frac{V_{OUT}(1-D)T}{\Delta i_{phase}^A + \Delta i_{phase}^B} = \frac{N^2(1-D)}{-\frac{i^2 R_C}{DM} - \frac{iR_C}{DM} + 2iR_C - DMR_C + R_C - DR_L + R_L}.$$

Effective Overall Transient Inductance:
The transient inductance determines the response of $i_{OUT}$ to a perturbation $\Delta D$. This is defined as $$L_{tr} = \frac{V_{IN}\Delta DT}{\Delta i_{OUT}^{tr}},$$

the effective inductance seen by the input $V_{IN}$ during $\Delta DT$. If all M phases are driven for $(D+\Delta D)T$, $i_{OUT}$ will ramp up for $M\Delta DT$ longer and ramp down for $M\Delta DT$ shorter. From equation (1), the change in current can be found as $$\Delta i_{OUT}^{tr} = M\Delta DT \times \left(\frac{di_{OUT}^{up}}{dt} - \frac{di_{OUT}^{down}}{dt}\right) = M\Delta DT\frac{(R_L + MR_C)}{N^2}V_{IN}.$$

The effective overall transient inductance $L_{tr}$ is not dependent on duty cycle, implying the transient behavior and control are independent of conversion ratio:

$$L_{tr} = \frac{N^2}{M(R_L + MR_C)}. \quad (9)$$

Effective Per-Phase Transient Inductance:
The per-phase transient inductance $L_{trp}$ (also independent of duty cycle) is M times larger than equation (9):

$$L_{trp} = \frac{N^2}{R_L + MR_C}. \quad (10)$$

Figure of Merits for Rapid Configuration Optimization:
$L_{ss}$, $L_{tr}$, $L_{ssp}$, and $L_{trp}$ can be used to define figures of merit (FOM) as configuration guidelines for multiphase coupled inductors. One goal is to maximize steady state inductance for a given transient inductance, which leads to smaller output ripple for a given transient speed. An example $FOM_L$ is defined as the ratio of per-phase inductances:

$$FOM_L = \frac{L_{trp}}{L_{ssp}} = \frac{-\frac{i^2 R_C}{DM} - \frac{iR_C}{DM} + 2iR_C - DMR_C + R_C - DR_L + R_L}{(1-D)(R_L + MR_C)} = \quad (11)$$

$$\frac{-\frac{i^2}{DM} - \frac{i}{DM} + 2i - DM + 1 + k + Dk}{(1-D)(k+M)}.$$

The coupling ratio is defined as $$k = \frac{R_L}{R_C}$$

where higher k indicates weaker coupling. A lower $FOM_L$ is desirable as it indicates smaller transient inductance and faster response. FIGS. 29(a)-(d) plot $FOM_L$ with a range of D, M, and k.

Figure 30:
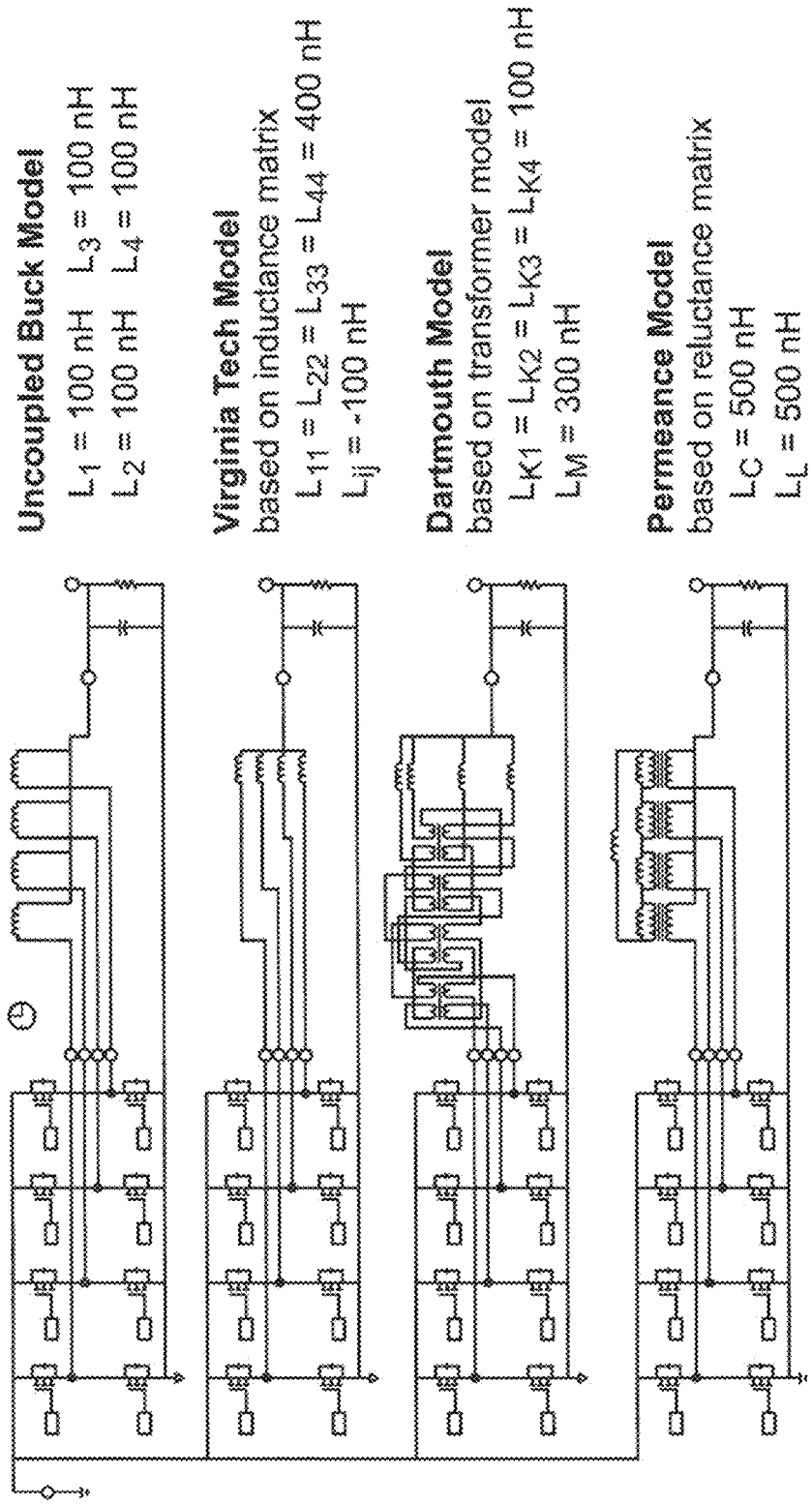
FIG. 30 depicts a SPICE schematic of M=4 phase converters with $R_C=R_L=2,000,000$ Ampere-turn/Weber according to an embodiment of the present invention.

The permeance model is tested in SPICE with a four phase coupled inductor buck converter with $R_L=R_L=2,000,000$ Ampere-turn/Weber. FIG. 30 compares an uncoupled buck model and models developed by Virginia Tech (VT), Dartmouth College (DM), and the permeance model. The latter three circuit models have identical modeling results. The uncoupled buck model has the same transient behavior, but suffers larger ripple and higher loss.

Figure 31:
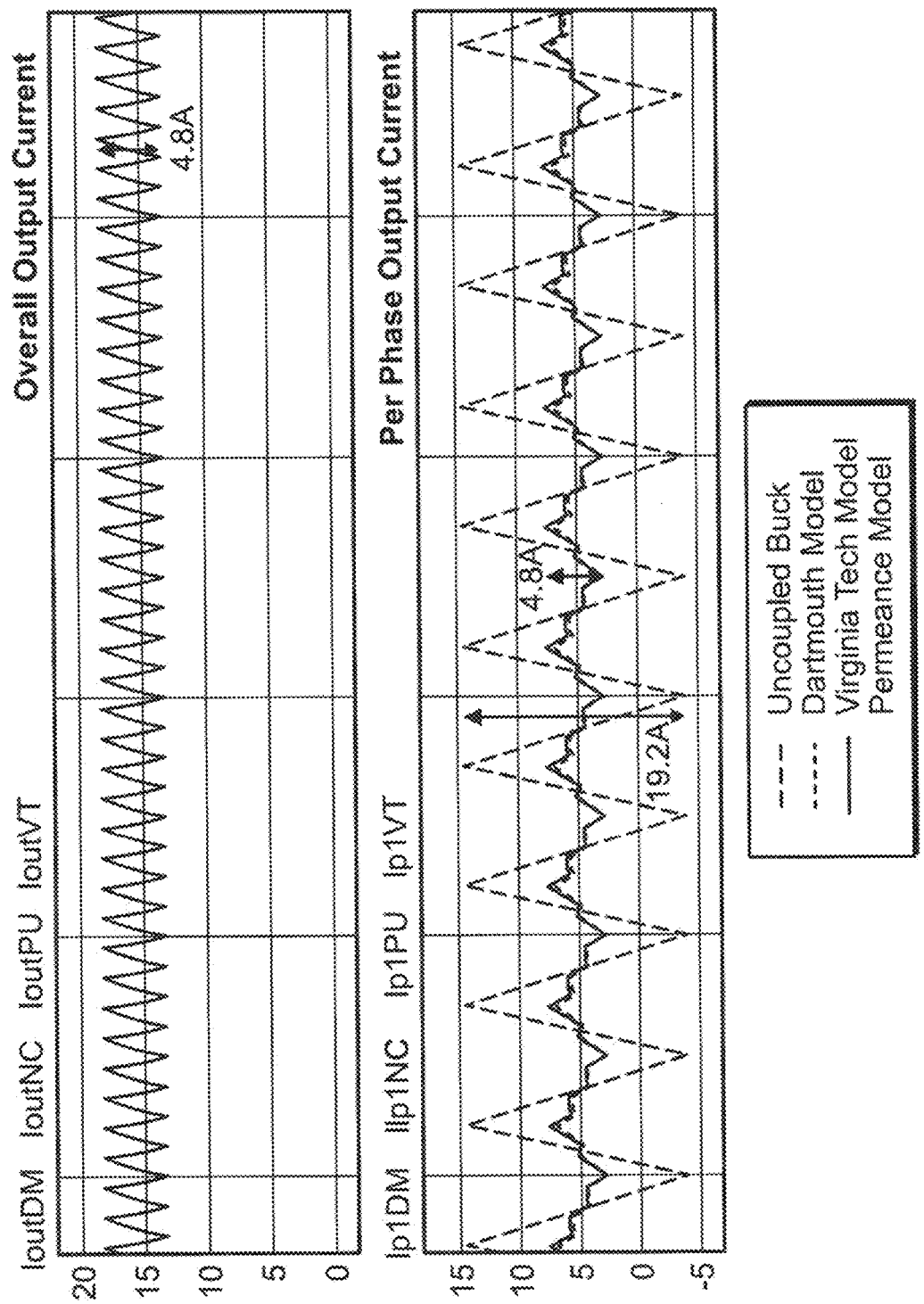
FIG. 31 depicts a model showing VT, DM, and permeance models simulate the same in SPICE according to an embodiment of the present invention.

FIG. 31 shows the simulated waveforms in SPICE. As expected, the three coupled inductor models predict identical steady state and transient performance. The current ripple per-phase for the uncoupled design is 19.2 A, M=4 times higher, to achieve the same transient performance.

Interleaving and multiphase coupling maintains the same transient inductance while reducing the steady state per-phase current ripple from 19.2 A to 4.8 A.

Figure 32A:
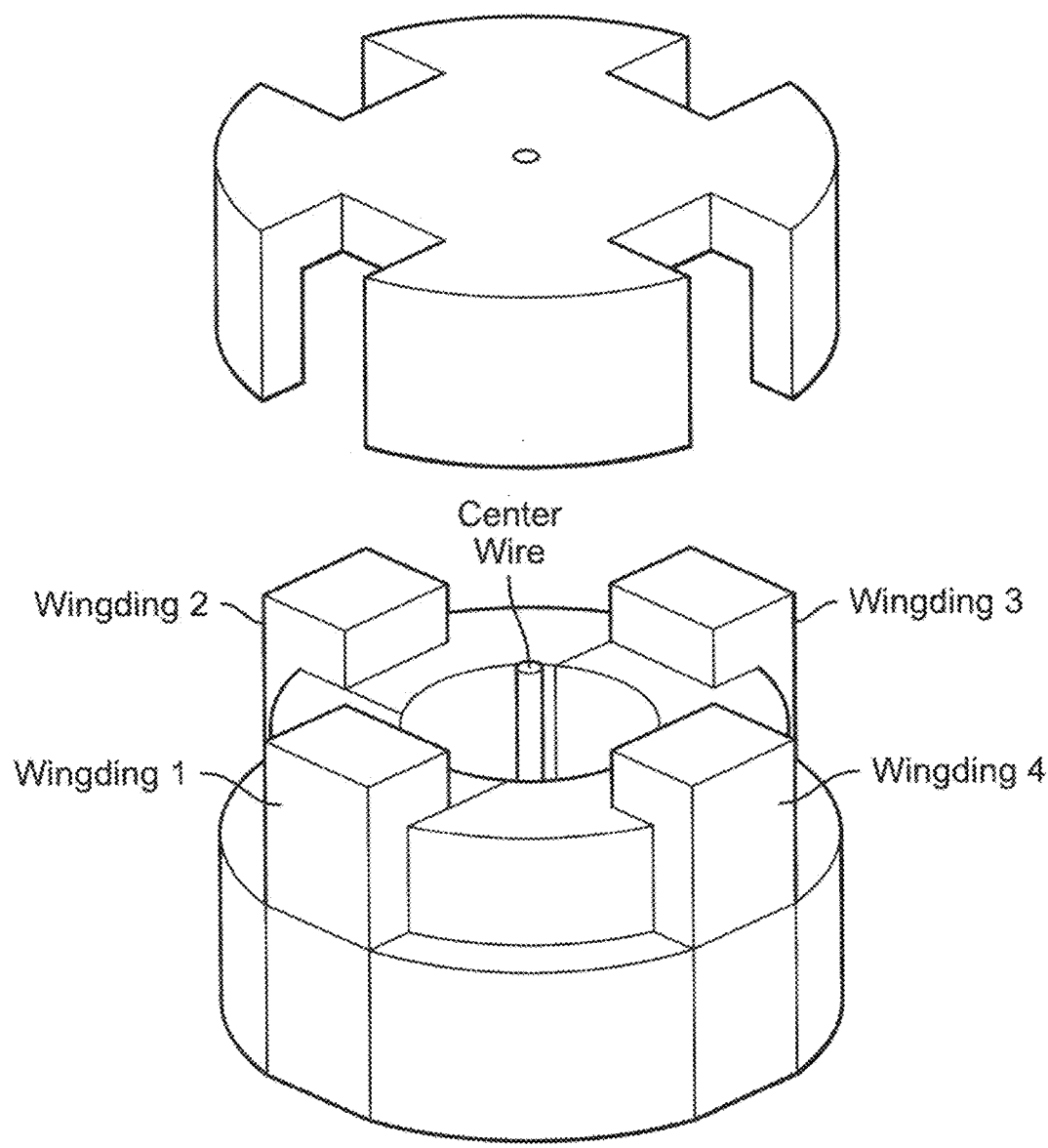
FIG. 32(a) depicts an ANSYS Maxwell model showing two halves of magnetic core, four windings, and auxiliary winding according to an embodiment of the present invention.

The permeance model is applied to a multiphase inductor with programmable coupling coefficient to demonstrate the strength of the permeance model. Consider a typical four phase coupled inductor buck converter (FIG. 32(a)) where response time is reduced during transient events and current ripple is lowered during steady state operation.

Figure 32B:
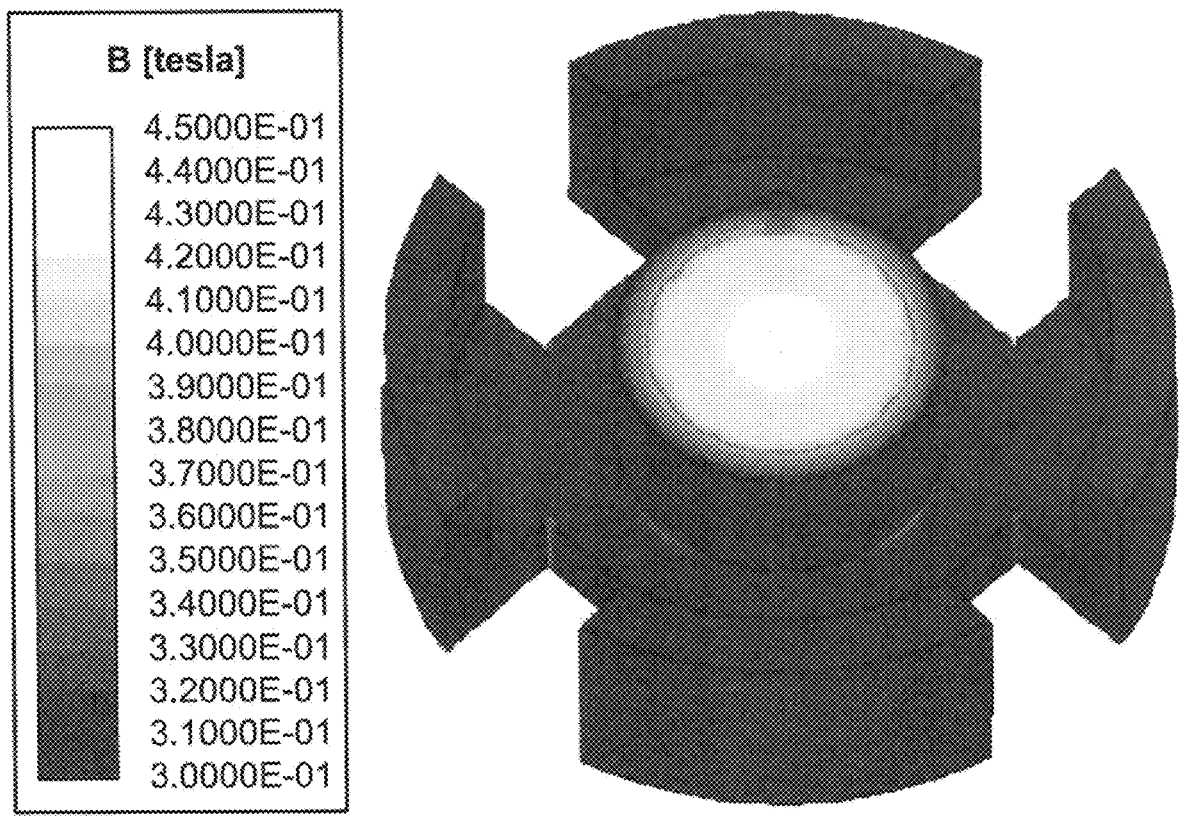
FIG. 32(b) depicts partial center rod saturation with 2.78 A auxiliary current according to an embodiment of the present invention.

From equations (8) and (10), it is clear that $L_{ssp}$ can be increased by reducing center rod reluctance $R_C$ (lowering ripple), and $L_{trp}$ can be decreased by increasing $R_C$ (lowering response time). A possible structure to implement this includes conductor passing a DC current through the center rod, saturating part of it and increasing the reluctance (FIG. 32(b)). Given the saturation flux $B_{sat}$, the center rod radius $R_{rod}$, and the ratio of unsaturated reluctance $R_C$ and saturated reluctance $R_C'$, the required auxiliary current $I_{aux}$ is:

$$I_{aux} = \frac{\sqrt{1 - \frac{R_C}{R_C'}} 2\pi B_{sat} R_{rod}}{\mu}. \tag{12}$$

Figure 32C:
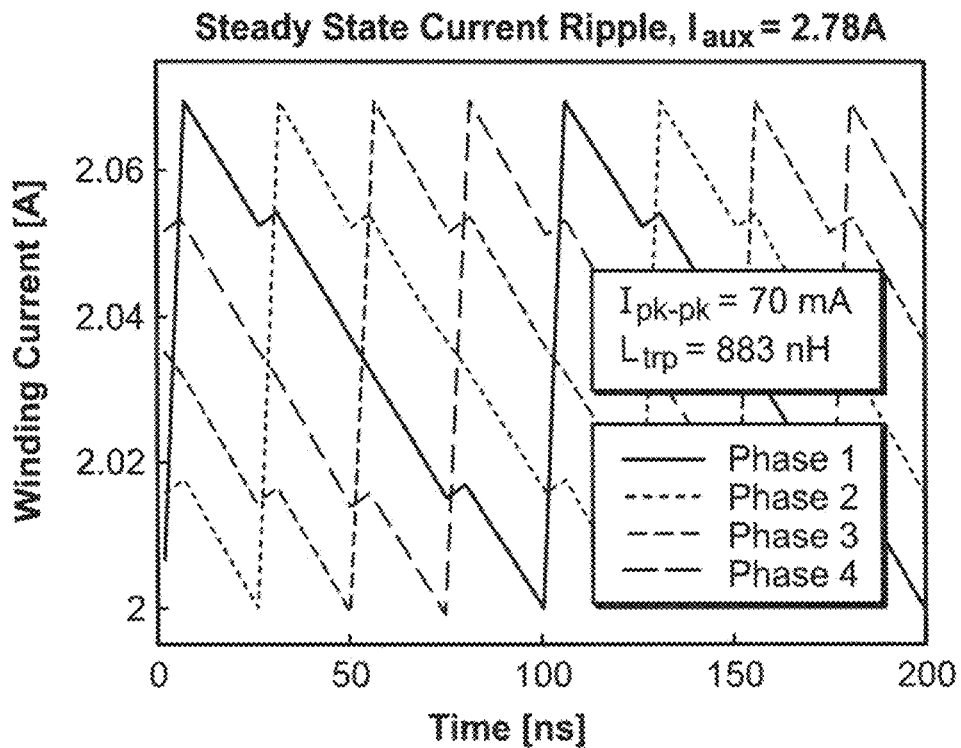
FIG. 32(c) depicts 70 mA current ripple with $I_{aux}$ on (transient response mode) according to an embodiment of the present invention.
Figure 32D:
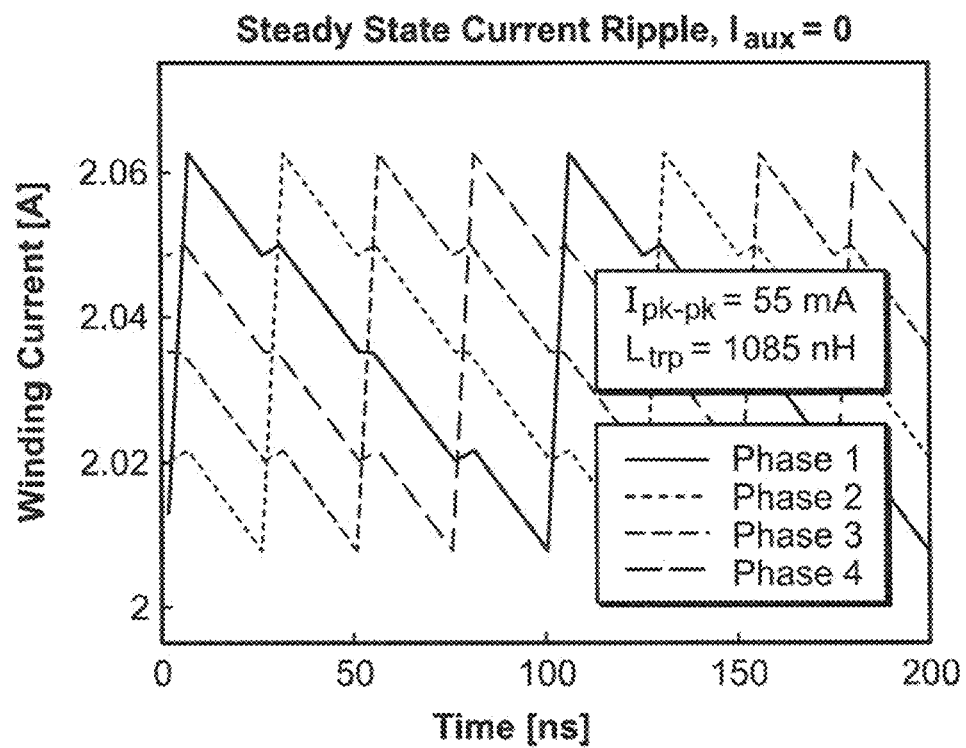
FIG. 32(d) depicts 55 mA current ripple with $I_{aux}$ off (steady state mode) according to an embodiment of the present invention.

For the example Ferroxcube 3F46 P14 core ANSYS simulation shown in FIGS. 32(c)-(d), Equation (12) yields an auxiliary current of 2.78 A needed to saturate half the core and double $R_C$. Activating the auxiliary current reduces the per-phase inductance from 1085 nH to 883 nH. Deactivating the auxiliary current reduces ripple by 21% from 70 mA to 55 mA. The auxiliary current can be activated when transients are expected, e.g. high processor activity, and deactivated normally to reduce ripple. The permeance model is suitable for intuitively translating design goals to magnetic structures.

High Performance Two-Stage Hybrid Switched-Capacitor Converter with Coupled inductor for 48V-1V Point-of-Load Application High performance microprocessors include billions of transistors, switch at a few GHz, and each consumes hundreds of ampere of current at very low voltage (i.e., <1V). High efficiency, high power density and high bandwidth point-of-load converters are needed to support future CPUs and GPUs. Delivering power at 48V can reduce the loss and leverage the existing 48V telecom power ecosystem. Various 48V-PoL topologies have been explored. Among these the two-stage intermediate bus architecture (IBA) is widely adopted due to its balanced performance in efficiency, density, and speed. In a two-stage IBA design, the front-end stage is usually implemented as a 48V to 12V isolated dc-dc converter without regulation, or switched-capacitor circuits. The second stage is usually implemented as a multi-phase buck converter.

Disclosed herein are embodiments for a two-stage hybrid switched-capacitor (SC) converter for high current 48V-PoL applications with 24V intermediate bus voltage. The first stage is a 2:1 resonant switched-capacitor (ReSC) converter performing 48V-24V conversion with very high power density and efficiency (over 99%). The second stage is a hybrid switched-capacitor (HySC) converter with coupled inductors which performs 24V-1V conversion and fast load voltage regulation. Compared to a transformer based first stage, the 48V-24V ReSC implementation eliminates the transformer and offers greatly reduced device stress. Compared to a multiphase buck second stage, the HySC converter offers reduced device rating and extended duty ratio. It adopts coupled inductor for high power density and soft-charging of the switched capacitors. Disclosed herein is the circuit topology and operation principles of the 48V-1V two-stage hybrid switched-capacitor converter. The 48V-1V/100A prototype has achieved a peak efficiency of 91.8% at 25A and a full load efficiency of 87.9% at 100A.

Figure 33:
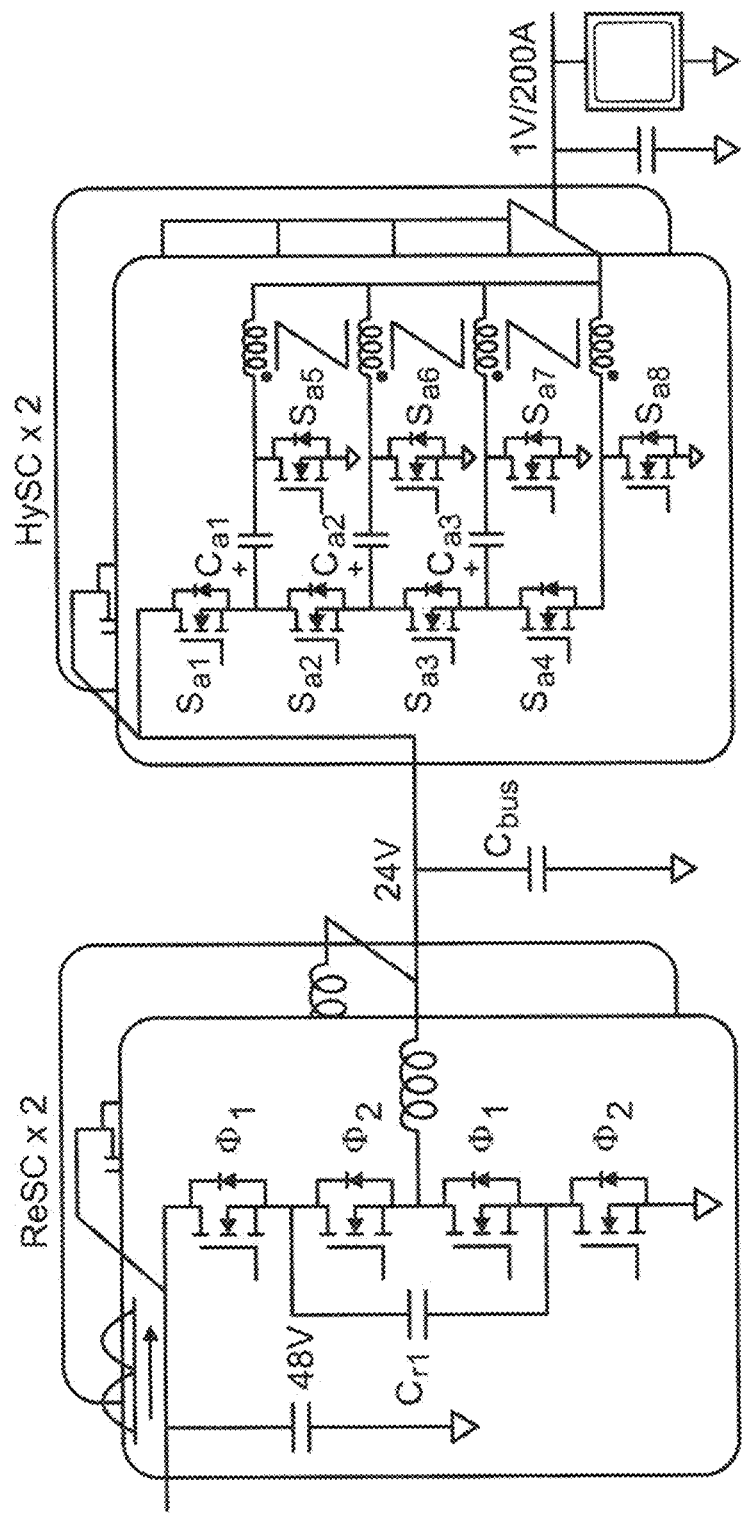
FIG. 33 depicts a 48V-1V two-stage hybrid-SC topology according to an embodiment of the present invention.

FIG. 33 shows the 48V-1V two-stage hybrid-SC topology. The first stage includes two interleaved ReSC converters for 48V-24V conversion. They are controlled by a pair of complementary gate drive signals with 50% duty ratio each ($\Phi_1$ and $\Phi_2$). The resonant operation enables high utilization of magnetics as well as soft-switching opportunities. Furthermore, the interleaved operation of two ReSC modules guarantees continuous input current and minimizes the input capacitor size. This 2:1 resonant switched capacitor converter is not regulated. It operates at a fixed frequency and can achieve very high efficiency and power density.

The second stage includes two parallel connected HySC converters with multiphase coupled inductors. The series-input parallel-output configuration of the HySC converter decouples the voltage stress from the input side and current stress from the output side. The 24V input voltage is equally distributed among the four levels. Four series-stacked switches and their complementary switches are controlled in a similar way as a multiphase buck converter with interleaving. The common mode voltage is blocked by three series capacitors and their dc voltages are 18V, 12V, 6V from top to bottom, respectively. The voltage rating of the switches in the ReSC stage is 24V, and the voltage rating of the switches in the HySC stage is 12V. The disclosed two-stage HySC architecture can be linearly extended to interface with higher input voltage and larger output current. Multilevel resonant switched-capacitor circuit can extend the voltage conversion ratio of the front stage. The size of the input capacitor, intermediate capacitor, and the output capacitor can be reduced with multiphase interleaving.

Figure 34A:
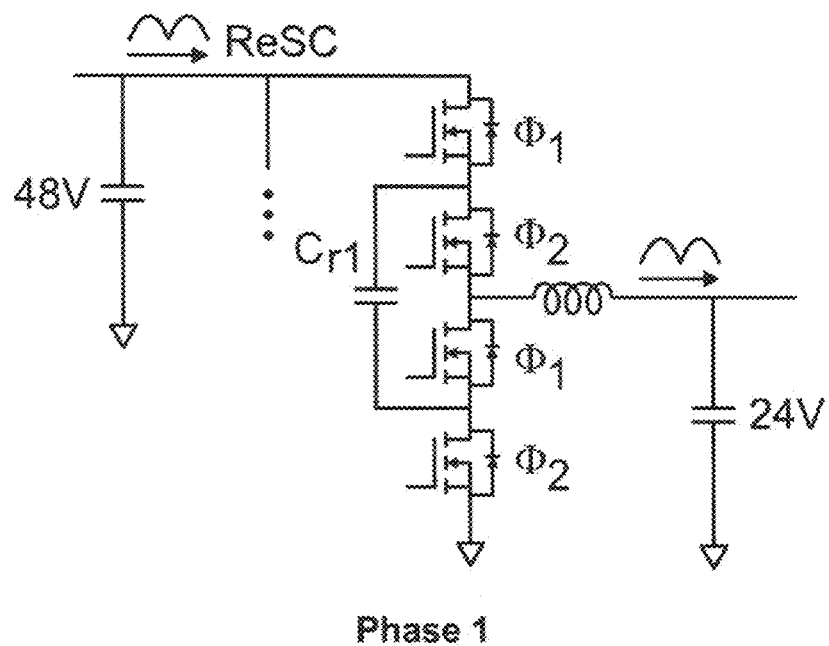
FIG. 34(a) depicts an operational phase of one ReSC module according to an embodiment of the present invention.
Figure 34B:
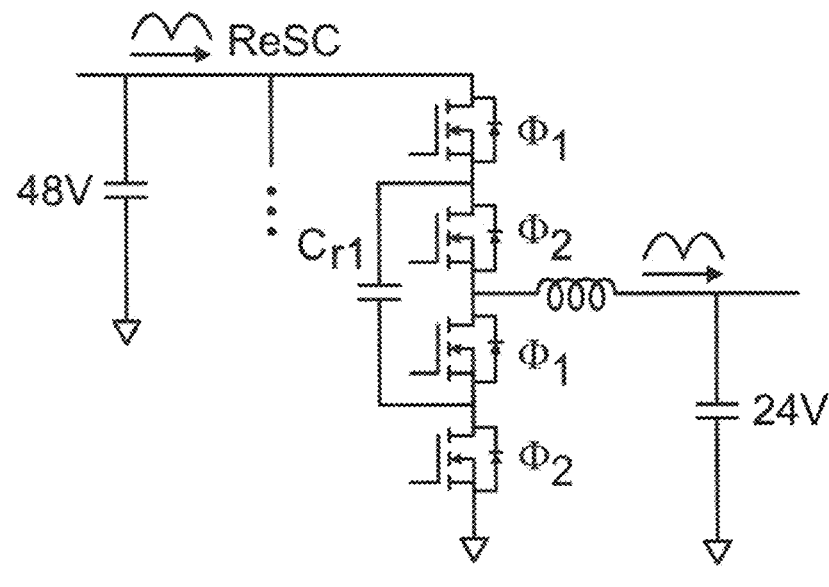
FIG. 34(b) depicts an operational phase of one ReSC module according to an embodiment of the present invention.
Figure 35:
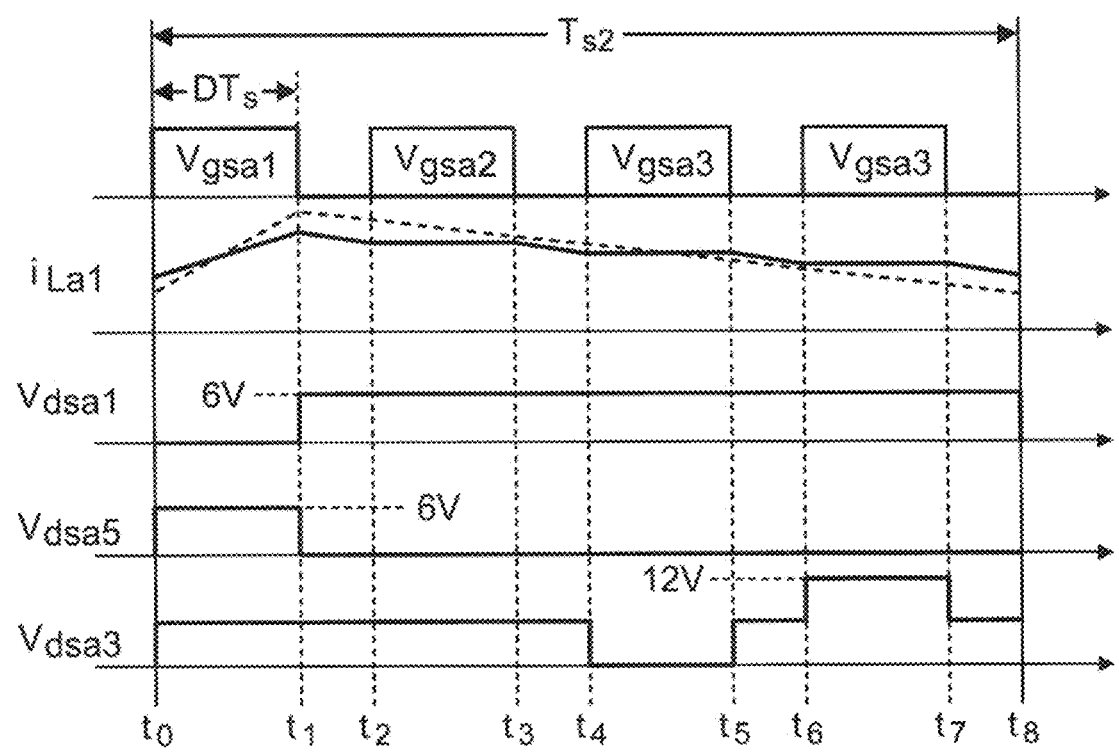
FIG. 35 depicts gate driver signals, inductor current, and drain-source voltage of HySC module according to an embodiment of the present invention.
Figure 36:
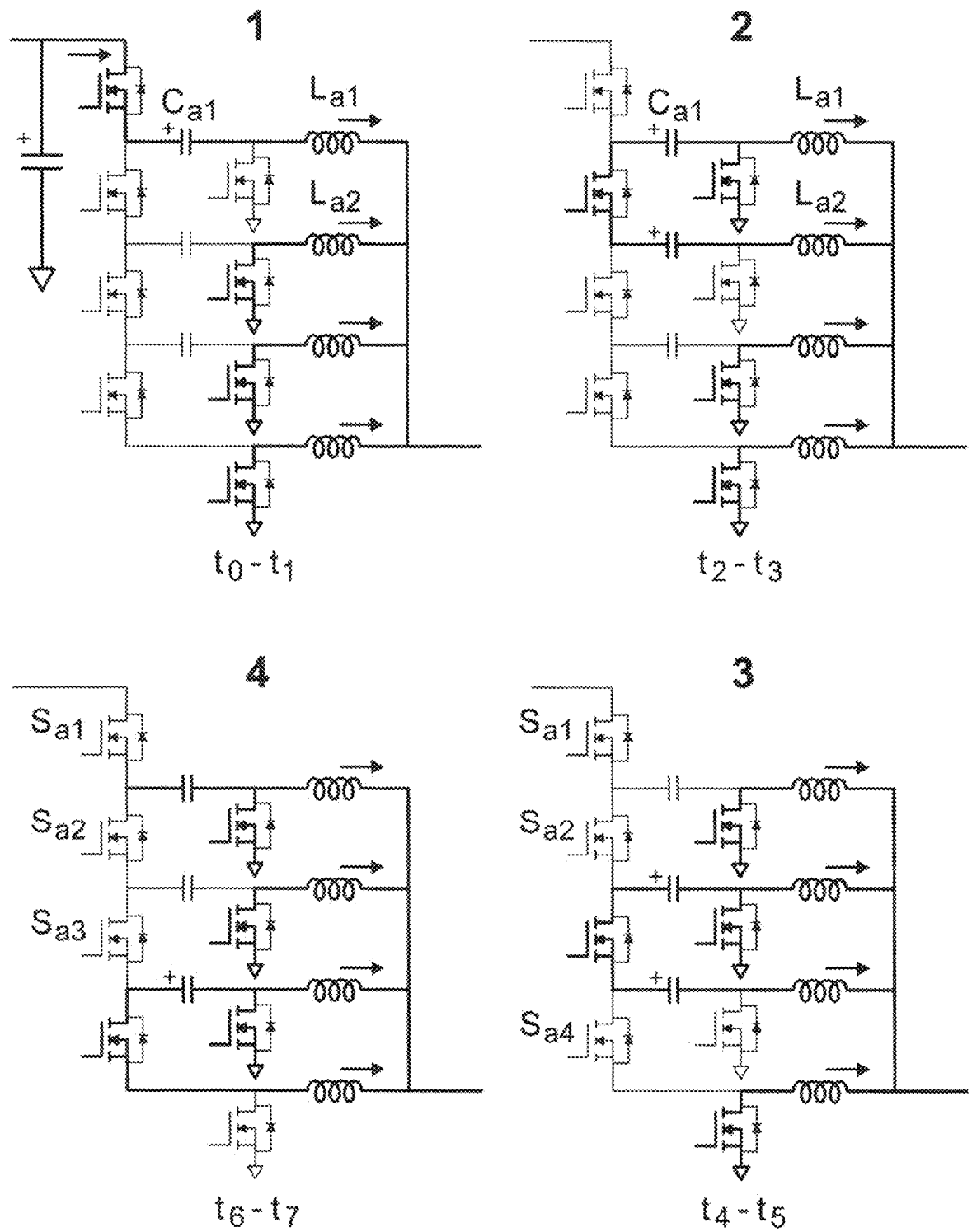
FIG. 36 depicts current flow of four HySC switching phases according to an embodiment of the present invention.

In a typical switched-capacitor converter, capacitors are forced to be connected in parallel. The voltage difference among capacitors causes high current spike and charge sharing loss. In the disclosed two-stage hybrid SC converter, both ReSC stage and HySC stage achieve soft-charging. FIGS. 34(a)-(b) show the two operational phases of the ReSC module. All capacitors are softly charged/discharged by a sinusoidal resonant current source. Capacitors are never directly connected in parallel. The resonant operation creates soft-switching opportunities. If the switching frequency of ReSC stage $f_{s1}$ equals to the resonant frequency $f_r$, zero-current-switching (ZCS) can be achieved. $f_{s1}$ is usually slightly higher than $f_r$ to reduce the conduction loss and offer higher tolerance for component mismatch. The capacitors in the HySC stage are also softly charged/discharged by the multiphase coupled inductors. FIG. 35 shows the gate driver signals of $S_{a1}$-$S_{a4}$ in one switching cycle. The four phases are fully interleaved in a way which is very similar to a four phase coupled inductor buck converter. FIG. 36 illustrates the four charging/discharging phases in one switching cycle. The HySC converter can greatly benefit from the coupled inductor mechanism with reduced transient inductance for a given steady state inductance.

The currents in the four phases of the coupled inductors are naturally balanced by the charge balancing requirement of switched capacitors in the HySC stage. Each switched capacitor is charged by one output inductor current for one ON-period, and discharged by another output inductor current for another ON-period. For example, $C_{a1}$ is charged by $i_{La1}$ from $t_0$ to $t_1$ and discharged by $i_{La2}$ from $t_2$ to $t_3$. The charging balancing requirement forces the current balance in the multiple phases, which can greatly benefit the operation of the coupled inductors.

FIG. 35 compares the current waveforms of a multiphase buck converter with a coupled inductor and multiple non-coupled inductors. The multiphase coupled inductors can greatly reduce the transient inductance of the multiphase operation while maintaining small steady state current ripple. The load voltage is regulated by the second HySC stage with a voltage gain of D/4. Here D is the duty ratio. The overall voltage gain of this two-stage hybrid converter is D/8. The voltage stress for $S_{a2}$-$S_{a4}$ is 12V, and is 6V for $S_{a1}$ and $S_{a5}$-$S_{a8}$.

One limitation of this HySC converter is that the duty ratio of each phase needs to be smaller than 1/N, where N is the number of phases. The maximum voltage conversion ratio of a HySC converter with N series-stacked phases is $N^2$:1. For a 4-phase HySC design, a 25% duty ratio maps to a voltage conversion ratio of 16:1. With a 24V input voltage, the nominal output voltage is 1.5V. A lower duty ratio leads to lower output voltage for the Point-of-Load converter. Phase shedding can be applied to improve the light load system efficiency.

Figures 37, 38:
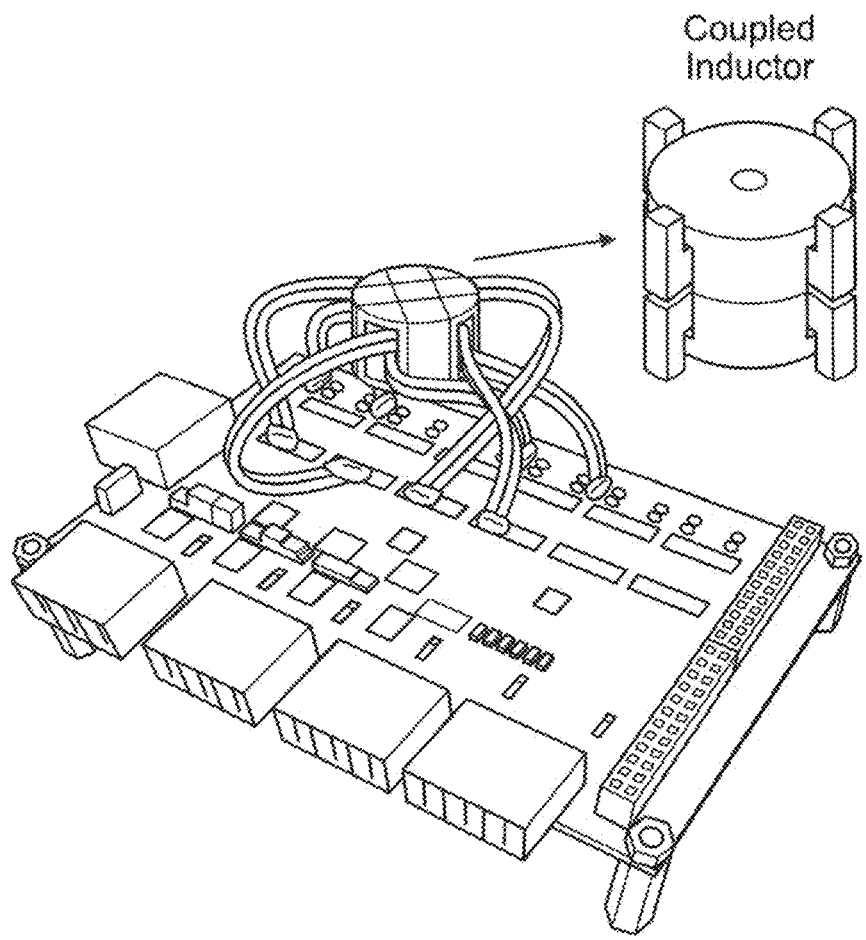
FIG. 37 depicts a table of bill-of-material of a prototype 48V-1V 100A two-stage hybrid-SC converter with coupled inductors according to an embodiment of the present invention.
FIG. 38 depicts the prototype according to an embodiment of the present invention.

A 48V-1V 100A two-stage hybrid-SC converter with coupled inductors has been built and tested. The table in FIG. 37 lists the key parameters of the prototype. The switching frequencies of the ReSC stage and HySC stage are 500 kHz and 125 kHz, respectively. The duty ratio of the four-phase HySC stage for 48V-1V conversion is 1/6, yield a voltage conversion ratio of 24:1. FIG. 38 shows a picture of the prototype. The four windings of the coupled inductor are extended out of the magnetic core to measure the phase current.

Figure 39A:
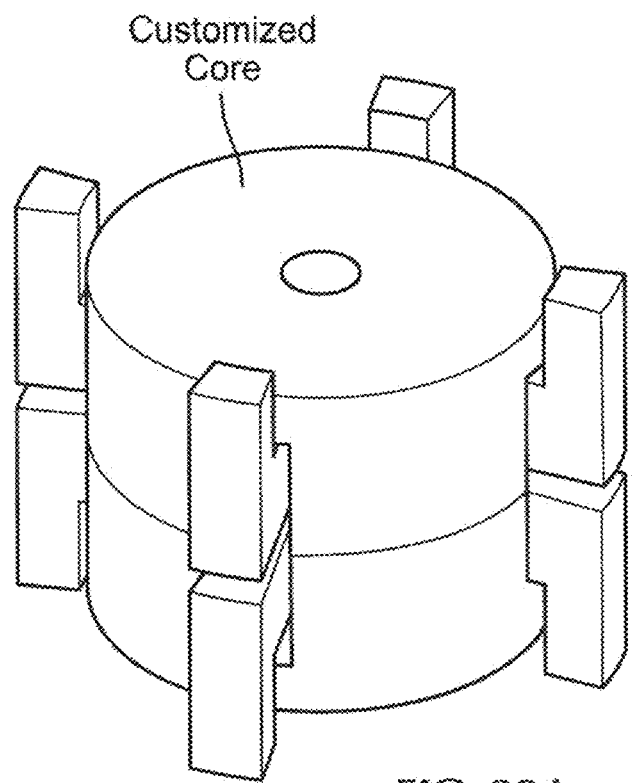
FIG. 39(a) depicts a 3D assembly of the coupled inductor according to an embodiment of the present invention.
Figure 39B:
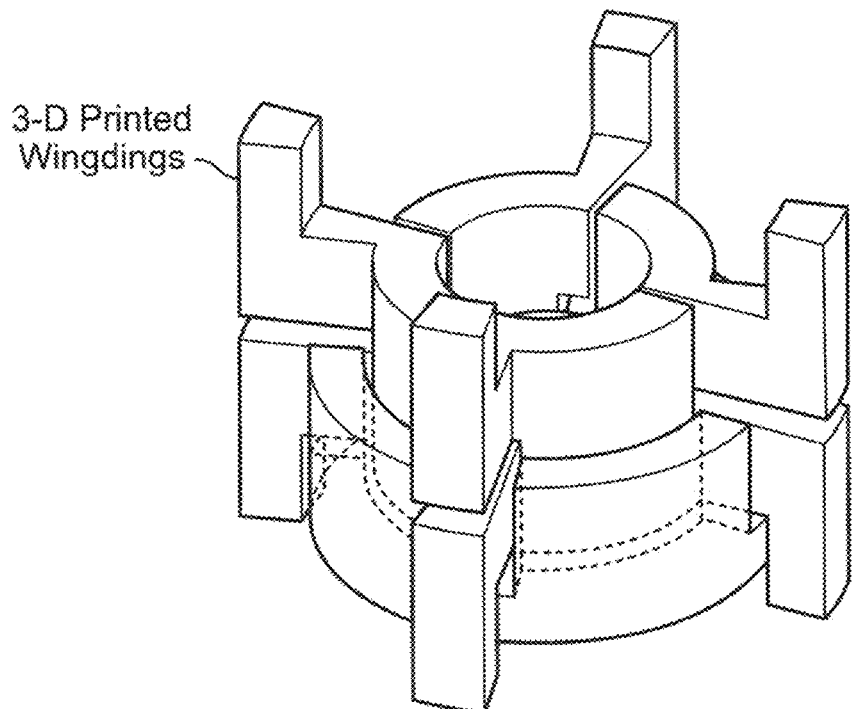
FIG. 39(b) depicts the 3D assembly of the coupled inductor according to an embodiment of the present invention.

FIGS. 39(a)-(b) show a 3D assembly drawing of the four-phase coupled inductor. The magnetic core is a P18 N26 core with four evenly distributed 90-degree slots and a center rod. Each winding wires around one slot. The windings are implemented as Litz wires in this digest.

Figure 40:
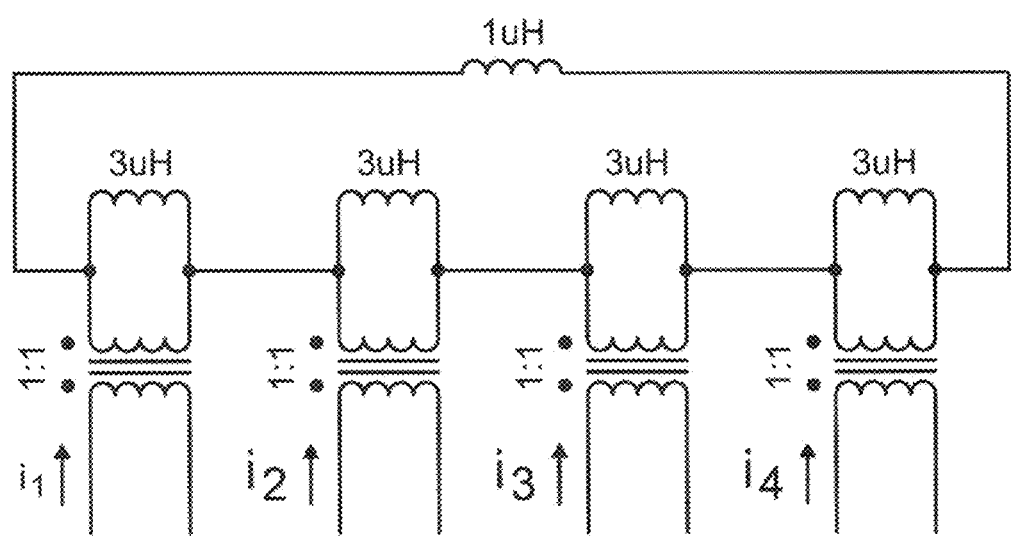
FIG. 40 depicts coupled inductor current waveforms according to an embodiment of the present invention.
Figure 41:
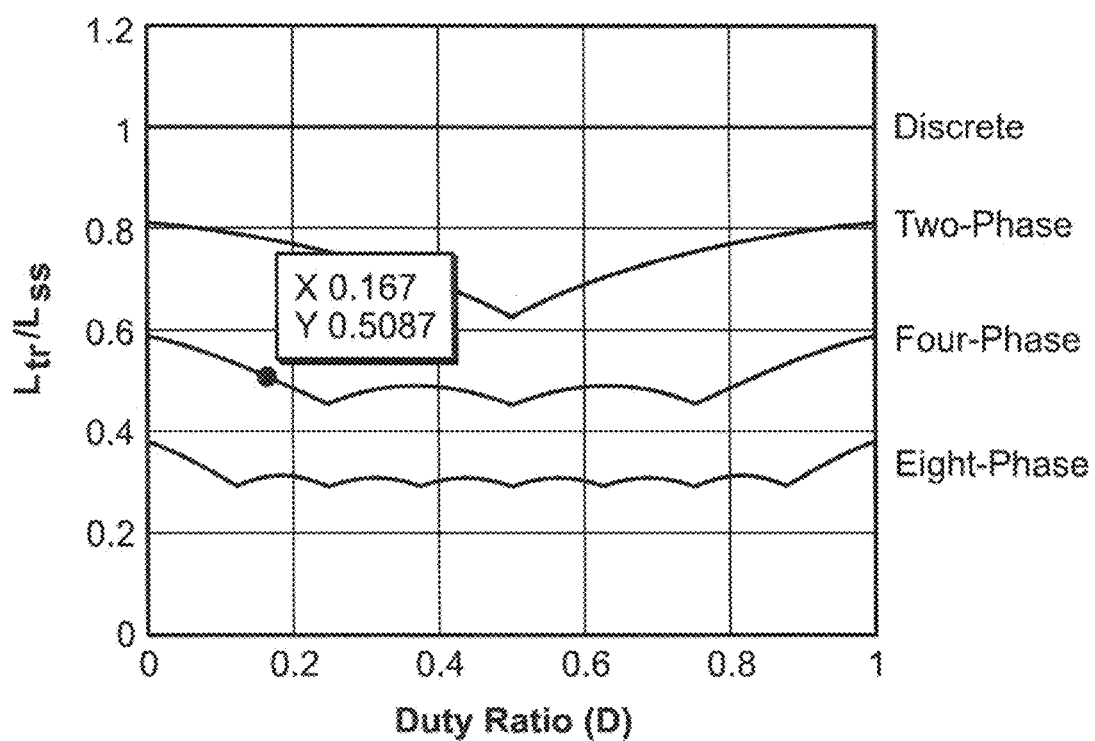
FIG. 41 depicts FOM of the coupled inductor configuration according to an embodiment of the present invention.

The reluctance of the side slot of the magnetic core ($R_L$) is about 333 k Ampere-turn/Weber. The reluctance of the center rod of the magnetic core ($R_C$) is about 100 k Ampere-turn/Weber. FIG. 40 shows the lumped circuit model of the coupled inductor. For a four phase coupled inductor, with $R_L/R_C$=3.33, D=1/6, the ratio between the transient inductance $L_{tr}$ and the steady state inductance $L_{ss}$ per phase of the coupled inductor is about 50%. As shown in FIG. 41 the four phase coupled inductor reduces the transient inductance of the multiphase buck converter by 50% while maintaining the same steady state inductance and output ripple.

Figure 42A:
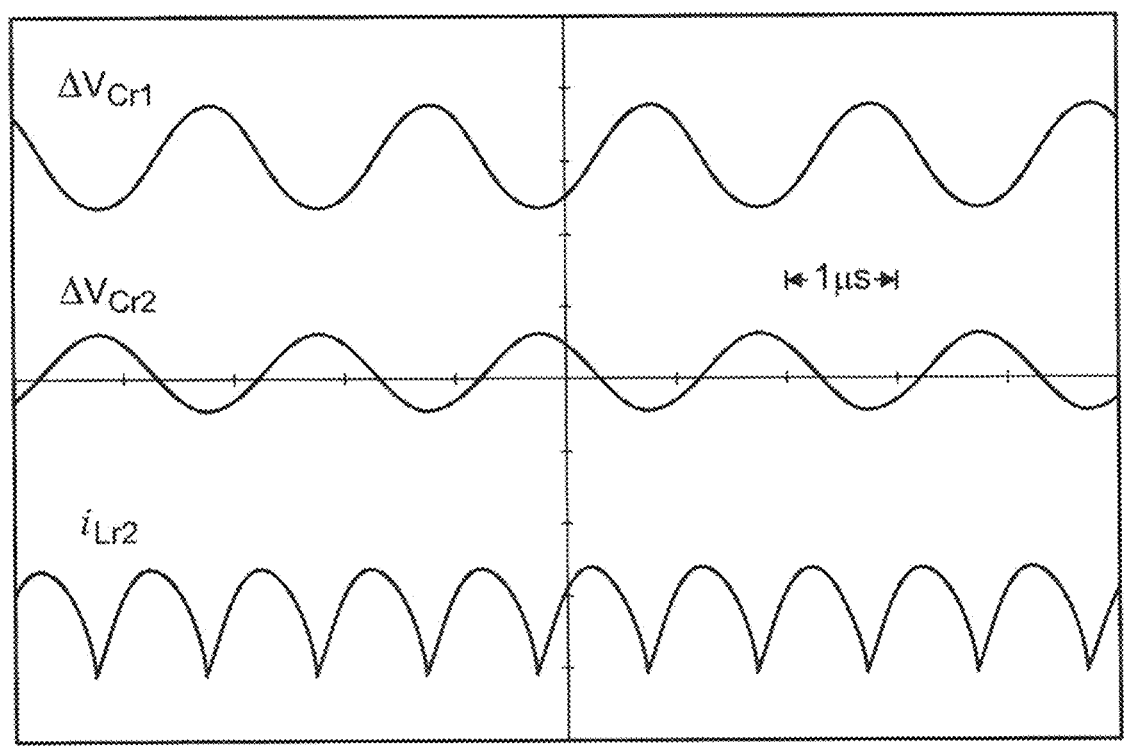
FIG. 42(a) depicts measured current waveform of the resonant inductor $L_{r2}$ and voltage ripple of two resonant capacitors in the ReSC stage according to an embodiment of the present invention.
Figure 42B:
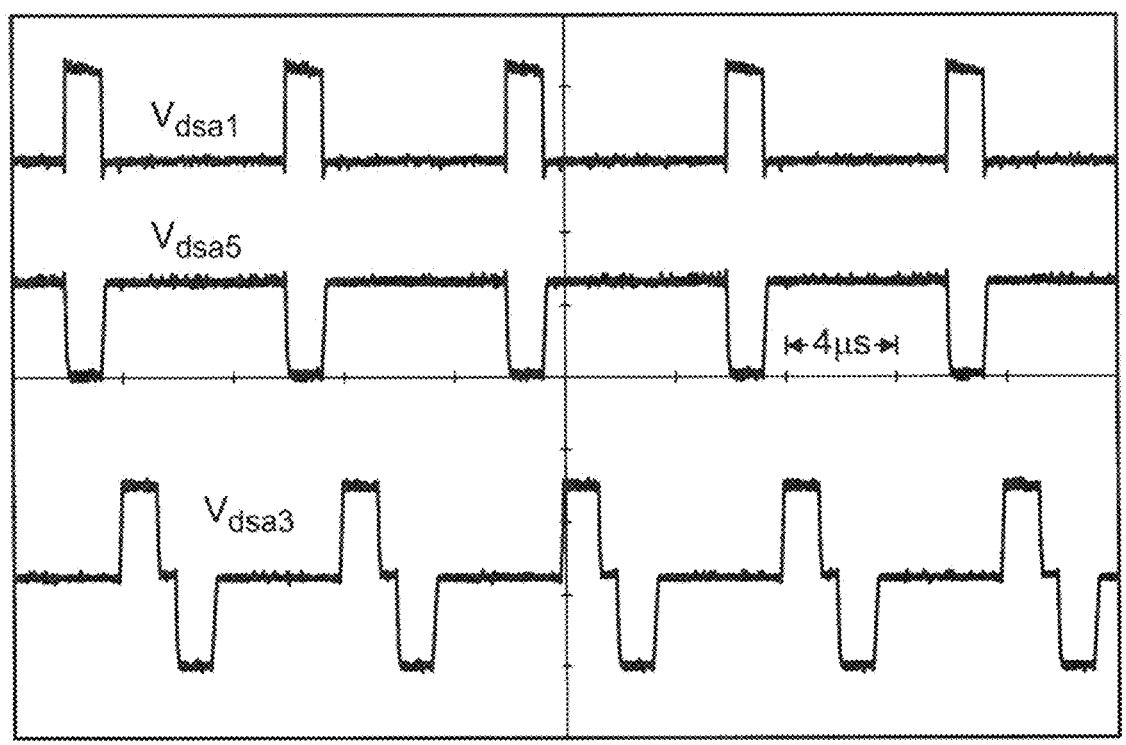
FIG. 42(b) depicts measured drain-source voltage $S_{a1}$, $S_{a5}$, and $S_{a3}$ in the HySC stage according to an embodiment of the present invention.
Figure 42C:
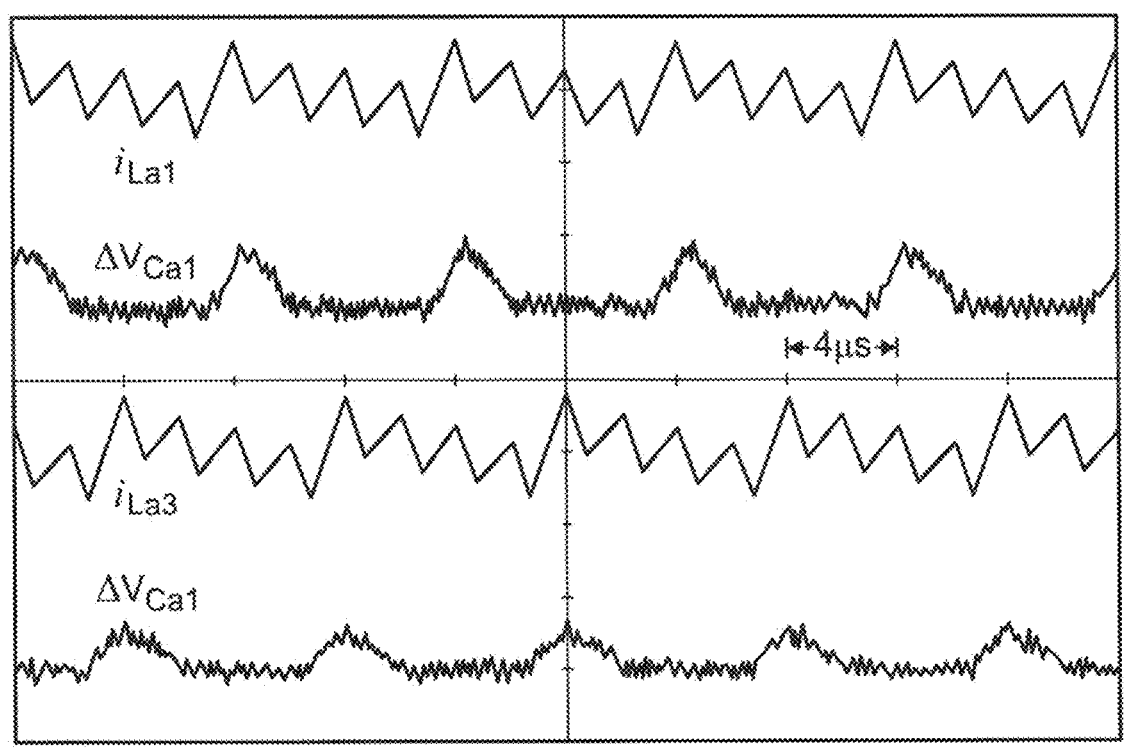
FIG. 42(c) depicts measured voltage ripple on $C_{a1}$ and $C_{a3}$ in the HySC stage and the current $i_{La1}$ and $i_{La3}$ in the coupled inductor according to an embodiment of the present invention.
Figure 43:
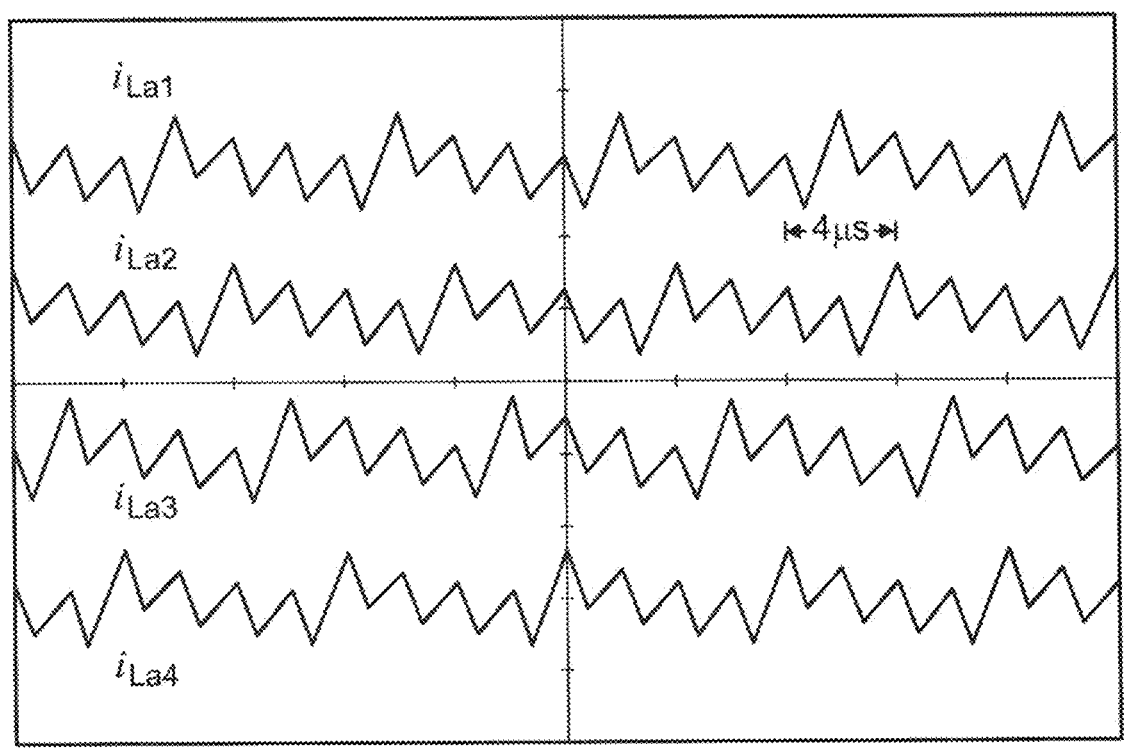
FIG. 43 depicts measured coupled currents with each phase carries 5A of average current according to an embodiment of the present invention.

FIG. 42(a) shows the measured current and voltage waveforms of the resonant tank in the 48V-24V stage. The 48V-24V stage operates slightly above the resonant frequency to reduce the RMS current. The turn-off current is slightly above zero (near ZCS). FIG. 42(b) shows the drain-source voltage of $S_{a1}$, $S_{a5}$, and $S_{a3}$ in the 24V-1V stage. The voltage stress of switches in the 24V-1V stage is 12V for series-stacked switches (6V for $S_{a1}$) and 6V for grounded referenced switches. FIG. 42(c) shows the voltage ripple in $C_{a1}$ and $C_{a3}$ and two phase currents in the 24V-1V stage. The voltage ripple in $C_{a1}$ and $C_{a3}$ proved the charge balancing of switched capacitors. FIG. 43 shows the current waveforms of the four-phase coupled inductor when the converter is delivering 20A of current to the load.

Figure 44:
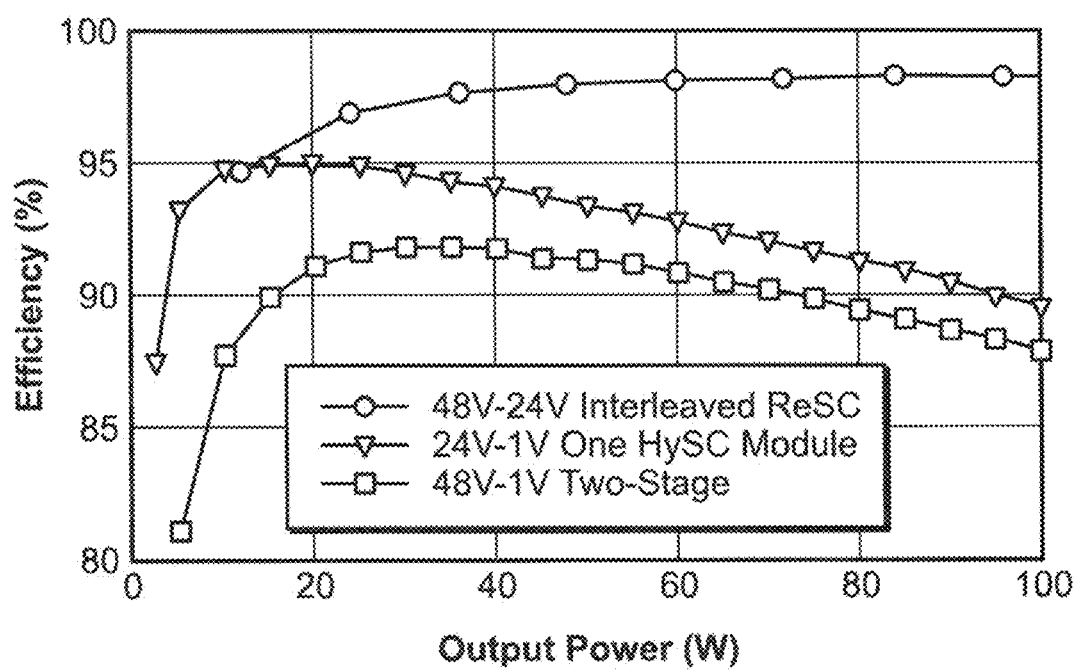
FIG. 44 depicts measured efficiency of the 48V-24V ReSC stage, the 24V-1V HySC stage, and the overall 48V-1V system according to an embodiment of the present invention.

FIG. 44 shows the measured efficiency of the 48V-24V interleaved ReSC stage, the 24V-1V HySC stage, and the overall 48V-1V converter with four 1.2 µH discrete inductors. The power rating of the converter is 100W/100A. The peak efficiency of the 48V-24V stage is 98.3% at 84W and the full load efficiency is 98.2%. The peak efficiency of the 24V-1V stage is 95% at 1V/20A and the full load efficiency is 89.6%. The peak efficiency of the two-stage 48V-1V system is 91.9% at 1V/30A. The full load efficiency is 87.9% at 100A.

Merged Two-Stage Hybrid Point-of-Load Converter with Coupled Inductors

As microprocessors continue to trend towards consuming more current at lower voltage, it is of greater importance to configure power converters that can deliver high current (in the 100s of Amps) at high efficiency with high power density. An emerging approach to this problem is to deliver power to these microprocessors directly from a 48 V-54 V dc bus to reduce the conduction losses. Many topologies have been proposed to perform high step down voltage conversion for high current point-of-load (PoL) applications: hybrid-switched-capacitor configurations, transformer-based configurations, and multiphase buck configurations. Of these approaches, a switched-capacitor (SC) and multiphase buck two-stage design is attractive option as it offers high step down conversion ratio and high control bandwidth.

The Linearly Extendable Group Operated Point-of-Load (LEGO-PoL) architecture merges the operation of a SC stage and a multiphase buck stage to eliminate the resonant inductors of the SC stage as well as the decoupling capacitors between the two stages, allowing for soft charging of capacitors and automatic voltage balancing and current sharing. While merging the two stages creates initial opportunities to improve the power density, there is further room for improvement in configuring the magnetic components for the multiphase buck converter. Compared to using discrete inductors, coupled inductors can reduce the overall size of the system, while utilizing its nonlinear inductance to keep the current ripple low during steady-state operation as well as achieve fast transient operation. Disclosed herein are embodiments for a generalized reluctance model for a coupled magnetic core that can be used with LEGO-PoL converters. A novel permeance model is derived using the topological dual of the reluctance model. The advantages of ripple current reduction and fast transient operation using coupled inductors in LEGO-PoL converters are theoretically quantified, verified with simulation, and further validated experimentally.

Figure 45:
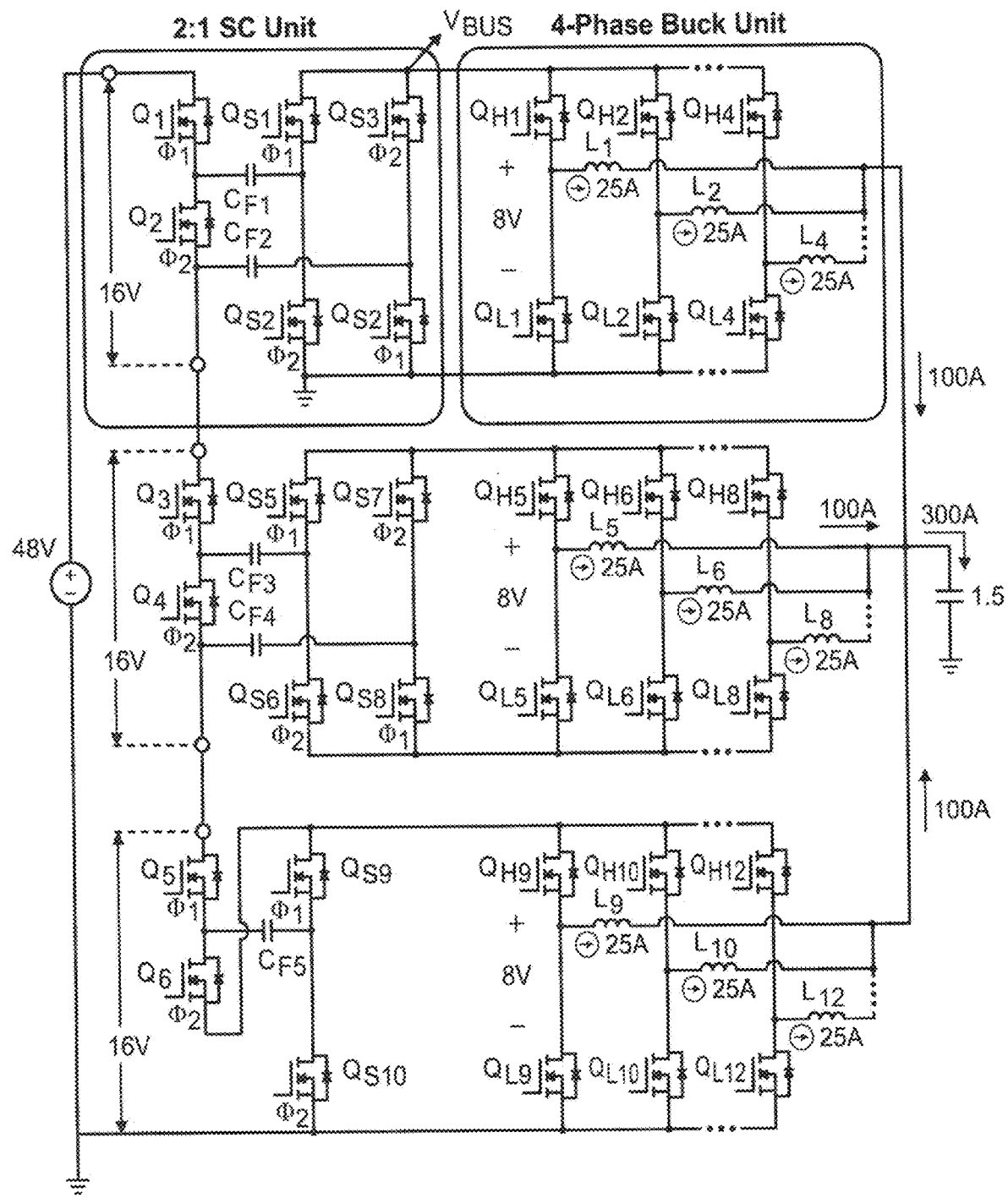
FIG. 45 depicts A 48 V-1.5 V LEGO-PoL design with three stacked sub-modules according to an embodiment of the present invention.

FIG. 45 shows the topology of a typical LEGO-PoL converter. In this example, three sub-modules are connected with their inputs in series and outputs in parallel. Each sub-module includes a 2:1 SC unit and a four-phase buck unit. This series-input parallel-output configuration reduces the switch stress by decoupling the voltage and current stress. The switches in the SC units need to block high input voltage, while the switches in the buck units need to carry high output current. This example design steps down 48 V to 8 V through the three 2:1 SC units, and then 8 V to 1.5 V through the multiphase buck units. The 12 phases each delivers 25 A.

The inductors in the buck units act as current sources to soft charge the capacitors in the SC units. In each switching cycle, capacitors $C_{F1}$ and $C_{F3}$ are charged by one current source in $\varnothing_1$, and discharged by another current source in $\varnothing_2$. This happens for $C_{F2}$ and $C_{F4}$ as well. Since these SC units are operating at 50% duty cycle, the current sources must be equal, which leads to automatic current sharing between the two modules and thus all modules.

The switching frequencies of the SC units and buck units can be decoupled so that the SC units operate at a lower frequency for ultra high efficiency (e.g. 100 kHz-200 kHz)

while the buck units operate at a higher switching frequency for faster transient response (e.g. 1 MHz-2 MHz).

Figure 46:
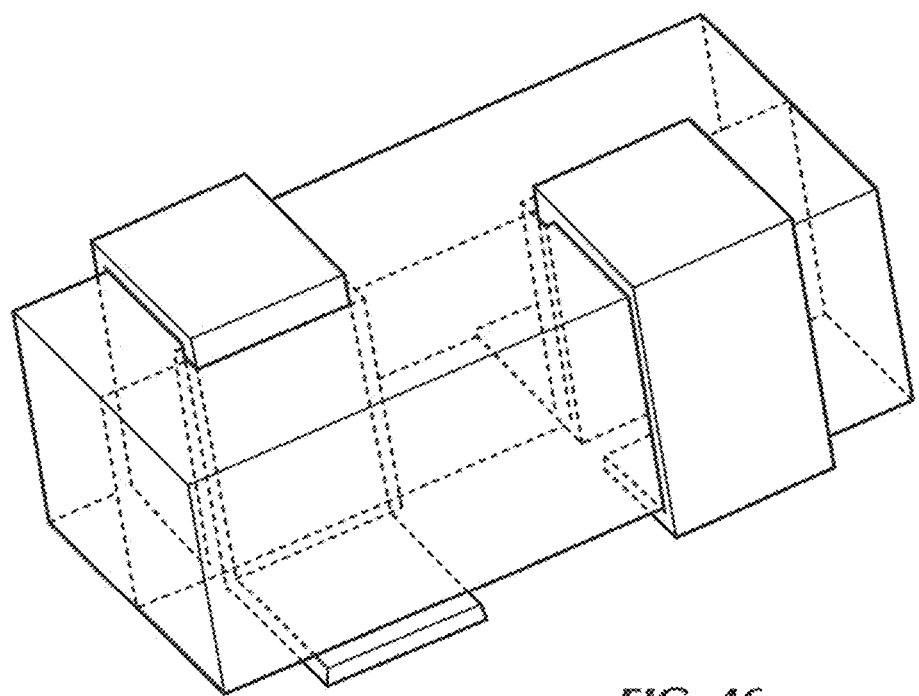
FIG. 46 depicts a 2-phase coupled inductor according to an embodiment of the present invention.
Figure 47B:
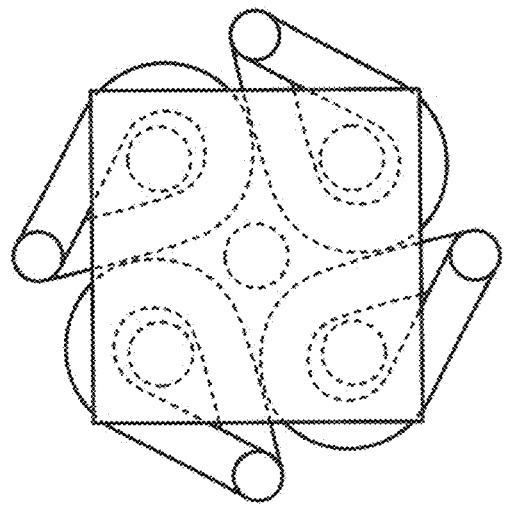
FIG. 47(b) depicts the 4-phase coupled inductor according to an embodiment of the present invention.
Figure 47C:
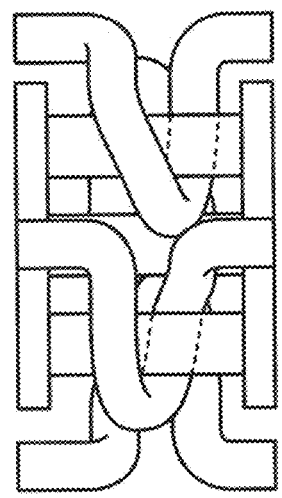
FIG. 47(c) depicts the 4-phase coupled inductor according to an embodiment of the present invention.
Figure 47A:
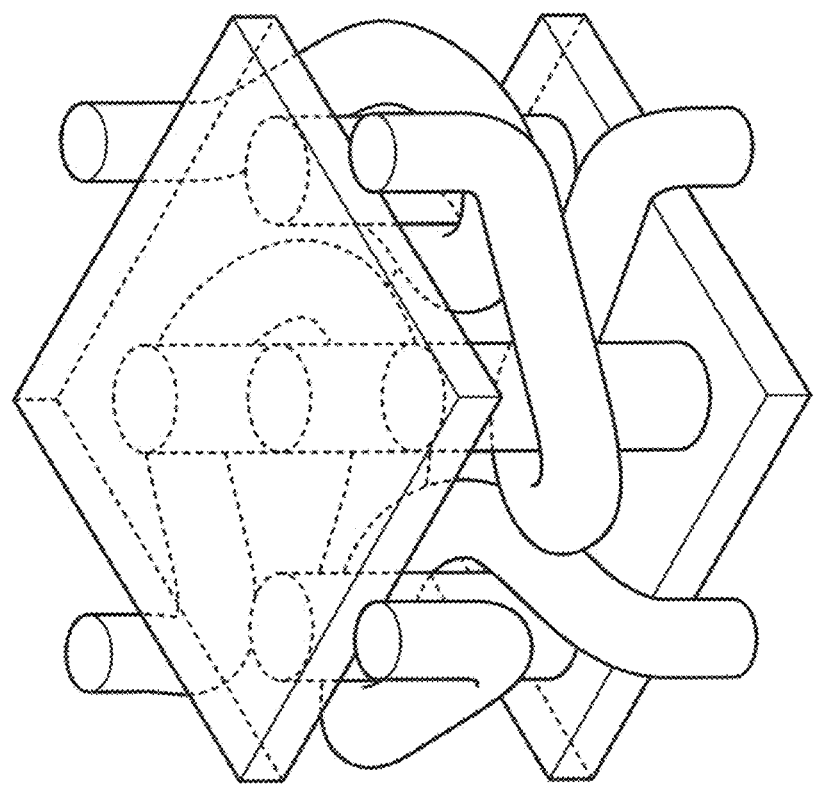
FIG. 47(a) depicts a 4-phase coupled inductor according to an embodiment of the present invention.

Two different scenarios for using coupled inductors in the LEGO-PoL converter are considered, though that is not intended to be limiting. FIG. 46 shows a two-phase coupled inductor which is configured for easy prototyping. FIGS. 47(a)-(c) show a four-phase coupled inductor that will be used in the LEGO-PoL converter. This core is composed of four different rods to contain the windings for each phase, a top and bottom plate, and a center rod with an air gap between it and the top plate. By changing this air gap, the coupling coefficient between the windings can be modified.

Figure 48:
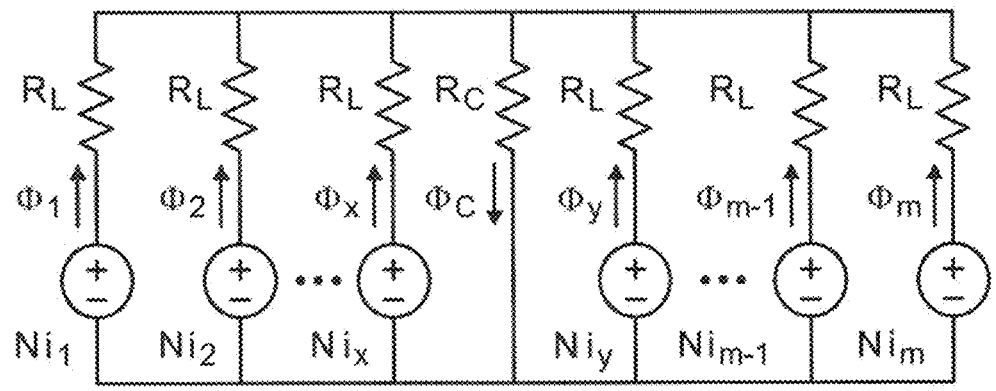
FIG. 48 depicts a reluctance model of a M phase coupled inductor according to an embodiment of the present invention.
Figure 49:
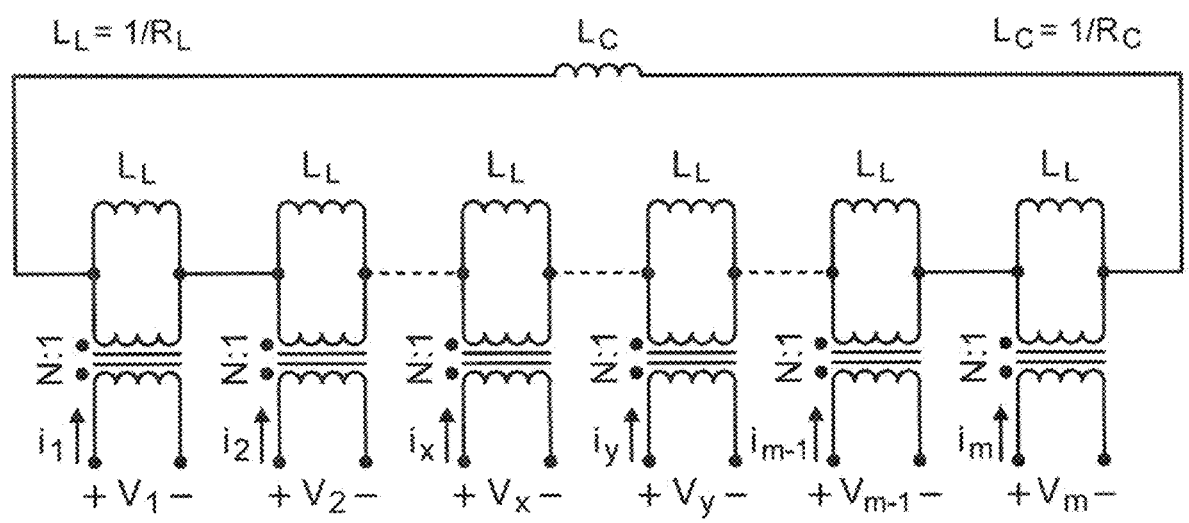
FIG. 49 depicts a permeance model of a M phase coupled inductor according to an embodiment of the present invention.

FIG. 48 shows the reluctance model of an m-winding coupled inductor. To simplify the analysis, all windings are assumed to have an identical number of turns N and all the rods that contain a winding have a reluctance of $R_L$, while the center rod and air gap have a reluctance of $R_C$. FIG. 49 shows the corresponding permeance model for the magnetic core. By using topological duality, the permeance model can represent the core as a lumped circuit model, with series inductances (the dual of parallel reluctances) equal to the inverse of the corresponding reluctance.

This model can be used to derive the overall steady-state inductance $L_{ss}$, the effective overall transient inductance $L_{tr}$, as well as the effective per-phase steady-state inductance $L_{ssp}$ and effective per-phase transient inductance $L_{trp}$. To achieve the same transient performance with discrete non-coupled inductors, each inductor must have a value equal to $L_{trp}$ of the coupled inductor.

For a coupled inductor with M phases each with N turns, with duty ratio $$\frac{i}{M} < D < \frac{i+1}{M}$$

where i+1 represents the maximum number of phases that are simultaneously on, the configuration equations are summarized below.

$$L_{ss} = \frac{(1-D)DMN^2}{(R_L + MR_C)(i+1-DM)(DM-i)} \quad (13)$$

$$L_{ssp} = \frac{N^2(1-D)}{R_C\left(2i + DM - \frac{i^2+i}{DM}\right) + R_L(1-D)} \quad (14)$$

$$L_{tr} = \frac{N^2}{M(R_L + MR_C)} \quad (15)$$

$$L_{trp} = \frac{N^2}{R_L + MR_C} \quad (16)$$

Figure 50:
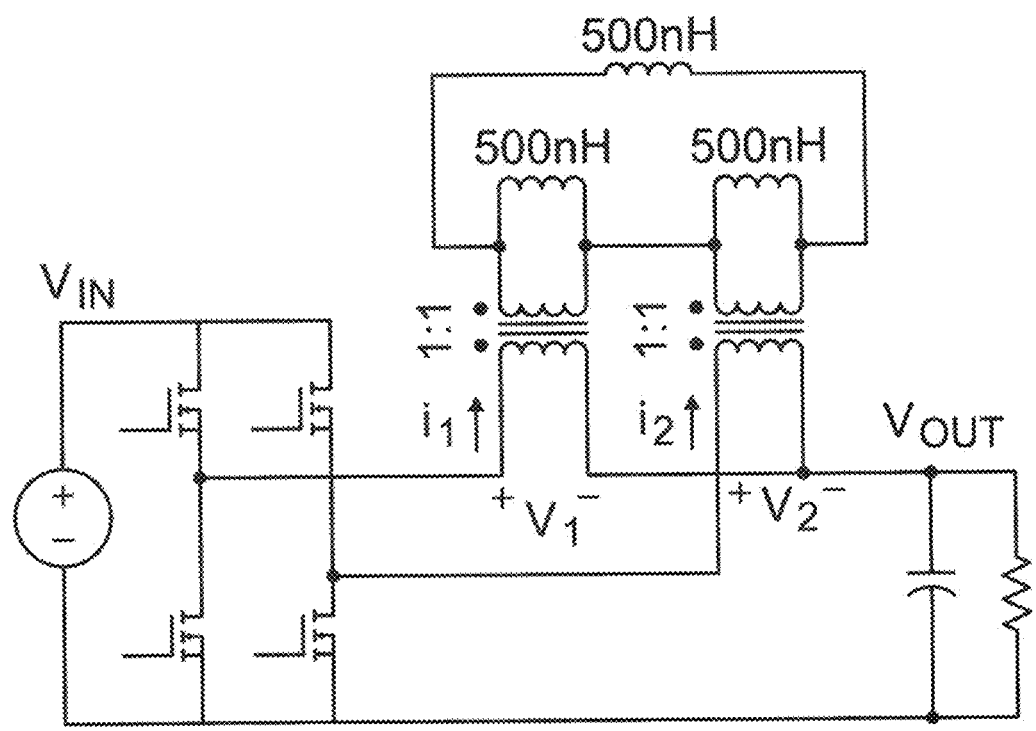
FIG. 50 depicts SPICE simulation of a two-phase example according to an embodiment of the present invention.

To validate of the permeance model, a two-phase coupled inductor example is used. Assume the reluctances $R_L$=2,000,000$H^{-1}$ and $R_C$=2,000,000$H^{-1}$. The corresponding inductances in the permeance model are $L_L$=1/$R_L$=500 nH and $L_C$=1/$R_C$=500 nH, as shown in FIG. 50. This is compared with using an ideal coupled inductor in SPICE that uses an inductance matrix. The inductance matrix of this coupled inductor is calculated by $$L_{self} = \frac{N^2}{R_L + \frac{R_L}{M-1} \| R_C} \text{ and } L_{mutual} = \frac{-N^2 R_C}{R_L^2 + MR_L R_C}:$$

$$\begin{bmatrix} \frac{di_1}{dt} \\ \frac{di_2}{dt} \end{bmatrix} = \begin{bmatrix} 333 \text{ nH} & -166 \text{ nH} \\ -166 \text{ nH} & 333 \text{ nH} \end{bmatrix} \begin{bmatrix} v_1 \\ v_2 \end{bmatrix} \quad (17)$$

Figure 51:
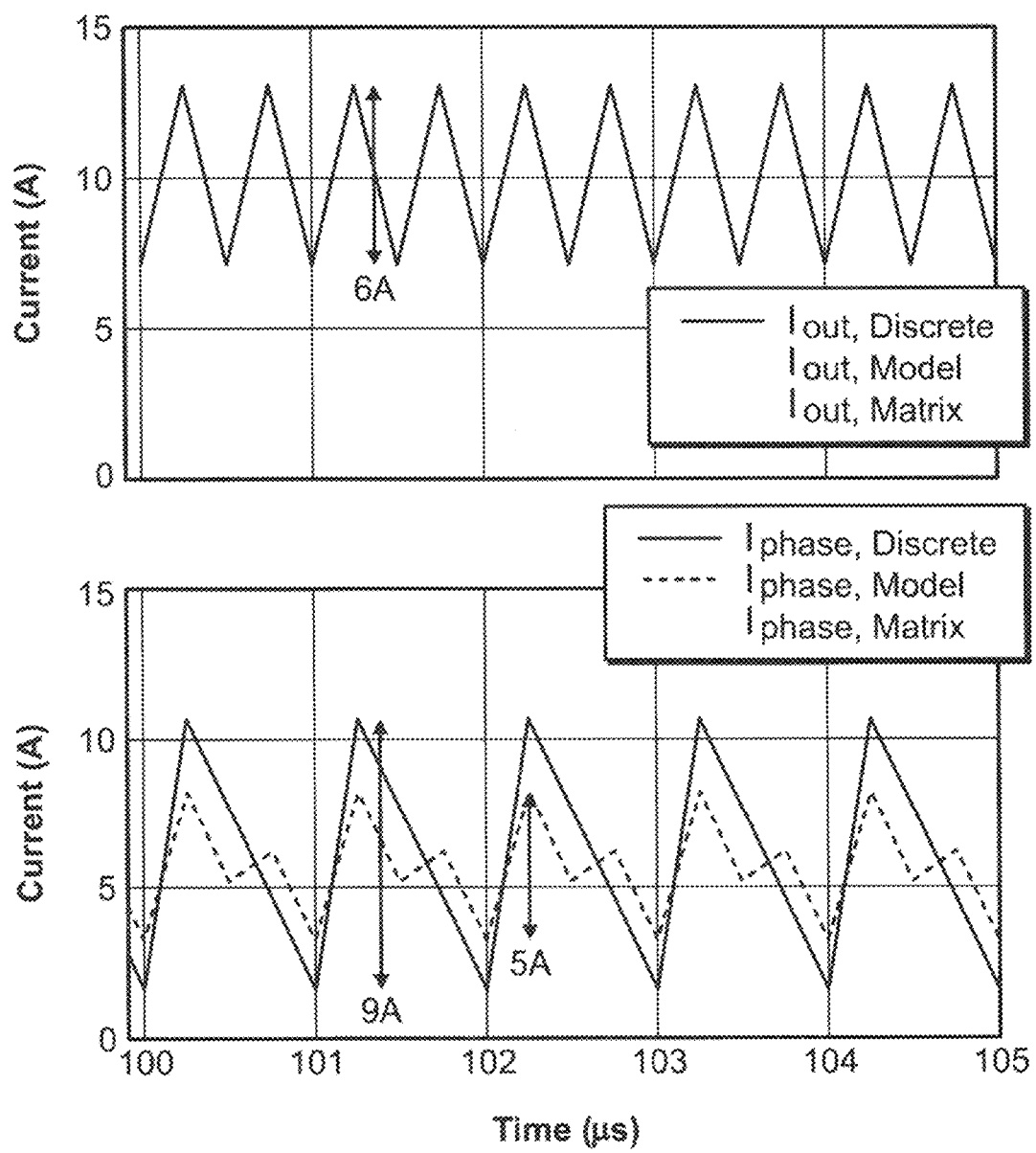
FIG. 51 depicts simulated waveforms of the two-phase example with the same $L_{tr}$ according to an embodiment of the present invention.

Assume $V_{in}$=8 V, $f_s$=1 MHz, D=25%, and i=0. According to Equations (13)-(16), $L_{ss}$=250 nH, $L_{ssp}$=300 nH, $L_{tr}$=83 nH, and $L_{trp}$=166 nH. The overall output current ripple is 6 A, and the per-phase current ripple is 5 A. To achieve the same transient performance, discrete inductors of 166 nH are used. Coupling two inductors reduces the per-phase current ripple from 9 A to 5 A while maintaining the same transient inductance. FIG. 51 shows the simulated output and per-phase current ripples with good match.

Figure 52:
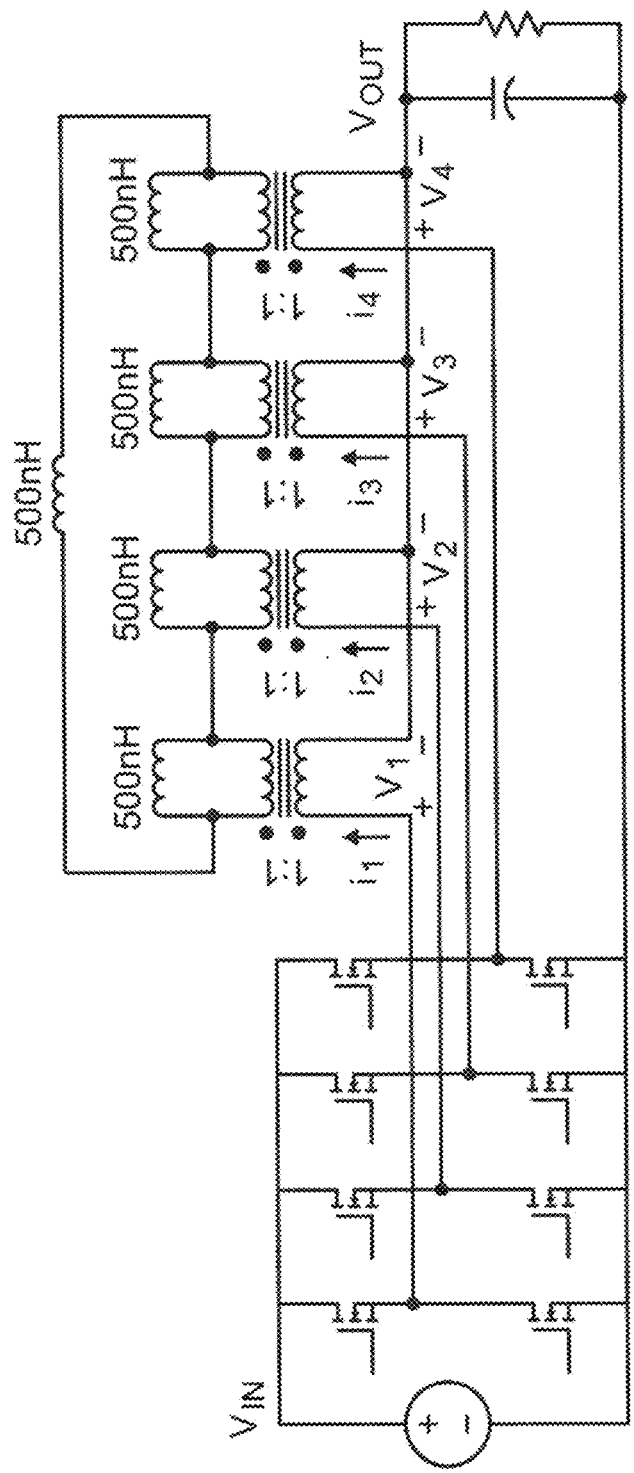
FIG. 52 depicts a SPICE simulation of a four-phase example according to an embodiment of the present invention.
Figure 53:
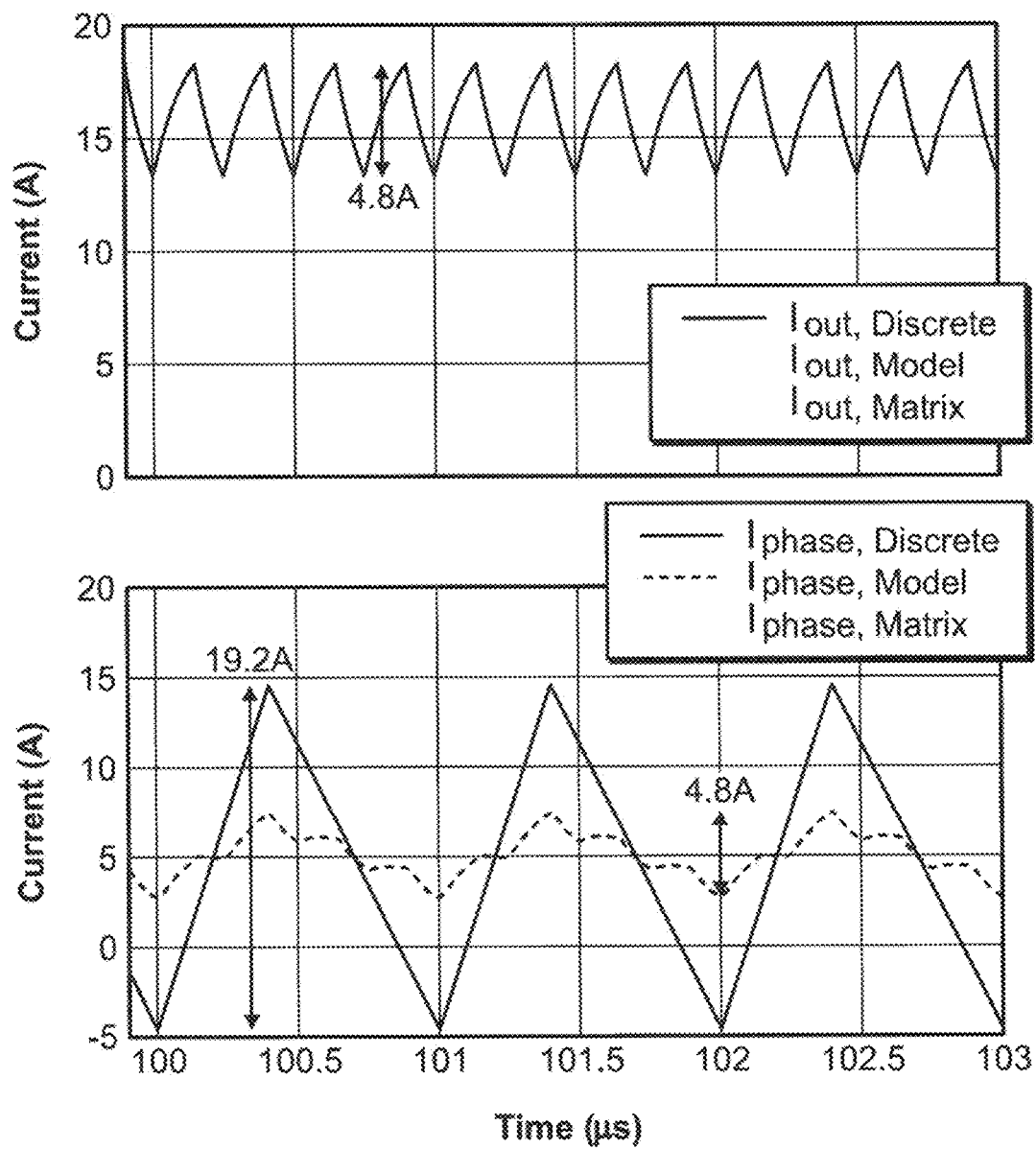
FIG. 53 depicts simulated waveforms of the two-phase example with the same $L_{tr}$ according to an embodiment of the present invention.

A similar four-phase coupled inductor with $R_L$=2,000,000$H^{-1}$ and $R_C$=2,000,000$H^{-1}$, resulting in $L_L$=500 nH and $L_C$=500 nH, was simulated in SPICE, shown in FIG. 52. Calculating the inductance matrix as done in Equation (17) yields $L_{self}$=400 nH and $L_{mutual}$=-100 nH. Assume $V_{in}$=8 V, $f_s$=1 MHz, D=40%, and i=1. Using the formulas in Equations (13)-(16) leads to $L_{ss}$=400 nH, $L_{ssp}$=400 nH, $L_{tr}$=25 nH, and $L_{trp}$=100 nH. The overall output current ripple is 4.8 A, and the per-phase current ripple is also 4.8 A. To achieve the same transient performance, discrete inductors of 100 nH are used. Coupling four inductors reduces the per-phase current ripple from 19.2 A to 4.8 A while maintaining the same transient inductance. FIG. 53 shows the simulated output and per-phase current ripples. The waveforms of the simulation using the inductance matrix overlap with the permeance model, and the values match the calculations.

A 40 V-60 V input, 1.5 V output, 300 A LEGO-PoL converter was built using two-phase coupled inductors to verify the theoretical model. Each submodule includes two two-phase coupled inductors. The full converter includes six two-phase coupled inductors.

Figure 54:
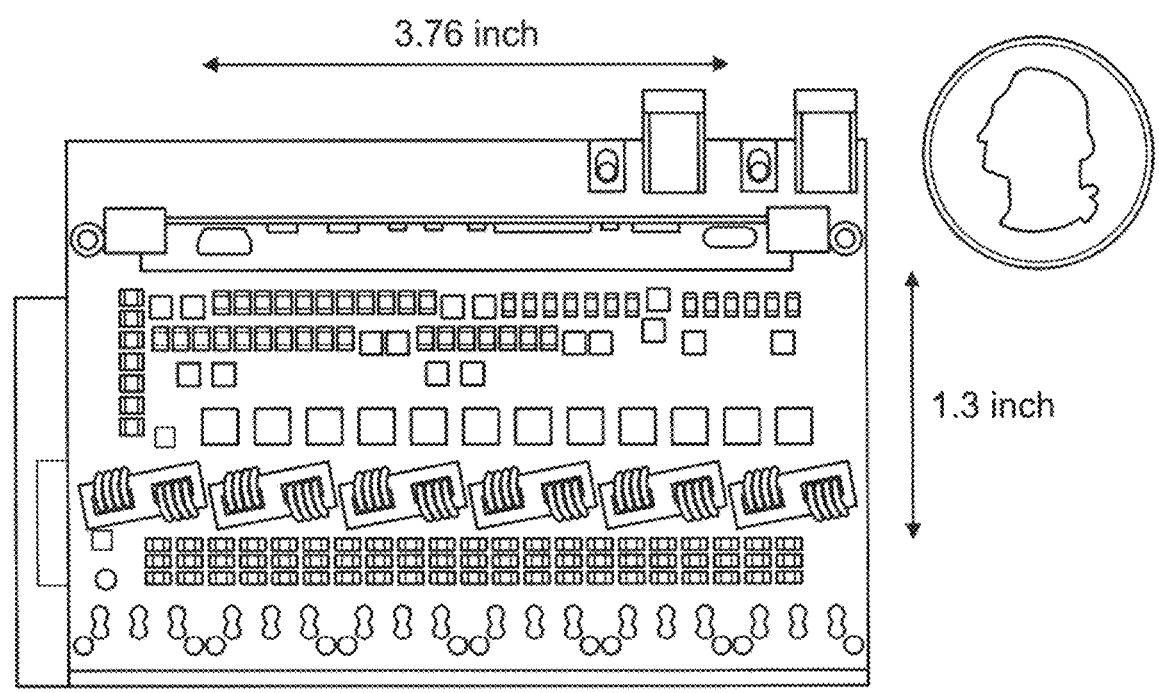
FIG. 54 depicts a prototype 48 V-1.5 V 300 A LEGO-PoL converter with six two-phase coupled inductors compared to a US quarter according to an embodiment of the present invention.
Figure 55:
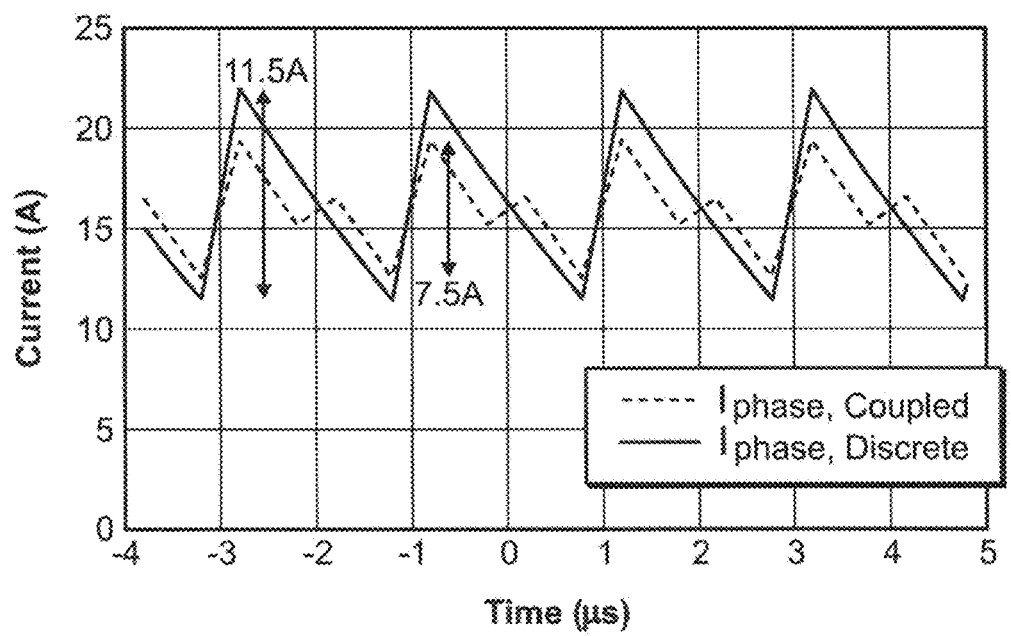
FIG. 55 depicts experimental per-phase current waveforms of the two-phase coupled inductor and a 220 nH discrete inductor in the LEGO-PoL converter according to an embodiment of the present invention.

FIG. 54 shows a picture of the prototype. A E18/4/10/R+ PLT18/10/2/S core set from TDK was used for the coupled inductors. A gap was added to the center leg to achieve the targeted reluctances $R_C$=1.3×10$^6$ $H^{-1}$ and $R_L$=2×10$^6$ $H^{-1}$. The input voltage to the converter is 48 V, so the input voltage to the buck units is 8 V. The duty cycle is 20% (yielding i=0) and $f_s$=500 kHz. Using Equations (13)-(16), $L_{ss}$=290 nH, $L_{ssp}$=336 nH, $L_{tr}$=54.35 nH, $L_{trp}$=217.4 nH, $L_{self}$=358 nH, and $L_{mutual}$=-141 nH. An impedance analyzer was used to verify the self and mutual inductances and confirm that the inductors matched the targeted reluctances. The measured $L_{self}$ and $L_{mutual}$ were 367 nH and -147 nH, respectively, confirming that the inductor was configured to specifications. To achieve the same transient performance as the coupled inductor, 220 nH discrete inductors are used. The per-phase current ripple of the coupled inductor is calculated to be 7.78 A, compared to a calculated per-phase current ripple of 11.8 A for the discrete inductor. FIG. 55 shows these two per-phase current ripple waveforms, which match the theoretical calculations. A 35% decrease in the per-phase current ripple is achieved.

Figure 56A:
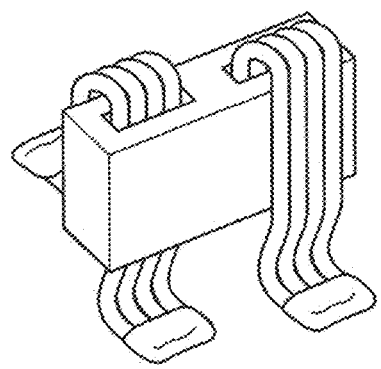
FIG. 56(*a*) depicts two-phase coupled inductor used for the experiments according to an embodiment of the present invention.
Figure 56B:
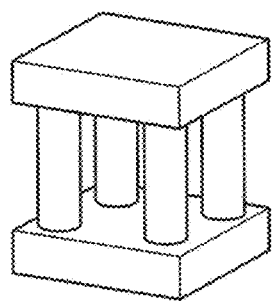
Figure 56C:
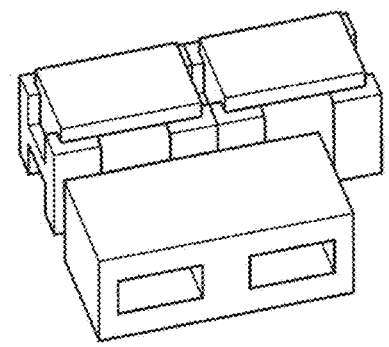
Figure 57:
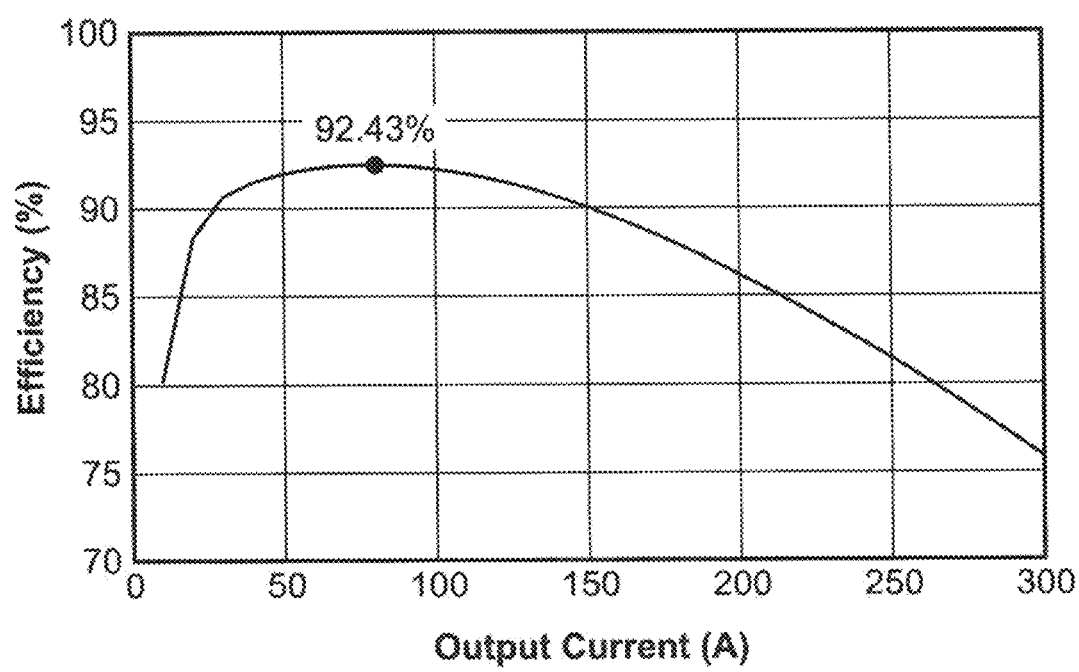
FIG. 57 depicts measured efficiency of a 48 V-1.5 V 300 A prototype with two-phase coupled inductors according to an embodiment of the present invention.

FIG. 56(a) shows a close up of the two-phase coupled inductor used for these experimental results on the left. The proposed four-phase coupled inductor configuration is shown in the middle. FIGS. 56(b)-(c) also show the two-phase coupled inductor core compared against two discrete inductors. The dimensions of the two-phase coupled inductor are 18 mm×14 mm×6.4 mm, with a total volume of 1.61 cm$^3$, whereas each discrete inductor has dimensions of 13 mm×13 mm×10 mm, and the total volume of two is 3.38 cm³. Using two-phase coupled inductors reduces the overall volume of the inductors by 52%. FIG. 57 shows the measured system efficiency. The peak efficiency is 92.43% at an output current of 80 A.

Conclusion:

As such, generally disclosed herein are embodiments for systems and methods for vertical power delivery to electronic systems. The vertical power delivery technique includes a 3D packaging approach which connects the microprocessors to motherboards with very low interconnect loss. The technique also includes a multiphase coupled inductor structure which works with the packaging technique and can greatly enhance the performance of the voltage regulation modules. Approaches for configuring and optimizing the 3D packaging and the multiphase coupled inductor structure are introduced as well.

Further disclosed herein are embodiments for a permeance model for programmable coupled inductors in multiphase buck converters. The model is derived as a topological dual of a traditional multiphase coupled transformer model, yielding an equivalent circuit with significantly simplified equations for evaluating the transient and steady state performance.

Further disclosed herein are embodiments for a 48V-1V 100A two-stage hybrid switched-capacitor converter with coupled inductor for high current microprocessors. The first stage of the converter is a 2:1 resonant switched-capacitor circuit which converts the 48V input voltage to 24V. The second stage of the converter is a 24:1 four-level series capacitor buck converter with a four-phase coupled inductor which can deliver 100A to microprocessors. The two-stage architecture leverages: 1) a resonant switched-capacitor mechanism, 2) a series-capacitor-buck configuration, and 3) a multiphase coupled inductor operation, to achieve high efficiency, high power density, and high control bandwidth.

Further disclosed herein are embodiments for a merged-two-stage hybrid switched-capacitor converter with coupled inductors for ultra-high-current microprocessors. By merging a switched-capacitor stage with a multiphase buck converter stage, the disclosed converter can realize the advantages of both reduced stress and soft charging. The merging of the two stages enables the coupled inductors used in the multiphase buck stage to reduce the steady-state current ripple and improve the transient performance.

It is understood that the above-described embodiments are only illustrative of the application of the principles of the present invention. The present invention may be embodied in other specific forms without departing from its spirit or essential characteristics. All changes that come within the meaning and range of equivalency of the claims are to be embraced within their scope. Thus, while the present invention has been fully described above with particularity and detail in connection with what is presently deemed to be the most practical and preferred embodiment of the invention, it will be apparent to those of ordinary skill in the art that numerous modifications may be made without departing from the principles and concepts of the invention as set forth in the claims.

What is claimed is:

1. A power converter circuit comprising:
   at least two vertically stacked printed circuit boards (PCBs) comprising a top PCB and a bottom PCB;
   at least one multiphase coupled inductor placed between the top PCB and the bottom PCB, the top PCB being coupled to the bottom PCB via at least one conductive winding of the multiphase coupled inductor;
   at least one circuit module placed above the top PCB; and
   at least one power source placed below the bottom PCB;
   the multiphase coupled inductor configured to deliver current vertically from the bottom PCB to the top PCB;
   wherein the multiphase coupled inductor comprises a magnetic core having a plurality of uniform magnetic paths with about equal reluctance and an additional magnetic path with a different reluctance.

2. The power converter circuit of claim 1, further comprising at least one switching device placed between the bottom PCB and the multiphase coupled inductor.

3. The power converter circuit of claim 1, further comprising at least one cooling channel placed between the top PCB and the bottom PCB.

4. The power converter circuit of claim 1, further comprising at least one output capacitor placed between the top PCB and the multiphase coupled inductor.

5. The power converter circuit of claim 1, wherein the power source comprises a plurality of capacitors, and/or wherein the circuit module comprises a plurality of semiconductor devices.

6. The power converter circuit of claim 1
   wherein the at least one conductive winding comprises a plurality of conductive windings, the number of conductive windings being equal to the number of uniform magnetic paths,
   wherein reluctances of the plurality of uniform magnetic paths are substantially smaller than a reluctance of the additional magnetic path,
   wherein the additional magnetic path is placed symmetrically between the plurality of uniform magnetic paths,
   wherein a reluctance of the additional magnetic path is programmed with a wire, and/or
   wherein at least one of the magnetic paths comprises at least one air gap.

7. The power converter circuit of claim 1,
   wherein the magnetic core is implemented as one of ferrites and powdered iron,
   wherein the magnetic core has a plurality of magnetic paths and a programmable magnetic path, the programmable magnetic path being implemented with a material different from the plurality of magnetic paths,
   wherein the magnetic core is a unitary piece,
   wherein the magnetic core comprises a center leg having a hole therethrough containing a wire, a current of the wire being adjustable, and/or
   wherein the magnetic core has one of a cubic and cylindrical shape.

8. The power converter circuit of claim 1, wherein the magnetic core comprises two identical magnetic pieces, each piece having a plurality of symmetric side legs.

9. The power converter circuit of claim 1, wherein the magnetic core comprises a first magnetic piece having a plurality of symmetric side legs and a second magnetic piece being a flat plate.

10. The power converter circuit of claim 1,
    wherein the conductive winding is implemented as copper-alloy, and/or
    wherein the conductive winding is one of a half-turn winding and single-turn winding, or
    wherein a topology of the power converter circuit is a multiphase buck converter with interleaved operation.

11. The power converter circuit of claim 1, further comprising an output supplying an output voltage lower than 1.5 V, an output supplying an output current higher than 100 A, and/or an input coupled to a 40 V-60 V voltage source.

12. The power converter device of claim 1, wherein the at least one multiphase coupled inductor includes a top plate and a bottom plate, the top plate being rotated circumferentially relative to the bottom plate.

13. The power converter circuit of claim 3, wherein the at least one cooling channel is implemented as one of immersion cooling and air cooling.

14. The power converter circuit of claim 8, wherein each piece further comprises a center leg.

15. The power converter circuit of claim 9, wherein the first magnetic piece further comprises a center leg.

16. A method for fabricating a power converter circuit, the method comprising:
   vertically stacking at least two printed circuit boards (PCBs), the PCBs comprising a top PCB and a bottom PCB;
   placing at least one multiphase coupled inductor between the top PCB and the bottom PCB, wherein the multiphase coupled inductor comprises a magnetic core having a plurality of uniform magnetic paths with about equal reluctance and an additional magnetic path with a different reluctance;
   coupling the top PCB to bottom PCB via at least one conductive winding of the multiphase coupled inductor;
   placing at least one circuit module above the top PCB;
   placing at least one power source below the bottom PCB; and
   configuring the multiphase coupled inductor to deliver current vertically from the bottom PCB to the top PCB.

17. The method of claim 16, further comprising
   placing at least one switching device between the bottom PCB and the multiphase coupled inductor;
   placing at least one cooling channel between the top PCB and the bottom PCB; and/or
   placing at least one output capacitor between the top PCB and the multiphase coupled inductor.

* * * * *